US012660393B2

(12) United States Patent
Park et al.

(10) Patent No.: US 12,660,393 B2
(45) Date of Patent: Jun. 16, 2026

(54) DISPLAY DEVICE

(71) Applicant: Samsung Display Co., LTD., Yongin-si (KR)

(72) Inventors: Do Yeong Park, Yongin-si (KR);
Kyung Bae Kim, Yongin-si (KR);
Chong Chul Chai, Yongin-si (KR);
Sung Chul Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 609 days.

(21) Appl. No.: 18/182,233

(22) Filed: Mar. 10, 2023

(65) Prior Publication Data

US 2023/0317908 A1 Oct. 5, 2023

(30) Foreign Application Priority Data

Mar. 29, 2022 (KR) ........................ 10-2022-0038709

(51) Int. Cl.
*H10H 20/857* (2025.01)
*H10H 20/831* (2025.01)
*H10H 29/14* (2025.01)

(52) U.S. Cl.
CPC ...... *H10H 20/857* (2025.01); *H10H 20/8312* (2025.01); *H10H 29/142* (2025.01)

(58) Field of Classification Search
None
See application file for complete search history.

(56) References Cited

U.S. PATENT DOCUMENTS

| | | | |
|---|---|---|---|
| 9,287,242 B2 | 3/2016 | Shibata et al. | |
| 2019/0326348 A1 | 10/2019 | Im et al. | |
| 2020/0075667 A1* | 3/2020 | Lee | H10H 20/83 |
| 2021/0134768 A1* | 5/2021 | Lee | H01L 25/0753 |
| 2021/0280753 A1* | 9/2021 | Kim | H10H 20/01 |
| 2021/0288033 A1* | 9/2021 | Lim | H10H 20/813 |
| 2021/0296537 A1* | 9/2021 | Lee | H10H 20/8312 |
| 2021/0351171 A1* | 11/2021 | Yoo | H10D 86/40 |
| 2022/0059628 A1 | 2/2022 | Park et al. | |

(Continued)

FOREIGN PATENT DOCUMENTS

| | | |
|---|---|---|
| JP | 2011-205060 A | 10/2011 |
| KR | 2017-0141305 A | 12/2017 |

(Continued)

*Primary Examiner* — Khaja Ahmad
(74) *Attorney, Agent, or Firm* — Womble Bond Dickinson (US) LLP

(57) ABSTRACT

A display device includes a substrate; a conductive layer on the substrate and including a first voltage line, a second voltage line, and a contact conductive pattern spaced from each other; a passivation layer on the conductive layer; a via layer on the passivation layer; an alignment line on the via layer and including a first alignment line and a second alignment line spaced from each other; a light emitting element between the first alignment line and the second alignment line on the alignment line; and a first contact electrode and a second contact electrode on the light emitting element and spaced from each other, wherein: the first alignment line is electrically connected to the second voltage line through a first alignment contact hole, the second alignment line is electrically connected to the first voltage line through a second alignment contact hole.

21 Claims, 34 Drawing Sheets

400: 410, 420
200: 210, 220
700: 710, 720
140: 144, CP, CPD, VL1_X, VL2_X

110: BML, VL1_Y
120: ACT1
130: 131

(56)          References Cited

U.S. PATENT DOCUMENTS

| 2022/0085077 | A1 | 3/2022 | Lee et al. |
| 2022/0085248 | A1 | 3/2022 | Kim et al. |

FOREIGN PATENT DOCUMENTS

| KR | 2018-0009014 | A | 1/2018 |
| KR | 2018-0011404 | A | 2/2018 |
| KR | 2019-0121894 | A | 10/2019 |
| KR | 2022-0025986 | A | 3/2022 |
| KR | 2022-0037017 | A | 3/2022 |
| WO | WO 2022/059994 | A1 | 3/2022 |

* cited by examiner

FIG. 2

SPX1    SPX2    SPX3

SA — PX
SA — SA
SA

NEM

EMA1    EMA2    EMA3

PX

DR2
DR1
DR3

SPX: SPX1, SPX2, SPX3
EMA: EMA1, EMA2, EMA3

VL1: VL1_X, VL1_Y
VL2: VL2_X, VL2_Y
SL: SL_X, SL_Y
SP: SP1, SP2, SP3

EMA: EMA1, EMA2, EMA3
SPX: SPX1, SPX2, SPX3

130: 131, BSL
131: 131_SP1, 131_SP2, 131_SP3
140: 141, 142, 143, 144, CP, CPD
CP: CP1, CP2, CP3
110: DL, VIL, BML, VL1_Y
BML: BML1, BML2, BML3

CPD: CPD1, CPD2, CPD3
CL: CL1, CL2, CL3

120: ACT1, ACT2, ACT3
ACT1: ACT1_SP1, ACT1_SP2, ACT1_SP3
ACT2: ACT2_SP1, ACT2_SP2, ACT2_SP3
ACT3: ACT3_SP1, ACT3_SP2, ACT3_SP3
141: 141_SP1, 141_SP2, 141_SP3
142: 142_SP1, 142_SP2, 142_SP3
143: 143_SP1, 143_SP2, 143_SP3

DR2

DR3 ⊙ → DR1

700: 710, 720
710: 711, 712, 713
720: 720A, 720B, 720C

200: 210, 220
140: CP, CPD, VL1_X, VL2_X, CL
CP: CP1, CP2, CP3
CPD: CPD1, CPD2, CPD3

140: VL1_X

110: VIL
140: CPD(CPD2)

DR2

DR1

DR3

200: 210, 220
700: 710, 720
710: 711, 712, 713
720: 720A, 720B, 720C
600_1: 610, 630

PX: PX1, PX2
SPX: SPX1, SPX2, SPX3
EMA: EMA1, EMA2, EMA3

DR3

140: PE1

DISPLAY DEVICE

CROSS-REFERENCE TO RELATED APPLICATION

This application claims priority to and the benefit of Korean Patent Application No. 10-2022-0038709 filed on Mar. 29, 2022, in the Korean Intellectual Property Office, the entire content of which is incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and includes a display panel, such as an organic light emitting display panel or a liquid crystal display panel. The display panel may include a light emitting element, and the light emitting element may be a light emitting diode (LED). The light emitting diode may be an organic light emitting diode (OLED) that uses an organic material as a light emitting material, or an inorganic light emitting diode that uses an inorganic material as a light emitting material.

SUMMARY

Aspects and features of embodiments of the present disclosure provide a display device in which reliability is improved by separating a contact electrode and an alignment line and electrically connecting the contact electrode and a conductive layer of a circuit element layer by allowing contact (e.g., direct contact) therebetween.

Aspects and features of embodiments of the present disclosure also provide a display device in which a manufacturing process efficiency is improved by omitting a separation process of separating a contact electrode and an alignment line and separating alignment lines disposed across a plurality of pixels from each other.

However, aspects and features of embodiments of the present disclosure are not restricted to those set forth herein. The above and other aspects of the present disclosure will become more apparent to one of ordinary skill in the art to which the present disclosure pertains by referencing the detailed description of the present disclosure given below.

One or more embodiments of a display device includes a substrate; a conductive layer on the substrate and including a first voltage line, a second voltage line, and a contact conductive pattern spaced from each other; a passivation layer on the conductive layer; a via layer on the passivation layer; an alignment line on the via layer and including a first alignment line and a second alignment line spaced from each other; a light emitting element between the first alignment line and the second alignment line on the alignment line; and a first contact electrode and a second contact electrode on the light emitting element and spaced from each other, wherein: the first alignment line is electrically connected to the second voltage line through a first alignment contact hole, the second alignment line is electrically connected to the first voltage line through a second alignment contact hole, the first contact electrode is electrically connected to the second voltage line through a first electrode contact hole, the second contact electrode is electrically connected to the contact conductive pattern through a second electrode contact hole, and the first electrode contact hole and the second electrode contact hole do not overlap the alignment line in a plan view.

One or more embodiments of a display device includes a first pixel and a second pixel arranged along a first direction. The display device includes a circuit element layer on a substrate and including transistors to drive the first pixel and the second pixel, respectively; a first alignment line and a second alignment line extending in the first direction on the circuit element layer, across the first pixel and the second pixel, and spaced from each other in a second direction crossing the first direction; a light emitting element in each of the first pixel and the second pixel and located between the first alignment line and the second alignment line; a first contact electrode in each of the first pixel and the second pixel, overlapping one end of the light emitting element, and extending in the first direction; and a second contact electrode in each of the first pixel and the second pixel, overlapping other end of the light emitting element, and extending in the first direction, wherein: the first contact electrode and the second contact electrode are spaced from each other in the second direction, the first contact electrode is electrically connected to the circuit element layer through a first electrode contact hole, the second contact electrode is electrically connected to the circuit element layer through a second electrode contact hole, and the first electrode contact hole and the second electrode contact hole do not overlap the first alignment line and the second alignment line in a plan view.

In accordance with the display device according to one or more embodiments, the reliability of the display device may be improved by separating the contact electrode and the alignment line and electrically connecting the contact electrode and the conductive layer of the circuit element layer by allowing contact therebetween.

Further, the manufacturing process efficiency of the display device may be improved by omitting the separation process of separating the contact electrode and the alignment line of the display device and separating the alignment lines across the plurality of pixels from each other. Further, the area where the separation process is performed is omitted, so that the emission area may be increased compared to the same planar area, and a margin of an ink process in an inkjet printing process of a light emitting element may be secured.

However, the effects, aspects, and features of embodiments of the present disclosure are not limited to the aforementioned effects, aspects, and features, and various other effects, aspects, and features are included in the present disclosure.

BRIEF DESCRIPTION OF THE DRAWINGS

The above and other aspects and features of embodiments of the present disclosure will become more apparent by describing in detail embodiments thereof with reference to the attached drawings, in which:

FIG. 2 is a schematic layout diagram showing wires included in a display device according to one or more embodiments;

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Although the terms "first", "second", etc. may be used herein to describe various elements, these elements should not be limited by these terms. These terms may be used to distinguish one element from another element. Thus, a first element discussed below may be termed a second element without departing from teachings of one or more embodiments. The description of an element as a "first" element may not require or imply the presence of a second element or other elements.

Hereinafter, embodiments will be described with reference to the accompanying drawings.

Figure 1:
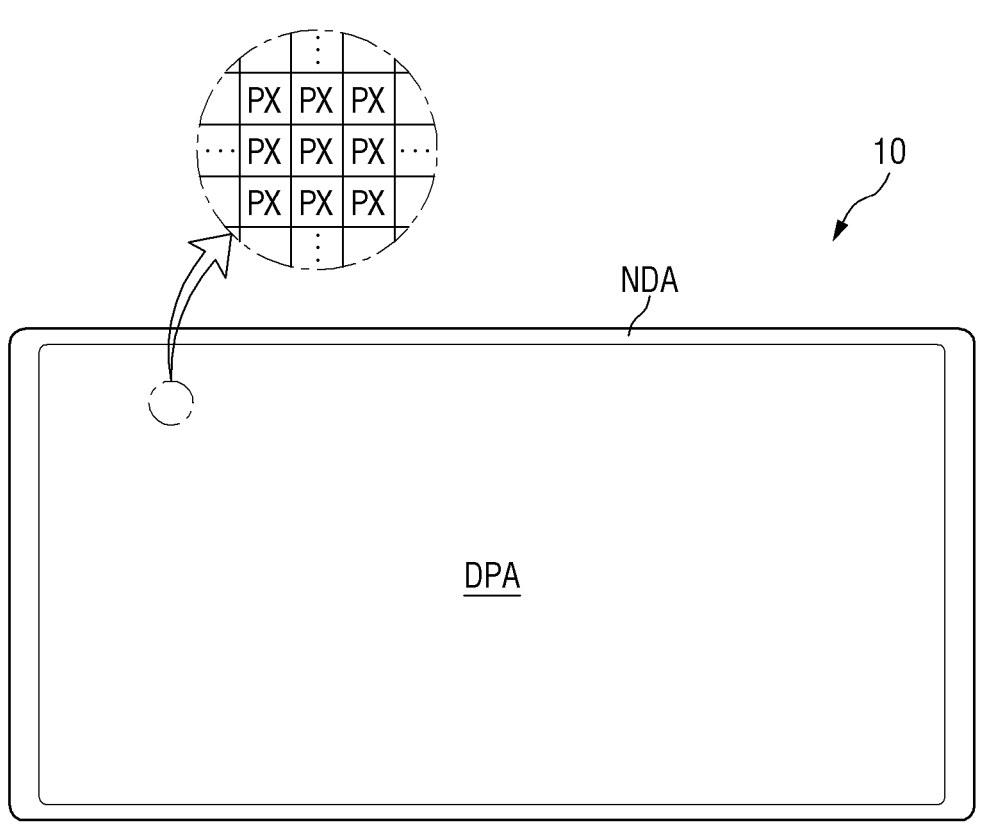
FIG. 1 is a schematic plan view of a display device according to one or more embodiments.
Figure 1:
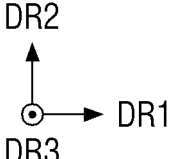

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be exemplified, but the present disclosure is not limited thereto, and other display panels may be applied within the same scope of technical spirit.

Hereinafter, a first direction DR1, a second direction DR2, and a third direction DR3 are defined in drawings of an embodiment describing the display device 10. The first direction DR1 and the second direction DR2 may be directions perpendicular to each other in one plane. The third direction DR3 may be a direction perpendicular to a plane on which the first direction DR1 and the second direction DR2 are located. The third direction DR3 is perpendicular to each of the first direction DR1 and the second direction DR2. In the embodiment describing the display device 10, the third direction DR3 indicates a thickness direction (or display direction) of the display device 10.

The display device 10 may have a rectangular shape including long and short sides such that the side in the first direction DR1 is longer than the side in the second direction DR2 in a plan view. A corner portion where the long side and the short side of the display device 10 meet may be right-angled in a plan view. However, the present disclosure is not limited thereto, and it may be rounded to have a curved shape. The shape of the display device 10 is not limited to the illustrated one and may be variously modified. For example, the display device 10 may have other shapes such as a square shape, a quadrilateral shape with rounded corners (vertices), other polygonal shapes and a circular shape in a plan view.

A display surface of the display device 10 may be disposed on one side of the third direction DR3 that is the thickness direction. In embodiments describing the display device 10, unless otherwise noted, the term "upward" refers to one side of the third direction DR3, which is the display direction, and the term "top surface" refers to a surface toward the one side of the third direction DR3. Further, the term "downward" refers to the other side of the third direction DR3, which is an opposite direction to the display direction, and the term "bottom surface" refers to a surface toward the other side of the third direction DR3. Furthermore, "left", "right", "upper" and "lower" indicate directions when the display device 10 is viewed from above. For example, "right side" indicates one side of the first direction DR1, "left side" indicates the other side of the first direction DR1, "upper side" indicates one side of the second direction DR2, and "lower side" indicates the other side of the second direction DR2.

The display device 10 may include the display area DPA and a non-display area NDA around an edge or periphery of the display area DPA. The display area DPA is an area where an image can be displayed, and the non-display area NDA is an area where no image is displayed.

The shape of the display area DPA may follow the shape of the display device 10. For example, the shape of the display area DPA may have a rectangular shape similar to the overall shape of the display device 10 in a plan view. The display area DPA may substantially occupy the center (or the central region) of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be a rectangular or square shape in a plan view. In one or more embodiments, each pixel PX may include a plurality of light emitting elements made of inorganic particles.

The non-display area NDA may be disposed around the display area DPA. The non-display area NDA may completely or partially surround the display area DPA. The non-display area NDA may form a bezel of the display device 10.

Figure 2:
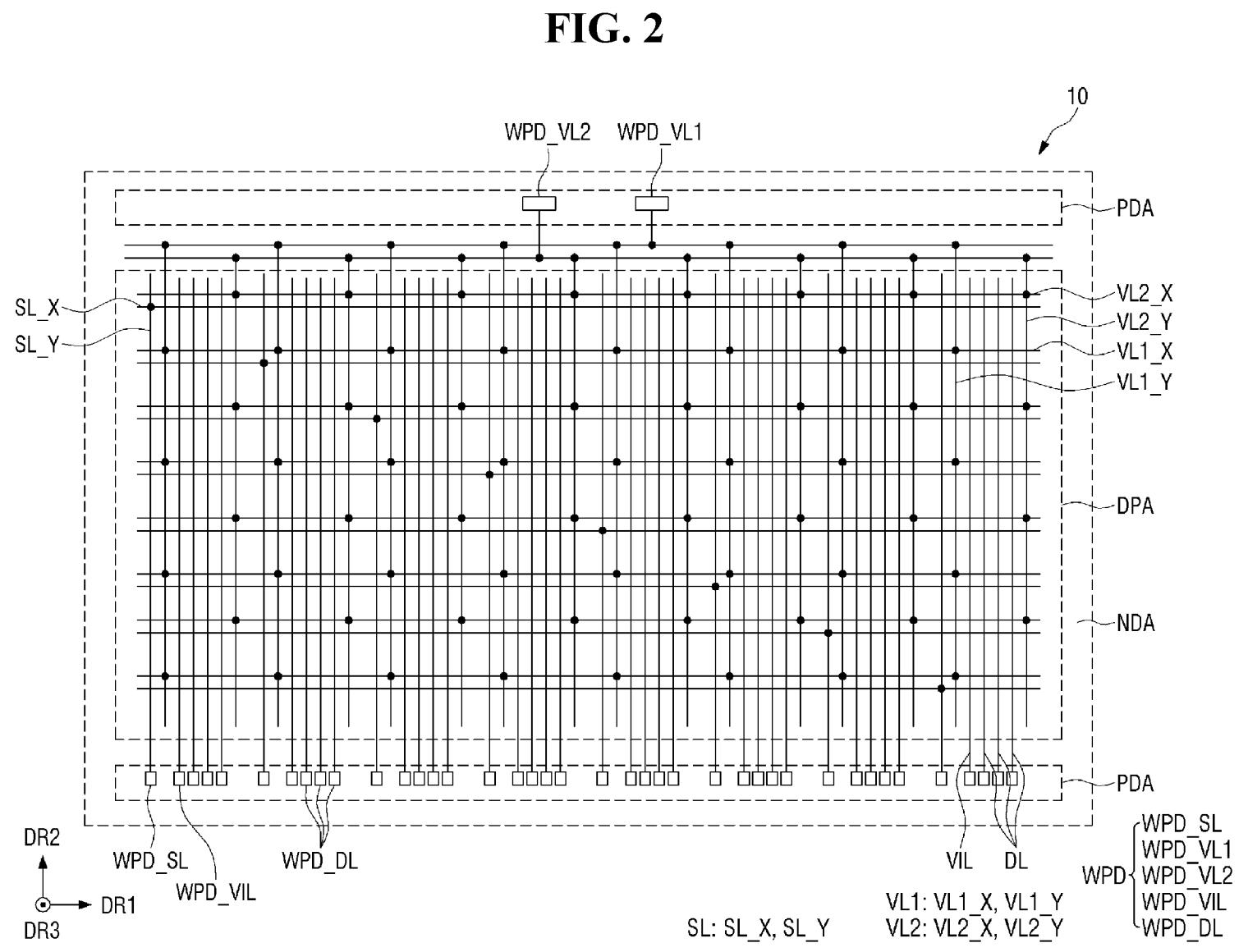

FIG. 2 is a schematic layout diagram showing wires included in a display device according to one or more embodiments.

Referring to FIG. 2, the display device 10 may include a plurality of wires. The plurality of wires may include a scan line SL, a data line DL, an initialization voltage line VIL, a first voltage line VL1, and a second voltage line VL2. In one or more embodiments, other wires may be further provided in the display device 10. The plurality of wires included in the display device 10 may be formed of a first conductive layer 110 (see FIG. 7) or a third conductive layer 140 (see FIG. 7) of a circuit element layer CCL (see FIG. 6) to be described later.

In one or more embodiments, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The scan line SL may extend in the first direction DR1. The scan line SL may further include a portion extending in the second direction DR2. In one or more embodiments, the scan line SL may include a horizontal scan line SL_X extending in the first direction DR1 and a vertical scan line SL_Y extending in the second direction DR2.

The horizontal scan line SL_X may extend in the first direction DR1 to be disposed across the pixels PX disposed in the same row. There may be a plurality of horizontal scan lines SL_X, and the plurality of horizontal scan lines SL_X may be spaced from each other in the second direction DR2. In one or more embodiments, the horizontal scan line SL_X may be disposed for each pixel PX row.

The vertical scan line SL_Y may extend in the second direction DR2 to be disposed across the pixels PX disposed in the same column. There may be a plurality of vertical scan lines SL_Y, and the plurality of vertical scan lines SL_Y may be spaced from each other in the first direction DR1. In one or more embodiments, the vertical scan line SL_Y may be disposed for each pixel PX column.

The vertical scan line SL_Y and the horizontal scan line SL_X may cross each other in the display area DPA. The horizontal scan line SL_X and the vertical scan line SL_Y may be formed of conductive layers disposed on different layers. One of the plurality of vertical scan lines SL_Y may be electrically connected to one of the plurality of horizontal scan lines SL_X in the crossing region. The vertical scan lines SL_Y disposed in different pixel PX columns may be electrically connected to the horizontal scan lines SL_X disposed in different pixel PX rows.

One end of the vertical scan line SL_Y may be electrically connected to a scan pad WPD_SL connected to a scan driver. The vertical scan line SL_Y may be disposed to extend from a pad area PDA disposed in the non-display area NDA to the display area DPA.

The data line DL may extend in the second direction DR2. The data line DL may be disposed across the pixels PX disposed in the same column. The data line DL may be disposed to be spaced from the vertical scan line SL_Y in the first direction DR1. There may be a plurality of data lines DL, and the plurality of data lines DL may be spaced from each other in the first direction DR1. In one or more embodiments, the data line DL may be disposed for each pixel PX column.

Three data lines DL may form a group for each pixel PX column and may be disposed adjacent to each other. Each of the data lines DL may be disposed to extend from the pad area PDA disposed in the non-display area NDA to the display area DPA.

The initialization voltage line VIL may extend in the second direction DR2. The initialization voltage line VIL may be disposed across the pixels PX disposed in the same column. The initialization voltage line VIL may be disposed to be spaced from the data line DL and the vertical scan line SL_Y in the first direction DR1. There may be a plurality of initialization voltage lines VIL, and the plurality of initialization voltage lines VIL may be spaced from each other in the first direction DR1. In one or more embodiments, the initialization voltage line VIL may be disposed for each pixel PX column. The initialization voltage line VIL may be disposed to extend from the pad area PDA disposed in the non-display area NDA to the display area DPA.

The first voltage line VL1 may extend in the second direction DR2. The first voltage line VL1 may further include a portion extending in the first direction DR1. In one or more embodiments, the first voltage line VL1 may include a first horizontal voltage line VL1_X extending in the first direction DR1 and a first vertical voltage line VL1_Y extending in the second direction DR2.

The first horizontal voltage line VL1_X may extend in first direction DR1 to be disposed across the pixels PX disposed in the same row. There may be a plurality of first horizontal voltage lines VL1_X, and the plurality of first horizontal voltage lines VL1_X may be spaced from each other in the second direction DR2. In one or more embodiments, the first horizontal voltage line VL1_X may be disposed in even pixel PX rows, and may not be disposed in odd pixel PX rows. However, the present disclosure is not limited thereto, and the first horizontal voltage line VL1_X may be disposed in odd pixel PX rows without being disposed in even pixel PX rows, or may be disposed for each pixel PX row.

The first vertical voltage line VL1_Y may extend in the second direction DR2 to be disposed across the pixels PX disposed in the same column. There may be a plurality of first vertical voltage lines VL1_Y, and the plurality of first vertical voltage lines VL1_Y may be spaced from each other in the first direction DR1. In one or more embodiments, the first vertical voltage line VL1_Y may be disposed for each pixel PX column.

The first horizontal voltage line VL1_X and the first vertical voltage line VL1_Y may cross each other. The first voltage line VL1 may have a mesh structure, but the present disclosure is not limited thereto. The first horizontal voltage line VL1_X and the first vertical voltage line VL1_Y may be formed of conductive layers disposed on different layers. The first horizontal voltage line VL1_X and the first vertical voltage line VL1_Y may be electrically connected in the crossing region.

The second voltage line VL2 may extend in the second direction DR2. The second voltage line VL2 may further include a portion extending in the first direction DR1. In one or more embodiments, the second voltage line VL2 may include a second horizontal voltage line VL2_X extending in the first direction DR1 and a second vertical voltage line VL2_Y extending in the second direction DR2.

The second horizontal voltage line VL2_X may extend in the first direction DR1 to disposed across the pixels PX disposed in the same row. There may be a plurality of second horizontal voltage lines VL2_X, and the plurality of second horizontal voltage lines VL2_X may be spaced from each other in the second direction DR2. In one or more embodiments, the second horizontal voltage line VL2_X may be disposed in odd pixel PX rows, and may not be disposed in even pixel PX rows. However, the present disclosure is not limited thereto, and the second horizontal voltage line VL2_X may be disposed in even pixel PX rows without being disposed in odd pixel PX rows, or may be disposed for each pixel PX row.

In one or more embodiments, the first horizontal voltage line VL1_X and the second horizontal voltage line VL2_X may be alternately arranged. For example, the second horizontal voltage line VL2_X may be disposed in odd pixel PX rows and the first horizontal voltage line VL1_X may be disposed in even pixel PX rows, so that the first horizontal voltage line VL1_X and the second horizontal voltage line VL2_X may extend in the first direction DR1 and may be alternately arranged along the second direction DR2.

The second vertical voltage line VL2_Y may extend in the second direction DR2 to be disposed across the pixels PX disposed in the same column. There may be a plurality of second vertical voltage lines VL2_Y, and the plurality of second vertical voltage lines VL2_Y may be spaced from each other in the first direction DR1. In one or more embodiments, the second vertical voltage line VL2_Y may be disposed for each pixel PX column.

The second horizontal voltage line VL2_X and the second vertical voltage line VL2_Y may cross each other. The second voltage line VL2 may have a mesh structure, but the present disclosure is not limited thereto. The second horizontal voltage line VL2_X and the second vertical voltage line VL2_Y may be formed of conductive layers disposed on different layers. The second horizontal voltage line VL2_X and the second vertical voltage line VL2_Y may be electrically connected in the crossing region.

Each pixel PX of the display device 10 may be electrically connected to at least one data line DL, the initialization voltage line VIL, the first voltage line VL1, and the second voltage line VL2.

The data line DL, the initialization voltage line VIL, the first voltage line VL1, and the second voltage line VL2 may be electrically connected to at least one wire pad WPD. The wire pads WPD may be disposed in pad areas PDA included in the non-display area NDA. The pad area PDA may be disposed in the non-display area NDA disposed adjacent to a first long side (lower side in FIG. 2) and a second long side (upper side in FIG. 2) of the display device 10. However, the position of the pad area PDA is not limited thereto and may be variously modified.

In one or more embodiments, a wire pad WPD_DL (hereinafter, referred to as 'data pad') of the data line DL, a wire pad WPD_VIL (hereinafter, referred to as 'initialization voltage pad') of the initialization voltage line VIL, a wire pad WPD_SL (hereinafter, referred to as 'scan pad') of the scan line SL may be disposed in the pad area PDA located on the lower side, and a wire pad WPD_VL1 (hereinafter, referred to as 'first voltage pad') of the first voltage line VL1 and a wire pad WPD_VL2 (hereinafter, referred to as 'second voltage pad') of the second voltage line VL2 may be disposed in the pad area PDA located on the upper side. In another example, the data pad WPD_DL, the initialization voltage pad WPD_VIL, the scan pad WPD_SL, the first voltage pad WPD_VL1, and the second voltage pad WPD_VL2 may be disposed in the same area, e.g., the pad area PDA located on the lower side. The external devices may be mounted on the line pads WPD. The external devices may be mounted on the line pads WPD by applying an anisotropic conductive film, ultrasonic bonding or the like. Further, during a process of inspecting whether or not the display device has poor contact, a current measuring device of an inspection apparatus may be electrically connected to the wire pad WPD of the display device 10 to measure a current or apply a voltage.

Each pixel PX of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified.

Figure 3:
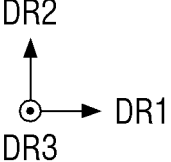
FIG. 3 is a schematic layout view showing a pixel arrangement of a display device according to one or more embodiments.

FIG. 3 is a schematic layout view showing a pixel arrangement of a display device according to one or more embodiments.

Referring to FIGS. 1 and 3, the display area DPA of the display device 10 may include a plurality of pixels PX. The pixel PX represents the smallest unit of repetition for display. In order to achieve full-color display, each pixel PX may include a plurality of sub-pixels SPX emitting different colors. For example, each pixel PX may include a first sub-pixel SPX1 responsible for light emission of a first color, a second sub-pixel SPX2 responsible for light emission of a second color, and a third sub-pixel SPX3 responsible for light emission of a third color. For example, the first color may be red, the second color may be green, and the third color may be blue. On the other hand, although the drawing illustrates that one pixel PX includes three sub-pixels SPX, the present disclosure is not limited thereto. For example, one pixel PX may include a larger number of sub-pixels SPX.

Each sub-pixel SPX may include an emission area EMA and a non-emission area NEM. The emission area EMA may be defined as an area in which light emitted from a light emitting element ED (see FIG. 6) is emitted, and the non-emission area NEM may be defined as an area in which light is not emitted because the light emitted from the light emitting element ED does not reach.

The emission area EMA of the first sub-pixel SPX1 (hereinafter, referred to as 'first emission area EMA1'), the emission area EMA of the second sub-pixel SPX2 (hereinafter, referred to as 'second emission area EMA2'), and the emission area EMA of the third sub-pixel SPX3 (hereinafter, referred to as 'third emission area EMA3') may be sequentially and repeatedly disposed along the first direction DR1 in the display area DPA.

The non-emission area NEM may be positioned around the emission area EMA. Specifically, the non-emission area NEM may be disposed to surround the first emission area EMA1, the second emission area EMA2, and the third emission area EMA3.

The non-emission area NEM of one sub-pixel SPX is in contact with the non-emission area NEM of the neighboring sub-pixel SPX (regardless of whether or not it is the sub-pixel SPX in the same pixel PX). The non-emission areas NEM of the adjacent sub-pixels SPX may be integrally connected. Further, the non-emission areas NEM of all the sub-pixels SPX may be integrally connected, but the present disclosure is not limited thereto. The emission areas EMA of the adjacent sub-pixels SPX may be distinguished by the non-emission area NEM.

Each sub-pixel SPX may further include a sub-region SA positioned in the non-emission area NEM. The sub-region SA may include a region where a contact electrode 700 (see FIG. 6) of a light emitting element layer EML (see FIG. 6) and the conductive layer of the circuit element layer CCL are in contact with each other, as will be described later.

The sub-region SA may be disposed on the upper side (or one side of the second direction DR2) and/or on the lower side (or the other side of the second direction DR2) of the emission area EMA of each sub-pixel SPX. Accordingly, the sub-region SA may be disposed between the emission areas EMA of adjacent sub-pixels SPX disposed in the same column.

Conceptually, the adjacent sub-pixels SPX may be interpreted as being in contact. Even in this case, the boundary between the sub-pixels SPX may be located on the non-emission areas NEM that is integrally connected, and thus may not be physically distinguished.

The pixels PX including the plurality of sub-pixels SPX may be alternately arranged in a matrix. The shape and arrangement of the sub-pixels SPX may be the same for each pixel PX, but are not limited thereto. The overall shape of each pixel PX including the plurality of sub-pixels SPX may be a substantially square shape. However, the present disclosure is not limited thereto, and the shape of each pixel PX may be variously modified, such as a rhombus or a rectangle.

Figure 4:
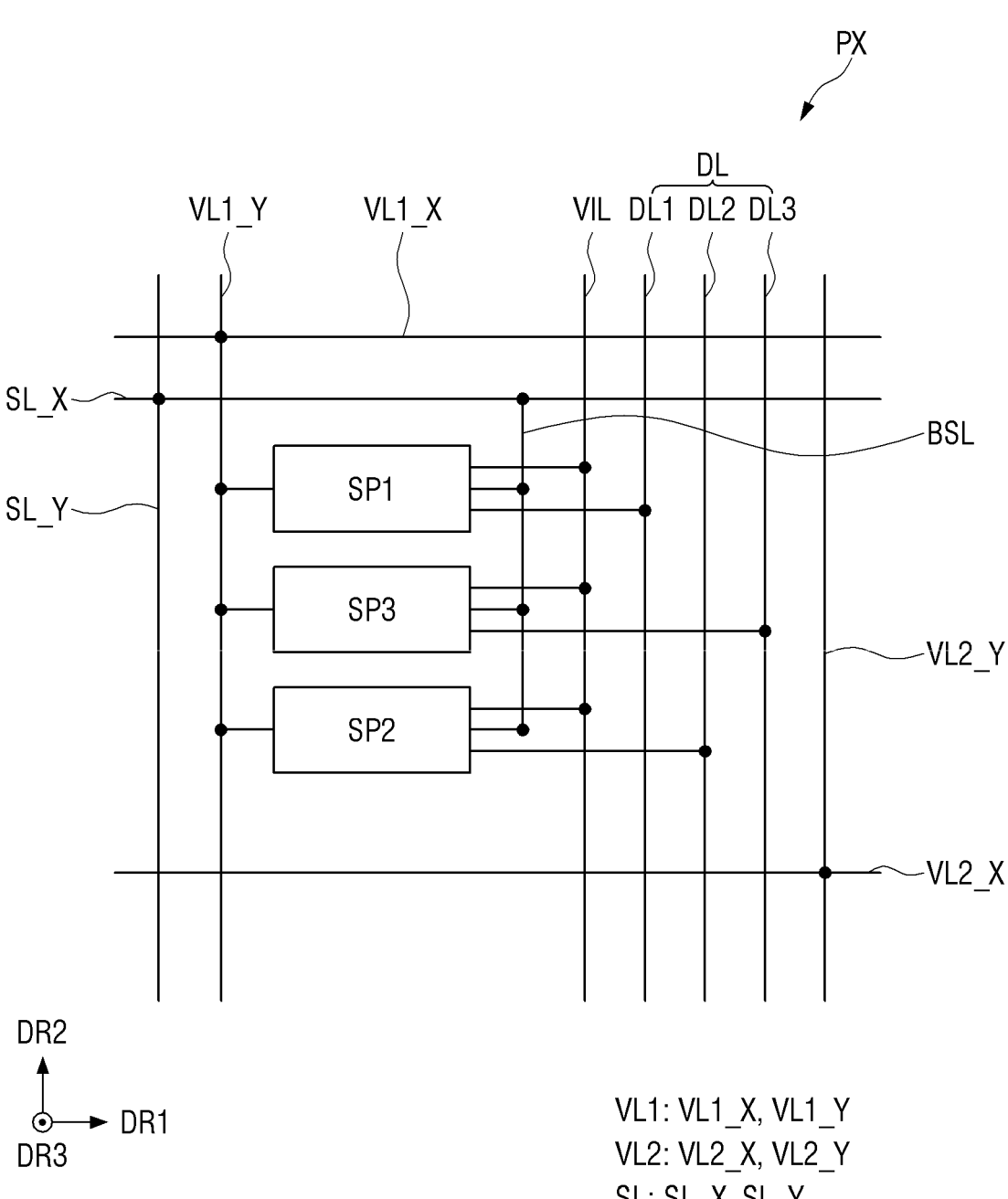
FIG. 4 is a block diagram schematically illustrating pixels of a display device according to one or more embodiments.

FIG. 4 is a block diagram schematically illustrating pixels of a display device according to one embodiment.

Referring to FIG. 4, one pixel PX of the display device 10 may include a plurality of wires and a pixel circuit SP.

The plurality of wires may include the wires described with reference to FIG. 2. Specifically, the plurality of wires may include the scan line SL, the data line DL, the initialization voltage line VIL, the first voltage line VL1, and the second voltage line VL2.

The pixel circuit SP may include a sub-pixel circuit for driving each sub-pixel SPX. Specifically, the pixel circuit SP may include a sub-pixel circuit SP1 (hereinafter, referred to as 'first sub-pixel circuit') for driving the first sub-pixel SPX1, a sub-pixel circuit SP2 (hereinafter, referred to as 'second sub-pixel circuit') for driving the second sub-pixel SPX2, and a sub-pixel circuit SP3 (hereinafter, referred to as 'third sub-pixel circuit') for driving the third sub-pixel SPX3. The second sub-pixel circuit SP2 may be disposed on the lower side of the first sub-pixel circuit SP1, and the third sub-pixel circuit SP3 may be disposed between the first sub-pixel circuit SP1 and the second sub-pixel circuit SP2. However, the present disclosure is not limited thereto.

Each of the first sub-pixel circuit SP1, the second sub-pixel circuit SP2, and the third sub-pixel circuit SP3 may be electrically connected to the scan line SL, the data line DL, the initialization voltage line VIL, and the first voltage line VL1.

The scan line SL may be electrically connected to each of the first to third sub-pixel circuits SP1, SP2, and SP3. The scan line SL (specifically, the horizontal scan line SL_X) may be electrically connected to an auxiliary scan line BSL extending in the second direction DR2. The scan line SL may be electrically connected to each of the first to third sub-pixel circuits SP1, SP2, and SP3 through the auxiliary scan line BSL.

The initialization voltage line VIL may extend in the second direction DR2, and may be electrically connected to each of the first to third sub-pixel circuits SP1, SP2, and SP3.

The first voltage line VL1 may be electrically connected to each of the first to third sub-pixel circuits SP1, SP2, and SP3. Specifically, the first vertical voltage line VL1_Y may be electrically connected to each of the first to third sub-pixel circuits SP1, SP2, and SP3. A high potential voltage (or a first power voltage) may be applied to the first voltage line VL1, and the first voltage line VL1 may supply the high potential voltage (or the first power voltage) to the pixel circuit SP.

The data line DL may include a plurality of data lines connected to the sub-pixel circuits. In one or more embodiments in which each pixel PX includes the first to third sub-pixels SPX1, SPX2, and SPX3, and the pixel circuit SP includes the first to third sub-pixel circuits SP1, SP2, and SP3, the data line DL may include a first data line DL1, a second data line DL2, and a third data line DL3.

The first data line DL1 may extend in the second direction DR2. The first data line DL1 may be electrically connected to the first sub-pixel circuit SP1. The second data line DL2 may extend in the second direction DR2, and may be spaced from the first data line DL1 in the first direction DR1. The second data line DL2 may be electrically connected to the second sub-pixel circuit SP2. The third data line DL3 may extend in the second direction DR2, and may be spaced from the first and second data lines DL1 and DL2 in the first direction DR1. The third data line DL3 may be electrically connected to the third sub-pixel circuit SP3. The first to third data lines DL1, DL2, and DL3 may be sequentially arranged along the first direction DR1.

The second voltage line VL2 may be electrically connected to each pixel PX. Specifically, the second voltage line VL2 may be electrically connected to a part of an alignment line 200 and a part of the contact electrode 700 of the light emitting element layer EML (see FIG. 6) to be described later. A low potential voltage (or a second power voltage) lower than the high potential voltage supplied to the first voltage line VL1 may be applied to the second voltage line VL2. The second voltage line VL2 may be used as an alignment signal line for applying an alignment signal to the alignment line 200 in an alignment process of the light emitting element ED during the manufacturing process of the display device 10, and may be a driving line (or a power line) for supplying the low potential voltage (or the second power voltage) to the contact electrode 700 in contact with the end of each light emitting element ED when the display device 10 is driven.

Figure 5:
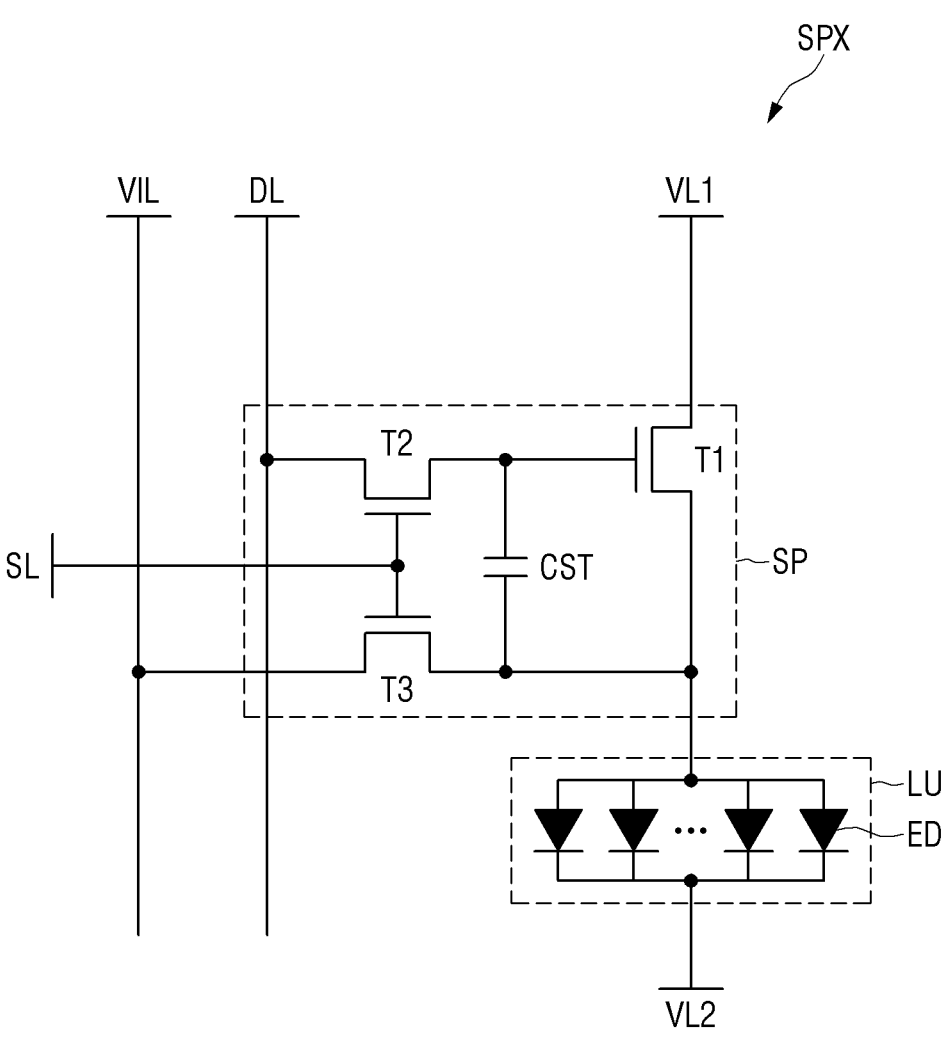
FIG. 5 is an equivalent circuit diagram of a sub-pixel of a display device according to one or more embodiments.

FIG. 5 is an equivalent circuit diagram of a sub-pixel of a display device according to one or more embodiments.

Referring to FIGS. 4 and 5, each sub-pixel SPX of the display device 10 may include the sub-pixel circuit SP and a light emitting unit LU.

The sub-pixel circuit SP may include a transistor and a capacitor. The number of transistors and capacitors of each sub-pixel circuit SP may be variously modified. Each sub-pixel SPX of the display device 10 according to one or more embodiments may include the sub-pixel circuit SP having a 3T1C structure including three transistors and one capacitor. Hereinafter, the case in which the sub-pixel circuit SP of each sub-pixel SPX included in the display device 10 has the 3T1C structure will be described as an example. However, the present disclosure is not limited thereto, and various other modified pixel structures such as a 2T1C structure, a 7T1C structure, a 6T1C structure, and the like may be applied to the sub-pixel circuit SP.

The sub-pixel circuit SP according to one or more embodiments may include a plurality of transistors and a capacitor CST. The plurality of transistors may include a first transistor T1, a second transistor T2, and a third transistor T3.

The light emitting unit LU may include one or more light emitting elements ED connected in parallel between the sub-pixel circuit SP and the second voltage line VL2. Although FIG. 5 illustrates an embodiment in which the light emitting elements ED are connected in parallel in the same direction (e.g., forward direction) between the sub-pixel circuit SP and the second voltage line VL2, the present disclosure is not limited thereto. For example, some of the light emitting elements ED may be connected in the forward direction between the sub-pixel circuit SP and the second voltage line VL2 to constitute an effective light source, and some others of the light emitting elements ED may be connected in a reverse direction between the sub-pixel circuit SP and the second voltage lines VL2.

The light emitting element ED may emit light of a specific wavelength band in response to an electrical signal transmitted from the sub-pixel circuit SP and the second voltage line VL2. Specifically, the light emitting element ED may emit light by a driving current supplied through the first transistor T1 of the sub-pixel circuit SP. The light emission amount or the luminance of the light emitting element ED may be proportional to the magnitude of the driving current. The light emitting element ED may be an inorganic light emitting element including an inorganic semiconductor.

The first transistor T1 may be connected between the first voltage line VL1 and the light emitting unit LU. The first transistor T1 adjusts a current flowing from the first voltage line VL1 to which the first power voltage is supplied to the light emitting unit LU depending on a voltage difference between the gate electrode and the source electrode of the first transistor T1. For example, the first transistor T1 may be a driving transistor for driving the light emitting element ED of the light emitting unit LU. The gate electrode of the first transistor T1 may be connected to the second source/drain electrode of the second transistor T2, the source electrode of the first transistor T1 may be connected to the first electrode of the light emitting unit LU, and the drain electrode of the first transistor T1 may be connected to the first voltage line VL1 to which the first power voltage is applied.

The second transistor T2 is turned on by a scan signal of the scan line SL to connect the data line DL to the gate electrode of the first transistor T1. The gate electrode of the second transistor T2 may be connected to the scan line SL, the second source/drain electrode of the second transistor T2 may be connected to the gate electrode of the first transistor T1, and the first source/drain electrode of the second transistor T2 may be connected to the data line DL.

The third transistor T3 is turned on by the scan signal of the scan line SL to connect the initialization voltage line VIL to the source electrode of the first transistor T1. The gate electrode of the third transistor T3 may be connected to the scan line SL, the first source/drain electrode of the third transistor T3 may be connected to the initialization voltage line VIL, and the second source/drain electrode of the third transistor T3 may be connected to the source electrode of the first transistor T1.

In one or more embodiments, the first source/drain electrode and the second source/drain electrode of each of the second and third transistors T2 and T3 may be the drain electrode and the source electrode, respectively. However, the present disclosure is not limited thereto, and the first source/drain electrode and the second source/drain electrode thereof may be the source electrode and the drain electrode, respectively.

The capacitor CST is connected between the gate electrode of the first transistor T1 and the source electrode of the first transistor T1. The capacitor CST stores the difference voltage between the gate voltage and the power voltage of the first transistor T1.

Each of the first to third transistors T1, T2, and T3 may be formed as a thin film transistor. Although FIG. 5 mainly describes the case where the first to third transistors T1, T2, and T3 are formed as an N-type metal oxide semiconductor field effect transistor (MOSFET), the present disclosure is not limited thereto. That is, the first to third transistors T1, T2, and T3 may be formed as a P-type MOSFET, or a part of the first to third transistors T1, T2, and T3 may be formed as the N-type MOSFET, and another part of the first to third transistors T1, T2, and T3 may be formed as the P-type MOSFET.

Figure 6:
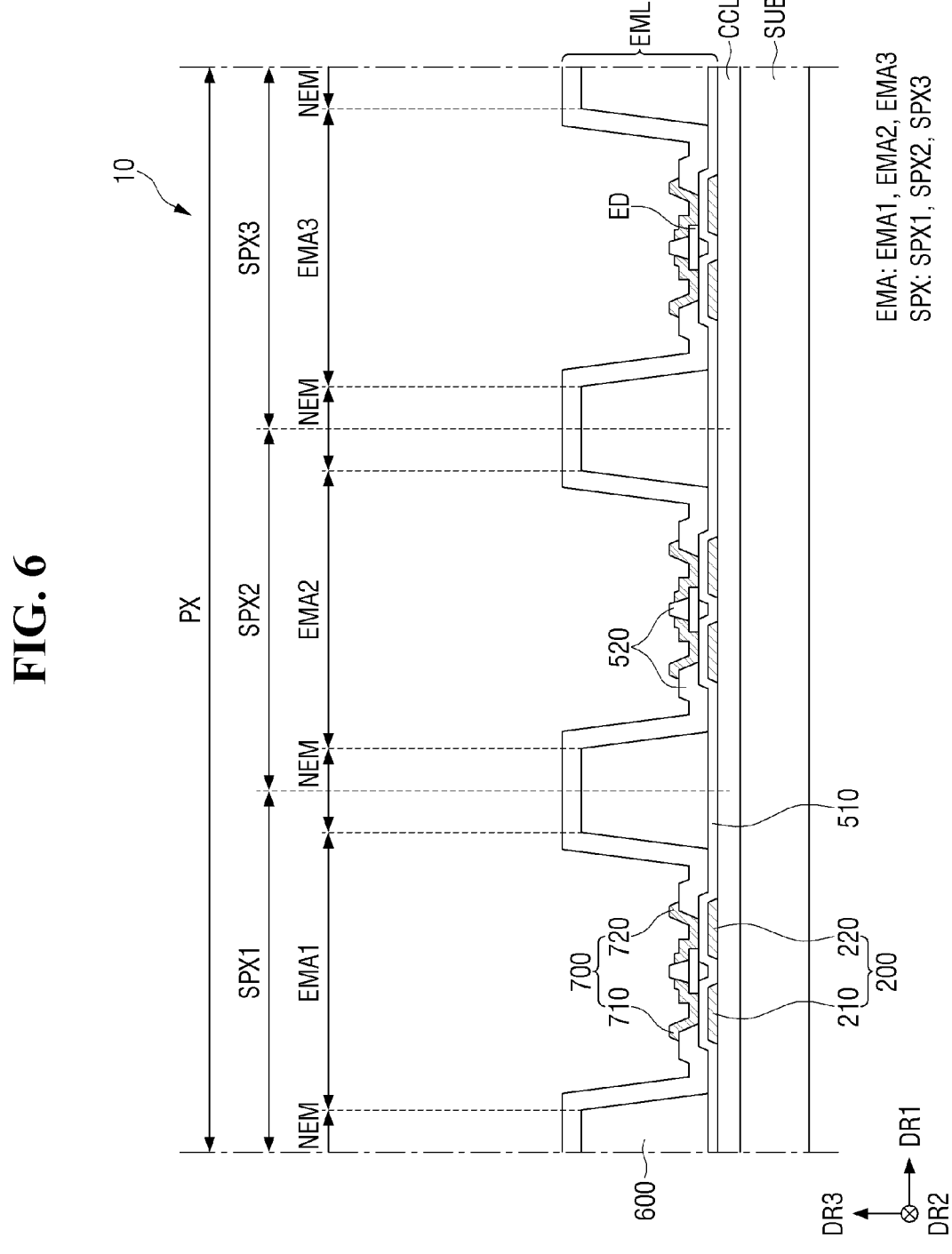
FIG. 6 is a schematic cross-sectional view of a display device according to one or more embodiments.

FIG. 6 is a schematic cross-sectional view of a display device according to one or more embodiments.

Referring to FIG. 6, the display device 10 according to one or more embodiments may include a substrate SUB, the circuit element layer CCL, and the light emitting element layer EML.

The substrate SUB may be a base member. The substrate SUB may be made of an insulating material such as glass, quartz, or polymer resin. Further, the substrate SUB may be a rigid substrate, but may also be a flexible substrate that can be bent, folded or rolled.

The circuit element layer CCL may be disposed on the substrate SUB. The circuit element layer CCL may include at least one transistor and the like to drive the light emitting element layer EML. The circuit element layer CCL may include the above-described plurality of lines, and the plurality of transistors T1, T2, and T3 and the capacitor CST included in the sub-pixel circuit SP. The circuit element layer CCL will be described in detail later.

The light emitting element layer EML may be disposed on the circuit element layer CCL. The light emitting element layer EML according to one or more embodiments may include the alignment line 200, a first insulating layer 510, a first bank 600, the light emitting element ED, a second insulating layer 520, and the contact electrode 700.

The alignment line 200 may be disposed on the circuit element layer CCL. The alignment line 200 may include a first alignment line 210 and a second alignment line 220. The first alignment line 210 and the second alignment line 220 may be spaced from each other on one surface of the circuit element layer CCL.

The first insulating layer 510 may be disposed on one surface of the circuit element layer CCL where the alignment line 200 is formed. The first insulating layer 510 may be disposed on the alignment line 200, and may completely cover the alignment line 200. The first insulating layer 510 may insulate the first alignment line 210 and the second alignment line 220 from each other.

The first bank 600 may be disposed on the first insulating layer 510. The first bank 600 may be disposed in the non-emission area NEM. The first bank 600 may include openings respectively corresponding to the first to third emission areas EMA1, EMA2, and EMA3. The openings included in the first bank 600 may expose the light emitting elements ED disposed in the first to third emission areas EMA1, EMA2, and EMA3.

The light emitting element ED may be disposed in the emission area EMA. The light emitting element ED may be provided for each sub-pixel SPX, and may be disposed in each of the first to third emission areas EMA1, EMA2, and EMA3. The light emitting element ED may be disposed on the first insulating layer 510 exposed by the first bank 600 in the emission area EMA. The light emitting element ED may be disposed between the first alignment line 210 and the second alignment line 220 on the first insulating layer 510. The light emitting element ED may have a shape extending in one direction, and may be aligned such that at least one of both ends of the light emitting element ED is placed on (e.g., overlaps) the first alignment line 210 or the second alignment line 220.

Each light emitting element ED may emit light of a specific wavelength band. For example, the light emitting element ED may emit the third color light or the blue light having a peak wavelength in the range of 480 nm or less, and preferably a peak wavelength in the range of 445 nm to 480 nm. However, the present disclosure is not limited thereto, and the light emitting element ED may emit green light or red light.

The second insulating layer 520 may be disposed on the first insulating layer 510 on which the light emitting element ED is disposed and the first bank 600. The second insulating layer 520 may be disposed on the light emitting element ED in the emission area EMA of each sub-pixel SPX. The second insulating layer 520 disposed on the light emitting element ED in the emission area EMA may include openings exposing both ends of the light emitting element ED.

The contact electrode 700 may be disposed on the second insulating layer 520. The contact electrode 700 may include a first contact electrode 710 and a second contact electrode 720. The first contact electrode 710 and the second contact electrode 720 may be spaced from each other. The first contact electrode 710 and the second contact electrode 720 may be spaced from each other with the second insulating layer 520 disposed on the light emitting element ED interposed therebetween.

The first contact electrode 710 may overlap one end (e.g., one end that overlaps the first alignment line 210) of the light emitting element ED exposed by the second insulating layer 520. The first contact electrode 710 may be electrically connected to one end of the light emitting element ED exposed by the second insulating layer 520. The first contact electrode 710 may be in physical contact with one end of the light emitting element ED.

The second contact electrode 720 may overlap the other end (e.g., the end that overlaps the second alignment line 220) of the light emitting element ED exposed by the second insulating layer 520. The second contact electrode 720 may be electrically connected to the other end of the light emitting element ED exposed by the second insulating layer 520. The second contact electrode 720 may be in physical contact with the other end of the light emitting element ED.

Figure 7:
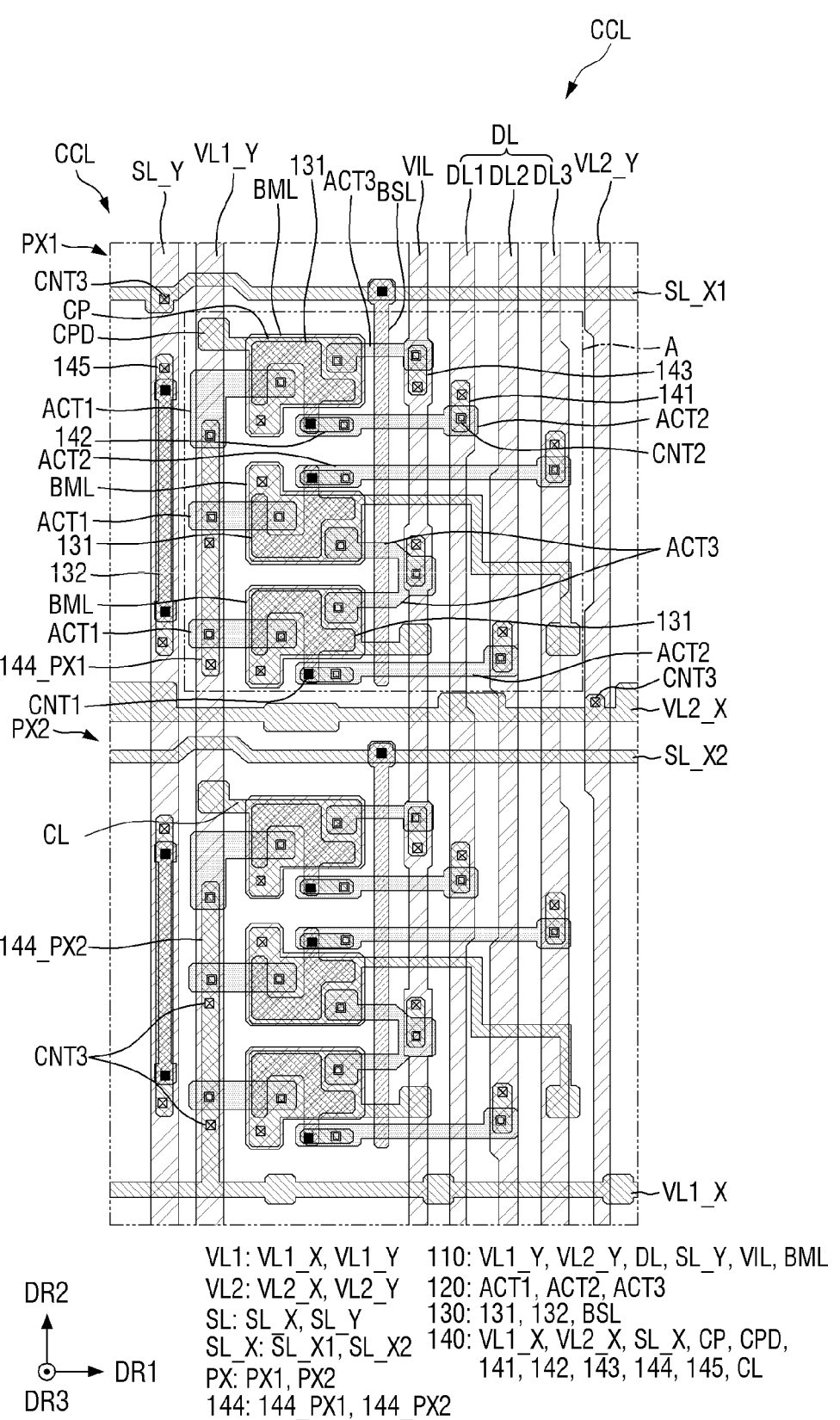
FIG. 7 is a schematic planar layout view of a circuit element layer of a display device according to one or more embodiments.

FIG. 7 is a schematic planar layout view of a circuit element layer of a display device according to one or more embodiments.

Hereinafter, a planar structure of the circuit element layer CCL of the display device 10 will be described in detail.

FIG. 7 illustrates the circuit element layer CCL of two pixels PX disposed adjacent to each other in the same column. Specifically, FIG. 7 illustrates a layout view of the circuit element layer CCL of the first pixel PX1 and the second pixel PX2 disposed adjacent to each other in the same column (or along the second direction DR2). Although not limited to the following, the first pixel PX1 may refer to a pixel PX1 disposed in an odd row from among the plurality of pixels PX arranged in a matrix direction, and the second pixel PX2 may refer to a pixel PX2 disposed in an even row from among the plurality of pixels PX arranged in a matrix direction. However, the present disclosure is not limited thereto, and the first pixel PX1 may refer to a pixel PX1 disposed in an even row from among the plurality of pixels PX arranged in the matrix direction, and the second pixel PX2 may refer to a pixel PX2 disposed in an odd row from among the plurality of pixels PX arranged in the matrix direction. Hereinafter, in the present specification, for simplicity of description, the first pixel PX1 may refer to a pixel PX disposed in an odd row, and the second pixel PX2 may refer to a pixel PX disposed in an even row, and the same notation 'PX1' may refer to the first pixel PX1 or the pixel PX1 in an odd row and the same notation 'PX2' may refer to the second pixel PX2 or the pixel PX2 in an even row.

On the other hand, the planar structures of the circuit element layer CCL of the first pixel PX1 and the second pixel PX2 may be substantially similar except that different types of voltage lines are disposed on the lower sides of the pixels PX. As will be described later, when the wire disposed on the uppermost side of the pixel PX in a plan view is set to the horizontal scan line SL_X, the planar structures of the first pixel PX1 and the second pixel PX2 may be substantially the same except that the second horizontal voltage line VL2_X is disposed on the lower side of the first pixel PX1 in a plan view, and the first horizontal voltage line VL1_X is disposed on the lower side of the second pixel PX2 in a plan view. Specifically, the planar structure of the plurality of patterns constituting the first to third sub-pixel circuits SP1, SP2, and SP3 that are the respective sub-pixel circuits of the first to third sub-pixels SPX1, SPX2 and SPX3 of the first pixel PX1 and the planar structure of the plurality of patterns constituting the first to third sub-pixel circuits SP1, SP2, and SP3 that are the respective sub-pixel circuits of the first to third sub-pixels SPX1, SPX2, and SPX3 of the second pixel PX2 may be substantially the same. Accordingly, the differences between the circuit element layer CCL of the first pixel PX1 and the circuit element layer CCL of the second pixel PX2 will be mainly described, and redundant description will be omitted.

Referring to FIG. 7, the circuit element layer CCL may include a first conductive layer 110, a semiconductor layer 120, a second conductive layer 130, and a third conductive layer 140. Hereinafter, the first conductive layer 110, the semiconductor layer 120, the second conductive layer 130, and the third conductive layer 140 will be described in that order.

The first conductive layer 110 may include the first vertical voltage line VL1_Y, the second vertical voltage line VL2_Y, the vertical scan line SL_Y, the initialization voltage line VIL, the data line DL, and a light blocking pattern BML.

The first vertical voltage line VL1_Y may extend in the second direction DR2, and may be disposed across the first and second pixels PX1 and PX2 disposed in the same column. For example, the first vertical voltage line VL1_Y may be disposed on the left side of the pixel PX in a plan view.

The second vertical voltage line VL2_Y may extend in the second direction DR2, and may be disposed across the first pixel PX1 and the second pixel PX2 disposed in the same column. The second vertical voltage line VL2_Y may be disposed on the right side of the pixel PX in a plan view. The second vertical voltage line VL2_Y may be spaced from the first vertical voltage line VL1_Y in the first direction DR1. For example, the second vertical voltage line VL2_Y may be disposed to be spaced from the right side of the first vertical voltage line VL1_Y in a plan view.

The vertical scan line SL_Y may extend in the second direction DR2, and may be disposed across the first pixel PX1 and the second pixel PX2 disposed in the same column. The vertical scan line SL_Y may be spaced from the first vertical voltage line VL1_Y and the second vertical voltage line VL2_Y in the first direction DR1. For example, the vertical scan line SL_Y may be disposed to be spaced from the left side of the first vertical voltage line VL1_Y in a plan view.

As described above, the vertical scan line SL_Y may cross the horizontal scan line SL_X, and one of the plurality of vertical scan lines SL_Y may be electrically connected to one of the plurality of horizontal scan lines SL_X in the crossing region. Specifically, one of the plurality of vertical scan lines SL_Y may be connected to one of the plurality of horizontal scan lines SL_X included in the third conductive layer 140 to be described later through a third contact hole CNT3. In one or more embodiments, the vertical scan line SL_Y disposed across the first pixel PX1 and the second pixel PX2 may be connected to the horizontal scan line SL_X1 disposed on the upper side of the first pixel PX1 through the third contact hole CNT3, and may not be connected to the horizontal scan line SL_X2 disposed on the upper side of the second pixel PX2.

The scan signal applied through the vertical scan line SL_Y may be transmitted to the plurality of pixels PX disposed in the same row as the first pixel PX1 through the horizontal scan line SL_X1 of the first pixel PX1 extending in the first direction DR1. The horizontal scan line SL_X2 of the second pixel PX2 may be connected to the vertical scan line disposed in another pixel PX column to receive the scan signal applied through the vertical scan line disposed in the another pixel PX column. Accordingly, the scan signal may be transmitted to the pixels PX arranged in different rows through different vertical scan lines SL_Y.

The initialization voltage line VIL may extend in the second direction DR2, and may be disposed across the first pixel PX1 and the second pixel PX2 disposed in the same column. The initialization voltage line VIL may be spaced from the first vertical voltage line VL1_Y and the second vertical voltage line VL2_Y in the first direction DR1. The initialization voltage line VIL may be disposed between the first vertical voltage line VL1_Y and the second vertical voltage line VL2_Y.

The data line DL may extend in the second direction DR2, and may be disposed across the first pixel PX1 and the second pixel PX2 disposed in the same column. The data line DL may be spaced from the first vertical voltage line VL1_Y, the vertical scan line SL_Y, the initialization voltage line VIL, and the second vertical voltage line VL2_Y in the first direction DR1. The data line DL may be disposed between the initialization voltage line VIL and the second vertical voltage line VL2_Y.

The first data line DL1 may be disposed between the initialization voltage line VIL and the second vertical voltage line VL2_Y, the second data line DL2 may be disposed between the first data line DL1 and the second vertical voltage line VL2_Y, and the third data line DL3 may be disposed between the second data line DL2 and the second vertical voltage line VL2_Y.

The light blocking pattern BML may be disposed between the first vertical voltage line VL1_Y and the initialization voltage line VIL. The light blocking pattern BML may be provided for each pixel PX. For example, the light blocking pattern BML may be provided in each of the first pixel PX1 and the second pixel PX2. One pixel PX may include a plurality of light blocking patterns BML, and the light blocking pattern BML may be provided for each sub-pixel SPX. The plurality of light blocking patterns BML provided for each sub-pixel SPX in one pixel PX may be spaced from each other in the second direction DR2 between the first vertical voltage line VL1_Y and the initialization voltage line VIL.

The semiconductor layer 120 may include a first semiconductor pattern ACT1, a second semiconductor pattern ACT2, and a third semiconductor pattern ACT3. The first semiconductor pattern ACT1, the second semiconductor pattern ACT2, and the third semiconductor pattern ACT3 may be spaced from each other. The first to third semiconductor patterns ACT1, ACT2, and ACT3 may be provided for each pixel PX. For example, the first to third semiconductor patterns ACT1, ACT2, and ACT3 may be provided in each of the first pixel PX1 and the second pixel PX2.

The first semiconductor pattern ACT1 may be disposed between the first vertical voltage line VL1_Y and the light blocking pattern BML. The first semiconductor pattern ACT1 may be disposed such that one end thereof overlaps the first vertical voltage line VL1_Y of the first conductive layer 110 and a fourth connection pattern 144 of the third conductive layer 140, and the other end thereof overlaps the light blocking pattern BML of the first conductive layer 110 and a first conductive pattern CP of the third conductive layer 140. One pixel PX may include a plurality of first semiconductor patterns ACT1, and the first semiconductor pattern ACT1 may be provided for each sub-pixel SPX. The first semiconductor pattern ACT1 may be the semiconductor pattern ACT1 of the first transistor T1 of each sub-pixel SPX.

The second semiconductor pattern ACT2 may be spaced from the first semiconductor pattern ACT1. The second semiconductor pattern ACT2 may be disposed between the data line DL of the first conductive layer 110 and a first gate pattern 131 of the second conductive layer 130 to be described later. The second semiconductor pattern ACT2 may be disposed such that one end thereof overlaps the data line DL of the first conductive layer 110 and a first connection pattern 141 of the third conductive layer 140, and the other end thereof overlaps the first gate pattern 131 of the third conductive layer 130 and a second connection pattern 142 of the third conductive layer 140. One pixel PX may include a plurality of second semiconductor patterns ACT2, and the second semiconductor pattern ACT2 may be provided for each sub-pixel SPX. The second semiconductor pattern ACT2 may be the semiconductor pattern ACT2 of the second transistor T2 of each sub-pixel SPX.

The third semiconductor pattern ACT3 may be disposed to be spaced from the first and second semiconductor patterns ACT1 and ACT2. The third semiconductor pattern ACT3 may be disposed between the light blocking pattern BML and the initialization voltage line VIL. The third semiconductor pattern ACT3 may be disposed such that one end thereof overlaps the initialization voltage line VIL of the first conductive layer 110 and a third connection pattern 143 of the third conductive layer 140, and the other end thereof overlaps the light blocking pattern BML of the conductive layer 110 and the first conductive pattern CP of the third conductive layer 140. One pixel PX may include a plurality of third semiconductor patterns ACT3, and the third semiconductor pattern ACT3 may be provided for each sub-pixel SPX. The third semiconductor pattern ACT3 may be the semiconductor pattern ACT3 of the third transistor T3 of each sub-pixel SPX.

The second conductive layer 130 may include the first gate pattern 131, a second gate pattern 132, and the auxiliary scan line BSL. The first gate pattern 131, the second gate pattern 132, and the auxiliary scan line BSL may be spaced from each other. The first gate pattern 131, the second gate pattern 132, and the auxiliary scan line BSL may be provided for each pixel PX. For example, the first gate pattern 131, the second gate pattern 132, and the auxiliary scan line BSL may be provided in each of the first pixel PX1 and the second pixel PX2.

The first gate pattern 131 may be disposed to overlap the light blocking pattern BML. A part of the first gate pattern 131 may overlap a region between one end and the other end of the first semiconductor pattern ACT1, and another part of the first gate pattern 131 may overlap the other end of the second semiconductor pattern ACT2. One pixel PX may include a plurality of first gate patterns 131, and the first gate pattern 131 may be provided for each sub-pixel SPX. The plurality of first gate patterns 131 provided for each sub-pixel SPX in one pixel PX may be spaced from each other in the second direction DR2.

The second gate pattern 132 may be disposed to overlap the vertical scan line SL_Y of the first conductive layer 110 and a fifth connection pattern 145 of the third conductive layer 140. The second gate pattern 132 may have a shape extending in the second direction DR2 in one pixel PX. As described above, the second gate pattern 132 may be provided in each of the first pixel PX1 and the second pixel PX2.

The second gate pattern 132 disposed in the first pixel PX1 may be disposed between the horizontal scan line SL_X1 disposed on the upper side of the first pixel PX1 and the second horizontal voltage line VL2_X disposed on the lower side of the first pixel PX1 in a plan view, and may be spaced from the horizontal scan line SL_X1 disposed in the first pixel PX1 and the second horizontal voltage line VL2_X disposed in the first pixel PX1 in a plan view. The second gate pattern 132 disposed in the second pixel PX2 may be disposed between the horizontal scan line SL_X2 disposed on the upper side of the second pixel PX2 and the first horizontal voltage line VL1_X disposed on the lower side of the second pixel PX2 in a plan view, and may be spaced from the horizontal scan line SL_X2 disposed in the second pixel PX2 and the first horizontal voltage line VL1_X disposed in the second pixel PX2 in a plan view.

The second gate pattern 132 may be in physical contact with the fifth connection pattern 145 of the third conductive layer 140 through a first contact hole CNT1. The second gate pattern 132 may be connected to the vertical scan line SL_Y through the fifth connection pattern 145, and may serve to lower the resistance of the scan line SL. The second gate pattern 132 may be omitted.

The auxiliary scan line BSL may be disposed between the initialization voltage line VIL and the light blocking pattern BML. The auxiliary scan line BSL may be disposed on the right side of the first gate pattern 131 in a plan view. The auxiliary scan line BSL may have a shape extending in the second direction DR2 in one pixel PX. As described above, the auxiliary scan line BSL may be provided in each of the first pixel PX1 and the second pixel PX2.

The auxiliary scan line BSL may extend in the second direction DR2. The auxiliary scan line BSL extending in the second direction DR2 may overlap a region between one end and the other end of the second semiconductor pattern ACT2 provided for the plurality of sub-pixels SPX and a region between one end and the other end of the third semiconductor pattern ACT3. One end of the auxiliary scan line BSL may overlap the horizontal scan line SL_X of the third conductive layer 140 disposed on the upper side of each pixel PX in a plan view, and the other end thereof may be spaced from the second horizontal voltage line VL2_X or the first horizontal voltage line VL1_X of the third conductive layer 140 disposed on the lower side of each pixel PX in a plan view. One end of the auxiliary scan line BSL may be in physical contact with the horizontal scan line SL_X of the third conductive layer 140 through the first contact hole CNT1. The auxiliary scan line BSL may be electrically connected to the scan line SL through the first contact hole CNT1, and may constitute the gate electrodes of the second and third transistors T2 and T3 of the first to third sub-pixels SPX1, SPX2, and SPX3 included in one pixel PX.

The third conductive layer 140 may include the first horizontal voltage line VL1_X, the second horizontal voltage line VL2_X, the horizontal scan line SL_X, the first conductive pattern CP, a contact conductive pattern CPD, the first to fifth connection patterns 141, 142, 143, 144, and 145, and a sixth connection pattern CL. The first horizontal voltage line VL1_X, the second horizontal voltage line VL2_X, the horizontal scan line SL_X, the first conductive pattern CP, the contact conductive pattern CPD, and the first to fifth connection patterns 141, 142, 143, 144, and 145 may be spaced from each other.

The first conductive pattern CP, the contact conductive pattern CPD, the first to fifth connection patterns 141, 142, 143, 144, and 145, and the sixth connection pattern CL may be provided for each pixel PX. For example, the first conductive pattern CP, the contact conductive pattern CPD, the first to fifth connection patterns 141, 142, 143, 144, and 145, and the sixth connection pattern CL may be provided in each of the first pixel PX1 and the second pixel PX2.

The horizontal scan line SL_X may extend in the first direction DR1. The horizontal scan lines SL_X may be disposed across the pixels PX disposed in the same row, and may be spaced from each other along the pixel PX column. For example, the horizontal scan line SL_X may be disposed in each of the first pixel PX1 and the second pixel PX2 arranged in different rows in the same column. The horizontal scan line SL_X1 transmitting the scan signal to the first pixel PX1 and the horizontal scan line SL_X2 transmitting the scan signal to the second pixel PX2 may be spaced from each other in the second direction DR2.

The horizontal scan line SL_X may be disposed on the upper side of the pixel PX in a plan view. For example, the horizontal scan line SL_X1 transmitting the scan signal to the first pixel PX1 may be disposed on the upper side of the first pixel PX1 in a plan view, and the horizontal scan line SL_X2 transmitting the scan signal to the second pixel PX2 may be disposed on the upper side of the second pixel PX2 in a plan view.

The horizontal scan line SL_X may be electrically connected to the auxiliary scan line BSL through the first contact hole CNT1 in a region overlapping the auxiliary scan line BSL. The horizontal scan line SL_X may be connected to one of the vertical scan lines SL_Y disposed for each pixel PX column through the third contact hole CNT3. As described above, the horizontal scan line SL_X1 disposed on the upper side of the first pixel PX1 in a plan view may be connected to the vertical scan line SL_Y disposed across the first and second pixels PX1 and PX2 through the third contact hole CNT3, and the horizontal scan line SL_X2 disposed on the upper side of the second pixel PX2 in a plan view may not be connected to the vertical scan line SL_Y disposed across the first and second pixels PX1 and PX2. The horizontal scan line SL_X2 disposed on the upper side of the second pixel PX2 in a plan view may be connected to the vertical scan line disposed in another pixel PX column.

The second horizontal voltage line VL2_X may extend in the first direction DR1. The second horizontal voltage line VL2_X may be spaced from the horizontal scan line SL_X in the second direction DR2. The second horizontal voltage line VL2_X may be disposed across the pixels PX disposed in the same row, and may be spaced from each other along the pixel PX column. As described above, the second horizontal voltage line VL2_X may be disposed in odd pixel PX1 rows, and may not be disposed in even pixel PX2 rows. Accordingly, the second horizontal voltage line VL2_X may be disposed in the first pixel PX1, and may not be disposed in the second pixel PX2.

The second horizontal voltage line VL2_X may be disposed on the lower side of the first pixel PX1 in a plan view. Accordingly, the second horizontal voltage line VL2_X may be disposed adjacent to the upper side of the horizontal scan line SL_X2 of the second pixel PX2 in a plan view.

The second horizontal voltage line VL2_X may cross the second vertical voltage line VL2_Y included in the first conductive layer 110. The second horizontal voltage line VL2_X may be electrically connected to the second vertical voltage line VL2_Y through the third contact hole CNT3.

The first horizontal voltage line VL1_X may extend in the first direction DR1. The first horizontal voltage line VL1_X may be spaced from the horizontal scan line SL_X and the second horizontal voltage line VL2_X in the second direction DR2. The first horizontal voltage line VL1_X may be disposed across the pixels PX disposed in the same row, and may be spaced from each other along the pixel PX column. As described above, the first horizontal voltage line VL1_X may be disposed in even pixel PX2 rows, and may not be disposed in odd pixel PX1 rows. Accordingly, the first horizontal voltage line VL1_X may be disposed in the second pixel PX2, and may not be disposed in the first pixel PX1. That is, the first horizontal voltage line VL1_X and the second horizontal voltage line VL2_X may be alternately arranged along the pixel PX column.

The first horizontal voltage line VL1_X may be disposed on the lower side of the second pixel PX2 in a plan view. In one or more embodiments, the first horizontal voltage line VL1_X may be disposed adjacent to the upper side of the horizontal scan line SL_X1 of the odd pixel PX disposed on the lower side of the second pixel PX2.

The first horizontal voltage line VL1_X may cross the first vertical voltage line VL1_Y included in the first conductive layer 110. The first horizontal voltage line VL1_X may be integrated with a fourth connection pattern 144_PX2 included in the second pixel PX2 and overlapping the first vertical voltage line VL1_Y. The fourth connection pattern 144_PX2 included in the second pixel PX2 may branch upward from the first horizontal voltage line VL1_X. The fourth connection pattern 144_PX2 included in the second pixel PX2 may be electrically connected to the first vertical voltage line VL1_Y through the third contact hole CNT3. However, the present disclosure is not limited thereto, and the first horizontal voltage line VL1_X and the fourth connection pattern 144_PX2 included in the second pixel PX2 may be spaced from each other, and the first horizontal voltage line VL1_X and the first vertical voltage line VL1_Y may be electrically connected to each other through another third contact hole CNT3 in the crossing region.

One pixel PX may include a plurality of first conductive patterns CP, a plurality of contact conductive patterns CPD, a plurality of first to third connection patterns 141, 142, and 143, and a plurality of sixth connection patterns CL, and the first conductive pattern CP, the contact conductive pattern CPD, the first to third connection patterns 141, 142, and 143, and the sixth connection pattern CL may be provided for each sub-pixel SPX. The plurality of first conductive patterns CP, the plurality of contact conductive patterns CPD, the plurality of first to third connection patterns 141, 142, and 143, and the plurality of sixth connection patterns CL provided for each sub-pixel SPX in one pixel PX may be spaced from each other.

The first conductive pattern CP may be disposed to overlap the light blocking pattern BML and the first gate pattern 131. The plurality of first conductive patterns CP provided for each sub-pixel SPX in one pixel PX may be spaced from each other in the second direction DR2.

A part of the first conductive pattern CP may overlap the other end of the first semiconductor pattern ACT1, another part of the first conductive pattern CP may overlap the other end of the third semiconductor pattern ACT3, and yet another part of the first conductive pattern CP may overlap the first gate pattern 131.

The contact conductive pattern CPD may be spaced from the first conductive pattern CP. The sixth connection pattern CL may be disposed between the contact conductive pattern CPD and the first conductive pattern CP. The sixth connection pattern CL may be disposed between the contact conductive pattern CPD and the first conductive pattern CP to connect them. The contact conductive pattern CPD, the first conductive pattern CP, and the sixth connection pattern CL may be integrated to form a single pattern. The contact conductive pattern CPD may be electrically connected to the first conductive pattern CP, and may serve to electrically connect the transistor and/or the capacitor and the second contact electrode 720 of the contact electrode 700 of the light emitting element layer EML, as will be described later.

The first connection pattern 141 may be disposed to overlap the data line DL. The plurality of first connection patterns 141 provided for each sub-pixel SPX in one pixel PX may be disposed to overlap one end of the second semiconductor pattern ACT2 of each sub-pixel SPX and the data line DL. Accordingly, the first connection pattern 141 disposed in each sub-pixel SPX may be disposed to overlap different data lines DL.

The second connection pattern 142 may be disposed to overlap the other end of the second semiconductor pattern ACT2 and a part of the first gate pattern 131. The plurality of second connection patterns 142 provided for each sub-pixel SPX in one pixel PX may be disposed to overlap the other end of the second semiconductor pattern ACT2 of each sub-pixel SPX and a part of the first gate pattern 131.

The third connection pattern 143 may be disposed to overlap the initialization voltage line VIL. The plurality of third connection patterns 143 provided for each sub-pixel SPX in one pixel PX may be disposed to overlap one end of the third semiconductor pattern ACT2 of each sub-pixel SPX and the initialization voltage line VIL. The third connection patterns 143 disposed in the sub-pixels SPX may overlap the same initialization voltage line VIL.

The fourth connection pattern 144 may be disposed to overlap the first vertical voltage line VL1_Y. The fourth connection pattern 144 may overlap one end of the first semiconductor pattern ACT1. In one or more embodiments, the fourth connection pattern 144 may overlap one end of the first semiconductor pattern ACT1 of the plurality of sub-pixels SPX included in one pixel PX.

The fourth connection pattern 144 may be disposed on the left side of the first conductive pattern CP to be spaced from the first conductive pattern CP. The fourth connection pattern 144 may have a shape extending in the second direction DR2 in one pixel PX. As described above, the fourth connection pattern 144 may be provided in each of the first pixel PX1 and the second pixel PX2.

The fourth connection pattern 144_PX1 disposed in the first pixel PX1 may be disposed between the horizontal scan line SL_X1 disposed on the upper side of the first pixel PX1 and the second horizontal voltage line VL2_X disposed on the lower side of the first pixel PX1 in a plan view, and may be spaced from the horizontal scan line SL_X1 disposed in the first pixel PX1 and the second horizontal voltage line VL2_X disposed in the first pixel PX1 in a plan view. The fourth connection pattern 144_PX2 disposed in the second pixel PX2 may be disposed between the horizontal scan line SL_X2 disposed on the upper side of the second pixel PX2 and the first horizontal voltage line VL1_X disposed on the lower side of the second pixel PX2 in a plan view, and may be spaced from the horizontal scan line SL_X2 disposed in the second pixel PX2 in a plan view and integrated with the first horizontal voltage line VL1_X disposed in the second pixel PX2 to form a single pattern. That is, the fourth connection pattern 144_PX2 disposed in the second pixel PX2 may branch upward from the first horizontal voltage line VL1_X disposed in the second pixel PX2.

The fifth connection pattern 145 may be disposed to overlap the vertical scan line SL_Y and the second gate pattern 132. The fifth connection pattern 145 may have a shape extending in the second direction DR2 in one pixel PX. As described above, the second gate pattern 132 may be provided in each of the first pixel PX1 and the second pixel PX2.

The fifth connection pattern 145 disposed in the first pixel PX1 may be disposed between the horizontal scan line SL_X1 disposed on the upper side of the first pixel PX1 and the second horizontal voltage line VL2_X disposed on the lower side of the first pixel PX1 in a plan view, and may be spaced from the horizontal scan line SL_X1 disposed in the first pixel PX1 and the second horizontal voltage line VL2_X disposed in the first pixel PX1 in a plan view. The fifth connection pattern 145 disposed in the second pixel PX2 may be disposed between the horizontal scan line SL_X2 disposed on the upper side of the second pixel PX2 and the first horizontal voltage line VL1_X disposed on the lower side of the second pixel PX2 in a plan view, and may be spaced from the horizontal scan line SL_X2 disposed in the second pixel PX2 and the first horizontal voltage line VL1_X disposed in the second pixel PX2 in a plan view.

The fifth connection pattern 145 may be in physical contact with the second gate pattern 132 of the second conductive layer 130 through the first contact hole CNT1, and may be in physical contact with the vertical scan line SL_Y of the first conductive layer 110 through the third contact hole CNT3. The fifth connection pattern 145, the second gate pattern 132, and the vertical scan line SL_Y may be in contact with and electrically connected to each other. Accordingly, the contact area of the scan line SL_Y may increase, so that the resistance of the scan line SL_Y may decrease. The fifth connection pattern 145 may be omitted.

Figure 8:
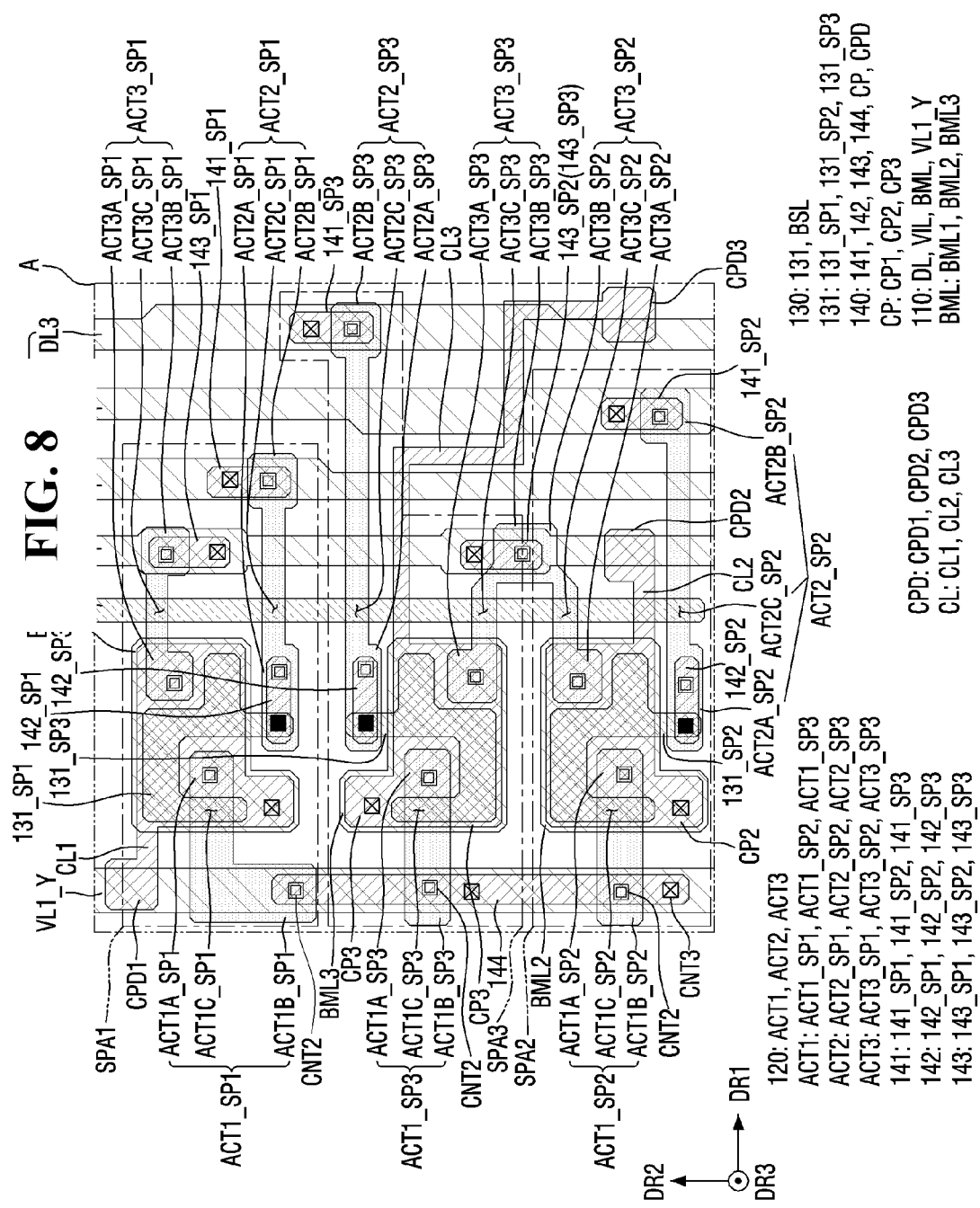
FIG. 8 is an enlarged planar layout view of an area A of FIG. 7.

FIG. 8 is an enlarged planar layout view of an area A of FIG. 7.

Hereinafter, a connection relationship between a plurality of layers of the circuit element layer CCL will be described with reference to FIG. 8 illustrating a region where a transistor and a capacitor of one pixel PX are disposed.

FIG. 8 illustrates a first sub-pixel circuit area SPA1 in which the sub-pixel circuit SP1 of the first sub-pixel SPX1 is disposed, a second sub-pixel circuit area SPA2 in which the sub-pixel circuit SP2 of the second sub-pixel SPX2 is disposed, a third sub-pixel circuit area SPA3 in which the sub-pixel circuit SP3 of the third sub-pixel SPX3 is disposed.

The first sub-pixel circuit area SPA1 may be disposed on the upper side in a plan view. The second sub-pixel circuit area SPA2 may be disposed on the lower side the first sub-pixel circuit area SPA1. The third sub-pixel circuit area SPA3 may be disposed between the first sub-pixel circuit area SPA1 and the second sub-pixel circuit area SPA2.

A plurality of patterns corresponding to the respective sub-pixels SPX may be disposed in the respective sub-pixel circuit areas SPA.

Specifically, the light blocking pattern BML may include a first light blocking pattern BML1 disposed in the first sub-pixel circuit area SPA1, a second light blocking pattern BML2 disposed in the second sub-pixel circuit area SPA2, and a third light blocking pattern BML3 disposed in the third sub-pixel circuit area SPA3. The first to third blocking patterns BML1, BML2, and BML3 may be spaced from each other.

The first gate pattern 131 may include a first sub-gate pattern 131_SP1 disposed in the first sub-pixel circuit area SPA1, a second sub-gate pattern 131_SP2 disposed in the second sub-pixel circuit area SPA2, and a third sub-gate pattern 131_SP3 disposed in the third sub-pixel circuit area SPA3. The first to third sub-gate patterns 131_SP1, 131_SP2, and 131_SP3 may be spaced from each other.

The first semiconductor pattern ACT1 may include a first semiconductor pattern ACT1_SP1 of the first sub-pixel SPX1 disposed in the first sub-pixel circuit area SPA1, a first semiconductor pattern ACT1_SP2 of the second sub-pixel SPX2 disposed in the second sub-pixel circuit area SPA2, and a first semiconductor pattern ACT1_SP3 of the third sub-pixel SPX3 disposed in the third sub-pixel circuit area SPA3.

The first semiconductor pattern ACT1_SP1 of the first sub-pixel SPX1 may include a channel region ACT1C_SP1, a drain region ACT1B_SP1, and a source region ACT1A_SP1. The first semiconductor pattern ACT1_SP2 of the second sub-pixel SPX2 may include a channel region ACT1C_SP2, a drain region ACT1B_SP2, and a source region ACT1A_SP2. The first semiconductor pattern ACT1_SP3 of the third sub-pixel SPX3 may include a channel region ACT1C_SP3, a drain region ACT1B_SP3, and a source region ACT1A_SP3.

The drain regions ACT1B_SP1, ACT1B_SP2, and ACT1B_SP3 of the first semiconductor patterns ACT1_SP1, ACT1_SP2, and ACT1_SP3 of the first to third sub-pixels SPX1, SPX2, and SPX3 may be connected to the fourth connection pattern 144 through the second contact hole CNT2. The fourth connection pattern 144 may be connected to the first vertical voltage line VL1_Y through the third contact hole CNT3 to be electrically connected to the drain regions ACT1B_SP1, ACT1B_SP2, and ACT1B_SP3 of the first semiconductor patterns ACT1_SP1, ACT1_SP2, and ACT1_SP3 of the first to third sub-pixels SPX1, SPX2, and SPX3. The fourth connection pattern 144 may serve to electrically connect the drain regions ACT1B_SP1, ACT1B_SP2, and ACT1B_SP3 of the first semiconductor patterns ACT1_SP1, ACT1_SP2, and ACT1_SP3 of the first to third sub-pixels SPX1, SPX2, and SPX3 to the first voltage line VL1. A part of the fourth connection pattern 144 may be the drain electrode of the first transistor of each of the first to third sub-pixels SPX1, SPX2, and SPX3.

The source regions ACT1A_SP1, ACT1A_SP2, and ACT1A_SP3 of the first semiconductor patterns ACT1_SP1, ACT1_SP2, and ACT1_SP3 of the first to third sub-pixels SPX1, SPX2, and SPX3 may overlap the first conductive patterns CP of the first to third sub-pixels SPX1, SPX2, and SPX3. The source regions ACT1A_SP1, ACT1A_SP2, and ACT1A_SP3 of the first semiconductor patterns ACT1_SP1, ACT1_SP2, and ACT1_SP3 of the first to third sub-pixels SPX1, SPX2, and SPX3 may be connected to the first conductive patterns CP of the first to third sub-pixels SPX1, SPX2, and SPX3 through the second contact holes CNT2, respectively.

The channel regions ACT1C_SP1, ACT1C_SP2, and ACT1C_SP3 of the first semiconductor patterns ACT1_SP1, ACT1_SP2, and ACT1_SP3 of the first to third sub-pixels SPX1, SPX2, and SPX3 may overlap parts of the first to third sub-gate patterns 131_SP1, 131_SP2, and 131_SP3 of the first to third sub-pixels SPX1, SPX2, and SPX3, respectively.

The second semiconductor pattern ACT2 may include a second semiconductor pattern ACT2_SP1 of the first sub-pixel SPX1 disposed in the first sub-pixel circuit area SPA1, a second semiconductor pattern ACT2_SP2 of the second sub-pixel SPX2 disposed in the second sub-pixel circuit area SPA2, a second semiconductor pattern ACT2_SP3 of the third sub-pixel SPX3 disposed in the third sub-pixel circuit area SPA3.

The second semiconductor pattern ACT2_SP1 of the first sub-pixel SPX1 may include a channel region ACT2C_SP1, a drain region ACT2B_SP1, and a source region ACT2A_SP1. The second semiconductor pattern ACT2_SP2 of the second sub-pixel SPX2 may include a channel region ACT2C_SP2, a drain region ACT2B_SP2, and a source region ACT2A_SP2. The second semiconductor pattern ACT2_SP3 of the third sub-pixel SPX3 may include a channel region ACT2C_SP3, a drain region ACT2B_SP3, and a source region ACT2A_SP3.

The drain regions ACT2B_SP1, ACT2B_SP2, and ACT2B_SP3 of the second semiconductor patterns ACT2_SP1, ACT2_SP2, and ACT2_SP3 of the first to third sub-pixels SPX1, SPX2, and SPX3 may be connected to the data line DL through the first connection patterns 141_SP1, 141_SP2, and 141_SP3 of the first to third sub-pixels SPX1, SPX2, and SPX3, respectively.

The drain region ACT2B_SP1 of the second semiconductor layer ACT2_SP1 of the first sub-pixel SPX1 may be connected to the first connection pattern 141_SP1 of the first sub-pixel SPX1 through the second contact hole CNT2, and the first connection pattern 141_SP1 of the first sub-pixel SPX1 may be connected to the first data line DL1 through the third contact hole CNT3. The drain region ACT2B_SP2 of the second semiconductor layer ACT2_SP2 of the second sub-pixel SPX2 may be connected to the first connection pattern 141_SP2 of the second sub-pixel SPX2 through the second contact hole CNT2, and the first connection pattern 141_SP2 of the second sub-pixel SPX2 may be connected to the second data line DL2 through the third contact hole CNT3. The drain region ACT2B_SP3 of the second semiconductor layer ACT2_SP3 of the third sub-pixel SPX3 may be connected to the first connection pattern 141_SP3 of the third sub-pixel SPX3 through the second contact hole CNT2, and the first connection pattern 141_SP3 of the third sub-pixel SPX3 may be connected to the third data line DL3 through the third contact hole CNT3. That is, the first connection pattern 141 may serve to connect the drain regions ACT2B_SP1, ACT2B_SP2, and ACT2B_SP3 of the second semiconductor patterns ACT2_SP1, ACT2_SP2, and ACT2_SP3 of the first to third sub-pixels SPX1, SPX2, and SPX3 to the data line DL. That is, the first connection pattern 141 may be the drain electrode of the second transistor of each of the first to third sub-pixels SPX1, SPX2, and SPX3.

The source region ACT2A_SP1 of the second semiconductor layer ACT2_SP1 of the first sub-pixel SPX1 may be connected to the second connection pattern 142_SP1 of the first sub-pixel SPX1 through the second contact hole CNT2, and the second connection pattern 142_SP1 of the first sub-pixel SPX1 may be connected to the first sub-gate pattern 131_SP1 through the first contact hole CNT1. The source region ACT2A_SP2 of the second semiconductor layer ACT2_SP2 of the second sub-pixel SPX2 may be connected to the second connection pattern 142_SP2 of the second sub-pixel SPX2 through the second contact hole CNT2, and the second connection pattern 142_SP2 of the second sub-pixel SPX2 may be connected to the second sub-gate pattern 131_SP2 through the first contact hole CNT1. The source region ACT2A_SP3 of the second semiconductor layer ACT2_SP3 of the third sub-pixel SPX3 may be connected to the second connection pattern 142_5P3 of the third sub-pixel SPX3 through the second contact hole CNT2, and the second connection pattern 142_SP3 of the third sub-pixel SPX3 may be connected to the third sub-gate pattern 131_SP3 through the first contact hole CNT1.

The third semiconductor pattern ACT3 may include the third semiconductor pattern ACT3_SP1 of the first sub-pixel SPX1 disposed in the first sub-pixel circuit area SPA1, and the third semiconductor pattern ACT3_SP3 or ACT3_SP2 disposed across the third sub-pixel circuit area SPA3 and the second sub-pixel circuit area SPA2. The third semiconductor pattern ACT3_SP2 of the second sub-pixel SPX2 and the third semiconductor pattern ACT3_SP3 of the third sub-pixel SPX3 may be integrated to form a single pattern.

Specifically, the third semiconductor pattern ACT3_SP1 of the first sub-pixel SPX1 may include a channel region ACT3C_SP1, a drain region ACT3B_SP1, and a source region ACT3A_SP1. The third semiconductor pattern ACT3_SP2 of the second sub-pixel SPX2 may include a channel region ACT3C_SP2, a drain region ACT3B_SP2, and a source region ACT3A_SP2. The third semiconductor pattern ACT3_SP3 of the third sub-pixel SPX3 may include a channel region ACT3C_SP3, a drain region ACT3B_SP3, and a source region ACT3A_SP3. The drain region ACT3B_SP2 of the third semiconductor pattern ACT3_SP2 of the second sub-pixel SPX2 and the drain region ACT3B_SP3 of the third semiconductor pattern ACT3_SP3 of the third sub-pixel SPX3 may be shared.

The source regions ACT3A_SP1, ACT3A_SP2, and ACT3A_SP3 of the third semiconductor patterns ACT3_SP1, ACT3_SP2, and ACT3_SP3 of the first to third sub-pixels SPX1, SPX2, and SPX3 may be connected to the first to third sub-conductive patterns CP1, CP2, and CP3 of the first to third sub-pixels SPX1, SPX2, and SPX3 through the second contact holes CNT2, respectively.

The drain regions ACT3B_SP1, ACT3B_SP2, and ACT3B_SP3 of the third semiconductor patterns ACT3_SP1, ACT3_SP2, and ACT3_SP3 of the first to third sub-pixels SPX1, SPX2, and SPX3 may be electrically connected to third connection patterns 143_SP1, 143_SP2, and 143_SP3 of the first to third sub-pixels SPX1, SPX2, and SPX3 through the second contact holes CNT2, respectively.

The first conductive pattern CP may include the first to third sub-conductive patterns CP1, CP2, and CP3. The first sub-conductive pattern CP1 may be disposed in the first sub-pixel circuit area SPA1, the second sub-conductive pattern CP2 may be disposed in the second sub-pixel circuit area SPA2, and the third sub-conductive pattern CP3 may be disposed in the third sub-pixel circuit area SPA3.

The contact conductive pattern CPD may include a first contact conductive pattern CPD1 connected to the first sub-conductive pattern CP1 of the first sub-pixel SPX1, a second contact conductive pattern CPD2 connected to the second sub-conductive pattern CP2 of the second sub-pixel SPX2, and a third contact conductive pattern CPD3 connected to the third sub-conductive pattern CP3 of the third sub-pixel SPX3. The first sub-conductive pattern CP1 and the first contact conductive pattern CPD1 may be connected to each other through a sixth connection pattern CL1 disposed in the first sub-pixel circuit area SPA1, the second sub-conductive pattern CP2 and the second contact conductive pattern CPD2 may be connected to each other through a sixth connection pattern CL2 disposed in the second sub-pixel circuit area SPA2, and the third sub-conductive pattern CP3 and the third contact conductive pattern CPD3 may be connected to each other through a sixth connection pattern CL3 disposed in the third sub-pixel circuit area SPA3.

The first contact conductive pattern CPD1 may be disposed on the upper side in a plan view, the second contact conductive pattern CPD2 may be disposed on the lower side in a plan view, and the third contact conductive pattern CPD3 may be disposed on the lower side in a plan view. The first to third contact conductive patterns CPD1, CPD2, and CPD3 may be connected to the transistors of the corresponding sub-pixels SPX.

Figure 9:
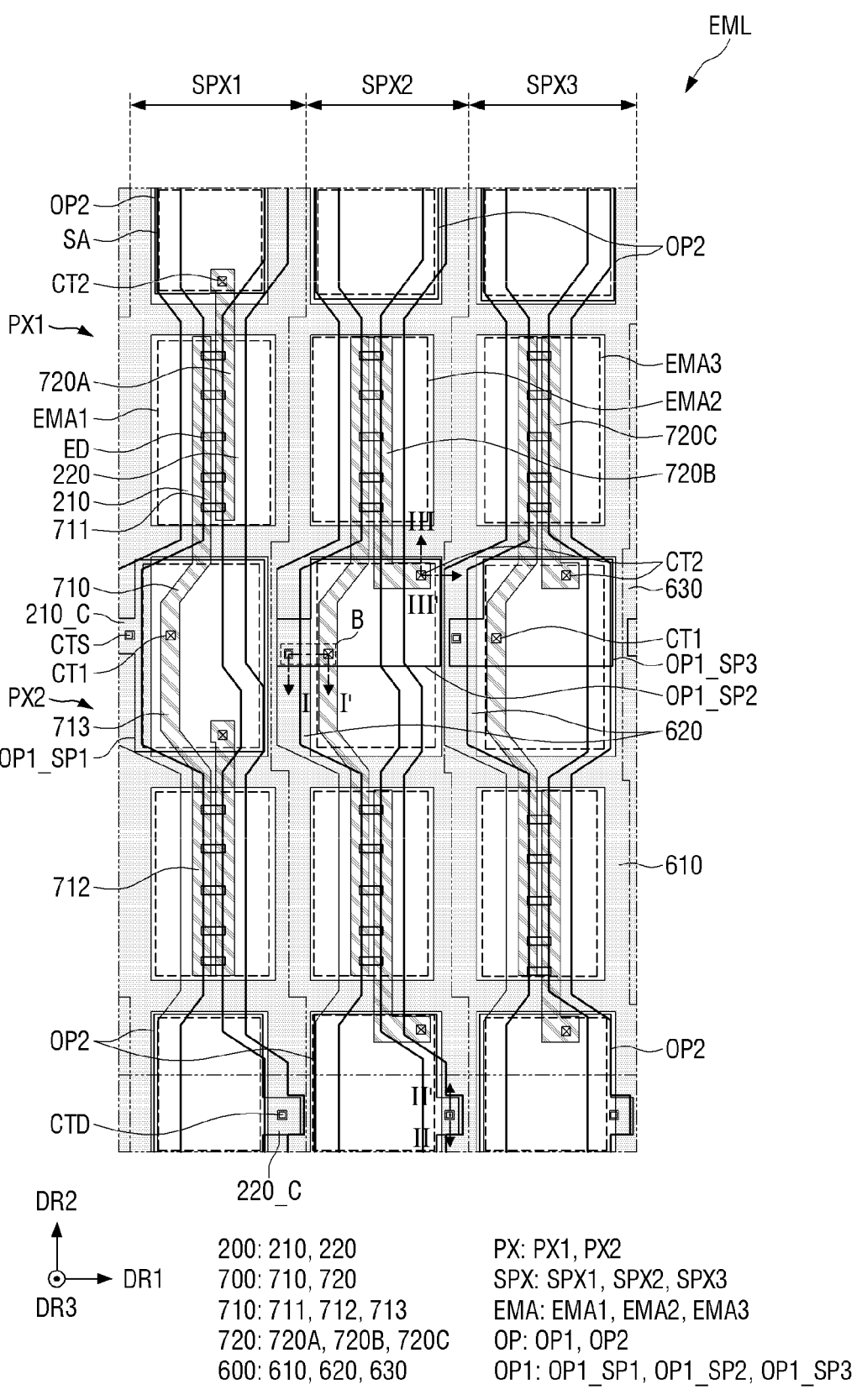
FIG. 9 is a schematic planar layout view of a light emitting element layer of a display device according to one or more embodiments.

FIG. 9 is a schematic planar layout view of a light emitting element layer of a display device according to one or more embodiments.

Hereinafter, the planar structure of the light emitting element layer EML of the display device 10 will be described in detail. FIG. 9 illustrates the light emitting element layer EML of two pixels PX disposed adjacent to each other in the same column, similarly to FIG. 7. As shown in FIG. 9, the light emitting element layer EML may have a pattern in which the first pixel PX1 and the second pixel PX2 adjacent in the second direction DR2 are repeated as a pair.

Referring to FIG. 9, the light emitting element layer EML may include the alignment line 200, the contact electrode 700, the first bank 600, and the plurality of light emitting elements ED.

The emission area EMA may include an area in which the light emitting element ED is disposed and an area adjacent thereto. In addition, the emission area EMA may further include a region in which the light emitted from the light emitting element ED is reflected or refracted by another member and emitted.

The sub-region SA may be disposed on one side and/or the other side in the second direction DR2 of the emission area EMA of each sub-pixel SPX in a plan view in each sub-pixel SPX. For example, the sub-regions SA may be disposed between the emission areas EMA of the sub-pixels SPX arranged in the same column and adjacent in the second direction DR2. The plurality of light emitting elements ED may be disposed in the emission area EMA of each sub-pixel SPX, and may not be disposed in the sub-region SA of each sub-pixel SPX. The sub-region SA may be a region where the contact electrode 700 of the light emitting element layer EML and the circuit element layer CCL are electrically connected through the electrode contact holes CT1 and CT2.

The first bank 600 may be disposed to be around (e.g., to surround) the emission area EMA of each sub-pixel SPX to distinguish the emission area EMA of each sub-pixel SPX. Specifically, the first bank 600 may be disposed across the boundaries of the first to third emission areas EMA1, EMA2, and EMA3 to distinguish the first to third emission areas EMA1, EMA2, and EMA3 and the sub-region SA adjacent to each other. Further, the first bank 600 may be disposed across the boundary of the sub-region SA of each pixel PX, and may be disposed at the boundary of the sub-region SA of each sub-pixel SPX included in one pixel PX.

In one or more embodiments, the first bank 600 may include a first area 610, a second area 620, and a third area 630. In the first bank 600, the first area 610, the second area 620, and the third area 630 may be integrated to form a single pattern. The first bank 600 may include portions extending in the first direction DR1 and the second direction DR2 in a plan view to be arranged in a grid pattern in a plan view.

The first area 610 of the first bank 600 may be disposed to be around (e.g., to surround) the first to third emission areas EMA1, EMA2, and EMA3. The first area 610 of the first bank 600 may distinguish the first to third emission areas EMA1, EMA2, and EMA3, and further distinguish the emission area EMA and the sub-region SA.

Due to the first area 610 of the first bank 600, in the inkjet printing process for aligning the light emitting element ED during the manufacturing process of the display device 10, an ink in which the plurality of light emitting elements ED are dispersed may be sprayed into the emission area EMA of the corresponding sub-pixel SPX without being mixed to the adjacent sub-pixel SPX and/or the adjacent pixel PX. Further, the first area 610 of the first bank 600 may be disposed to distinguish the sub-region SA and the emission area EMA, and may serve to guide the ink in which the plurality of light emitting elements ED are dispersed to be stably sprayed to the emission area EMA without being sprayed to the sub-region SA in the inkjet printing process for aligning the plurality of light emitting elements ED.

The second area 620 of the first bank 600 may be disposed between the sub-regions SA of the sub-pixels SPX in one pixel PX. The second area 620 of the first bank 600 may extend in the second direction DR2 between the sub-regions SA of the sub-pixels SPX. The third area 630 of the first bank 600 may be disposed between the sub-regions SA of the pixels PX adjacent in the first direction DR1. The third area 630 of the first bank 600 may extend in the second direction DR2 between the sub-regions SA of the pixels PX adjacent in the first direction DR1. The second area 620 of the first bank 600 and the third area 630 of the first bank 600 may be disposed between the first areas 610 of the first banks 600 adjacent in the second direction DR2 and serve to fix them. That is, the second area 620 of the first bank 600 and the third area 630 of the first bank 600 may serve to support the first area 610 of the first bank 600 so that it is not separated during the manufacturing process of the display device 10.

The alignment line 200 may extend in the second direction DR2. In one embodiment, the alignment line 200 may extend in the second direction DR2 to be disposed across the plurality of sub-pixels SPX disposed in the same column. The alignment line 200 disposed in the same column may extend in the second direction DR2 without disconnection.

The alignment line 200 may be disposed for each column of the sub-pixel SPX. For example, the alignment line 200 may extend in the second direction DR2 to be disposed across the first sub-pixels SPX1 arranged in a first column, disposed across the second sub-pixels SPX2 arranged in a second column, and disposed across the third sub-pixels SPX3 arranged in a third column of FIG. 9.

The alignment line 200 disposed for each column of the sub-pixel SPX may include a first alignment line 210 and a second alignment line 220 substantially extending in the second direction DR2 and spaced from each other in the first direction DR1.

At least a part of each of the first alignment line 210 and the second alignment line 220 may overlap the emission area EMA of each sub-pixel SPX. The first alignment line 210 and the second alignment line 220 overlapping the emission area EMA of each sub-pixel SPX may extend in the second direction DR2 and may be spaced from each other in the first direction DR1.

The first alignment line 210 may include a first alignment contact portion 210_C located in the non-emission area, and the second alignment line 220 may include a second alignment contact portion 220_C located in the non-emission area. The first alignment contact portion 210_C may be a part of the first alignment line 210 electrically connected to the circuit element layer CCL through a first alignment contact hole CTS, and the second alignment contact portion 220_C may be a part of the second alignment line 220 electrically connected to the circuit element layer CCL through a second alignment contact hole CTD. That is, the first alignment line 210 may be electrically connected to the circuit element layer CCL through the first alignment contact hole CTS, and the second alignment line 220 may be electrically connected to the circuit element layer CCL through the second alignment contact hole CTD. The electrical connection relationship between the first and second alignment lines 210 and 220 and the circuit element layer CCL will be described later with reference to FIG. 10. Although it is illustrated in the drawing that the first alignment contact portion 210_C and the second alignment contact portion 220_C overlap the first bank 600, the positions of the first alignment contact portion 210_C and the second alignment contact portion 220_C are not limited thereto. At least one of the first alignment contact portion 210_C and the second alignment contact portion 220_C may not overlap the first bank 600.

The first alignment line 210 and the second alignment line 220 may be used in the process of aligning the plurality of light emitting elements ED during the manufacturing process of the display device 10. Specifically, in the process of aligning the plurality of light emitting elements ED during the manufacturing process of the display device 10, an electric field may be generated using the first alignment line 210 and the second alignment line 220, and the plurality of light emitting elements ED may be aligned such that specific ends thereof are aligned toward a specific alignment line in the emission area EMA by a dielectrophoretic force induced by the electric field generated between the first alignment line 210 and the second alignment line 220.

The plurality of light emitting elements ED may be arranged in the emission area EMA. The plurality of light emitting elements ED may not be disposed in the sub-region SA. The plurality of light emitting elements ED may be disposed in each of the first to third emission areas EMA1, EMA2, and EMA3. As described above, the first bank 600 may be formed to partition the first to third emission areas EMA1, EMA2, and EMA3 and distinguish the sub-region SA and the emission area EMA. Accordingly, the ink in which the plurality of light emitting elements ED are dispersed may be sprayed to each of the first to third emission areas EMA1, EMA2, and EMA3. Therefore, the plurality of light emitting elements ED may be disposed in the first to third emission areas EMA1, EMA2, and EMA3, and may not be disposed in the sub-region SA.

The plurality of light emitting elements ED may be disposed between the first alignment line 210 and the second alignment line 220 in the emission area EMA of each sub-pixel SPX. Each of the plurality of light emitting elements ED may have a shape extending in one direction, and the extension direction of each light emitting element ED may be substantially perpendicular to the extension direction of the first alignment line 210 and the second alignment line 220. However, the present disclosure is not limited thereto, and the light emitting element ED may be disposed to extend in a direction oblique to the extension direction of the first alignment line 210 and the second alignment line 220. The light emitting element ED may be aligned such that at least one of both ends is placed on the first alignment line 210 or the second alignment line 220.

The plurality of light emitting elements ED may be spaced from each other. The plurality of light emitting elements ED may be disposed to be spaced from each other in the second direction DR2 between the first alignment line 210 and the second alignment line 220. The plurality of light emitting elements ED may be aligned in one column between the first alignment line 210 and the second alignment line 220, and the distance between the light emitting elements ED adjacent in the second direction DR2 may be random.

The contact electrode 700 may be disposed across the emission area EMA and the sub-region SA. The contact electrode 700 may include a first contact pattern 710 and a second contact pattern 720 spaced from each other in the first direction DR1. As will be described later, the first contact pattern 710 may be the first contact electrode 710 that is partially in contact with one end of the light emitting element ED, and the second contact pattern 720 may be the second contact electrode 720 that is partially in contact with the other end of the light emitting element ED. Hereinafter, in the present specification, for simplicity of description, like reference numeral '710' may refer to 'first contact pattern 710' or 'first contact electrode 710', and like reference numeral '720' may refer to 'second contact pattern 720' or 'second contact electrode 720'.

The first contact pattern 710 may extend in the second direction DR2. The first contact pattern 710 may be disposed across the emission area EMA of the first pixel PX1, the emission area EMA of the second pixel PX2, and the sub-region SA positioned between the emission area EMA of the first pixel PX1 and the emission area EMA of the second pixel PX2. The first contact pattern 710 may extend in the second direction DR2 to be disposed across the first pixel PX1 and the second pixel PX2, and may not be disposed in the sub-region SA positioned on the lower side of the second pixel PX2 and/or on the upper side of the first pixel PX1. However, the present disclosure is not limited thereto.

In one or more embodiments, the first contact pattern 710 may include a first area 711, a second area 712, and a third area 713.

The first area 711 of the first contact pattern 710 may be disposed in the emission area EMA of the first pixel PX1. The first area 711 of the first contact pattern 710 may be disposed in each of the first to third emission areas EMA1, EMA2, and EMA3 that are the respective emission areas EMA of the first to third sub-pixels SPX1, SPX2, and SPX3 included in the first pixel PX1. The first area 711 of the first contact pattern 710 may overlap one end of the light emitting element ED disposed in each of the first to third emission areas EMA1, EMA2, and EMA3 of the first pixel PX1, and may be in contact with one end of the light emitting element ED. The first area 711 of the first contact pattern 710 may be the first contact electrode 711 of the first pixel PX1.

The second area 712 of the first contact pattern 710 may be spaced from the first area 711 of the first contact pattern 710. The second area 712 of the first contact pattern 710 may be disposed on the lower side of the first area 711 of the first contact pattern 710.

The second area 712 of the first contact pattern 710 may be disposed in the emission area EMA of the second pixel PX2. The second area 712 of the first contact pattern 710 may be disposed in each of the first to third emission areas EMA1, EMA2, and EMA3 that are the respective emission areas EMA of the first to third sub-pixels SPX1, SPX2, and SPX3 included in the second pixel PX2. The second area 712 of the first contact pattern 710 may overlap one end of the light emitting element ED disposed in each of the first to third emission areas EMA1, EMA2, and EMA3 of the first pixel PX1, and may be in contact with one end of the light emitting element ED. The second area 712 of the first contact pattern 710 may be the first contact electrode 712 of the second pixel PX2.

The third area 713 of the first contact pattern 710 may be disposed between the first area 711 of the first contact pattern 710 (or the first contact electrode 711 of the first pixel PX1) and the second area 712 of the first contact pattern 710 (or the first contact electrode 712 of the second pixel PX2). The third area 713 of the first contact pattern 710 may be disposed between the first area 711 of the first contact pattern 710 (or the first contact electrode 711 of the first pixel PX1) and the second area 712 of the first contact pattern 710 (or the first contact electrode 712 of the second pixel PX2) to connect them.

The third area 713 of the first contact pattern 710 may be disposed in the sub-region SA positioned between the emission area EMA of the first pixel PX1 and the emission area EMA of the second pixel PX2. That is, the third area 713 of the first contact pattern 710 may be disposed in the sub-region SA positioned on the lower side of the emission area EMA of the first pixel PX1 (or on the upper side of the emission area EMA of the second pixel PX2). The third area 713 of the first contact pattern 710 may be electrically connected to the circuit element layer CCL through a first electrode contact hole CT1. That is, the first contact pattern 710 may be electrically connected to the circuit element layer CCL through the first electrode contact hole CT1.

The first contact electrode 711 of the first pixel PX1 may extend upward from the third area 713 of the first contact pattern 710, and the first contact electrode 712 of the second pixel PX2 may extend downward from the third area 713 of the first contact pattern 710. The first contact electrode 711 of the first pixel PX1 and the first contact electrode 712 of the second pixel PX2 may be integrated to form a single pattern. Accordingly, the first contact electrode 711 of the first pixel PX1 and the first contact electrode 712 of the second pixel PX2 may be electrically connected to the circuit element layer CCL through one first electrode contact hole CT1, and the electrical signal of the circuit element layer CCL may be concurrently (e.g., simultaneously) transmitted to the first contact electrode 711 of the first pixel PX1 and the first contact electrode 712 of the second pixel PX2 through one first electrode contact hole CT1.

The second contact pattern 720 may extend in the second direction DR2. The second contact pattern 720 may be disposed in each of the first pixel PX1 and the second pixel PX2. The second contact pattern 720 disposed in the first pixel PX1 and the second contact pattern 720 disposed in the second pixel PX2 may be spaced from each other in the second direction DR2. Accordingly, the second contact pattern 720 disposed in the first pixel PX1 may be the second contact electrode 720 of the first pixel PX1, and the second contact pattern 720 disposed in the second pixel PX2 may be the second contact electrode 720 of the second pixel PX2. The second contact electrode 720 may be disposed across the emission area EMA and the sub-region SA. The second contact pattern 720 may be provided for each of the first to third sub-pixels SPX1, SPX2, and SPX3 in each pixel PX.

A second contact electrode 720A included in the first sub-pixel SPX1 may be disposed in the first emission area EMA1. In one or more embodiments, the second contact electrode 720A included in the first sub-pixel SPX1 may extend from the first emission area EMA1 to be disposed in the sub-region SA positioned on the upper side of the first emission area EMA1. The second contact electrode 720A included in the first sub-pixel SPX1 may extend upward from the first emission area EMA1 to be disposed in the sub-region SA positioned on the upper side of the first emission area EMA1, and may not be disposed in the sub-region SA positioned on the lower side of the first emission area EMA1. However, the present disclosure is not limited thereto.

The second contact electrode 720A included in the first sub-pixel SPX1 may overlap the other end of the light emitting element ED in the first emission area EMA1, and may be in contact with the other end of the light emitting element ED. The second contact electrode 720A included in the first sub-pixel SPX1 may be electrically connected to the circuit element layer CCL through a second electrode contact hole CT2 in the sub-region SA positioned on the upper side of the first emission area EMA1.

A second contact electrode 720B included in the second sub-pixel SPX2 may be disposed in the second emission area EMA2. In one or more embodiments, the second contact electrode 720B included in the second sub-pixel SPX2 may extend from the second emission area EMA2 to be disposed in the sub-region SA positioned on the lower side of the second emission area EMA2. The second contact electrode 720B included in the second sub-pixel SPX2 may extend downward from the second emission area EMA2 to be disposed in the sub-region SA positioned on the lower side of the second emission area EMA2, and may not be disposed in the sub-region SA positioned on the upper side of the second emission area EMA2. However, the present disclosure is not limited thereto.

The second contact electrode 720B included in the second sub-pixel SPX2 may overlap the other end of the light emitting element ED in the second emission area EMA2, and may be in contact with the other end of the light emitting element ED. The second contact electrode 720B included in the second sub-pixel SPX2 may be electrically connected to the circuit element layer CCL through the second electrode contact hole CT2 in the sub-region SA positioned on the lower side of the second emission area EMA2.

A second contact electrode 720C included in the third sub-pixel SPX3 may be disposed in the third emission area EMA3. In one or more embodiments, the arrangement of the second contact electrode 720C included in the third sub-pixel SPX3 may be substantially similar to that of the second contact electrode 720B included in the second sub-pixel SPX2. Accordingly, the second contact electrode 720C included in the third sub-pixel SPX3 may extend downward from the third emission area EMA3 to be disposed in the sub-region SA positioned on the lower side of the third emission area EMA3, and may be electrically connected to the circuit element layer CCL through the second electrode contact hole CT2 in the sub-region SA.

The first contact electrode 710 may be in contact with one end of the light emitting element ED in the emission area EMA, and may be electrically connected to the circuit element layer CCL through the first electrode contact hole CT1 in the sub-region SA. The first contact electrode 710 may be in contact with one end of the light emitting element ED and the circuit element layer CCL (specifically, the second horizontal voltage line VL2_X of the third conductive layer 140) to electrically connect one end of the light emitting element ED to the circuit element layer CCL. That is, the circuit element layer CCL and one end of the light emitting element ED may be electrically connected to each other via the first contact electrode 710.

The second contact electrode 720 may be in contact with the other end of the light emitting element ED in the emission area EMA, and may be electrically connected to the circuit element layer CCL through the second electrode contact hole CT2 in the sub-region SA. The second contact electrode 720 may be in contact with the other end of the light emitting element ED and the circuit element layer CCL (specifically, the contact conductive pattern CPD of the third conductive layer 140) to electrically connect the other end of the light emitting element ED to the circuit element layer CCL. That is, the circuit element layer CCL and the other end of the light emitting element ED may be electrically connected to each other via the second contact electrode 720.

In one or more embodiments, the display device 10 may have openings OP exposing the first alignment contact hole CTS, the second alignment contact hole CTD, the first electrode contact hole CT1, and the second electrode contact hole CT2. For example, the opening OP may include a first opening OP1 positioned between the emission area EMA of the first pixel PX1 and the emission area EMA of the second pixel PX2 and a second opening OP2 positioned on the lower side of the emission area EMA of the second pixel PX2 (or on the upper side of the emission area EMA of the first pixel PX1). The first opening OP1 and the second opening OP2 may be via holes formed through a via layer 165 (see FIG. 11) of the circuit element layer CCL to be described later. The opening OP may be an opening defined by the via layer 165 (see FIG. 13) of the circuit element layer CCL, as will be described later.

A first opening OP1_SP1 disposed in the first sub-pixel SPX1 may expose the first alignment contact hole CTS, the first electrode contact hole CT1, and the second electrode contact hole CT2 of the second pixel PX2, and first openings OP1_SP2 and OP1_SP3 respectively disposed in the second and third sub-pixels SPX2 and SPX3 may expose the first alignment contact hole CTS, the first electrode contact hole CT1, and the second electrode contact hole CT2 of the first pixel PX1.

The second opening OP2 may expose the second alignment contact hole CTD and the second electrode contact hole CT2 of the first pixel PX1, and may expose the second electrode contact hole CT2 of the second pixel PX2.

Figure 10:
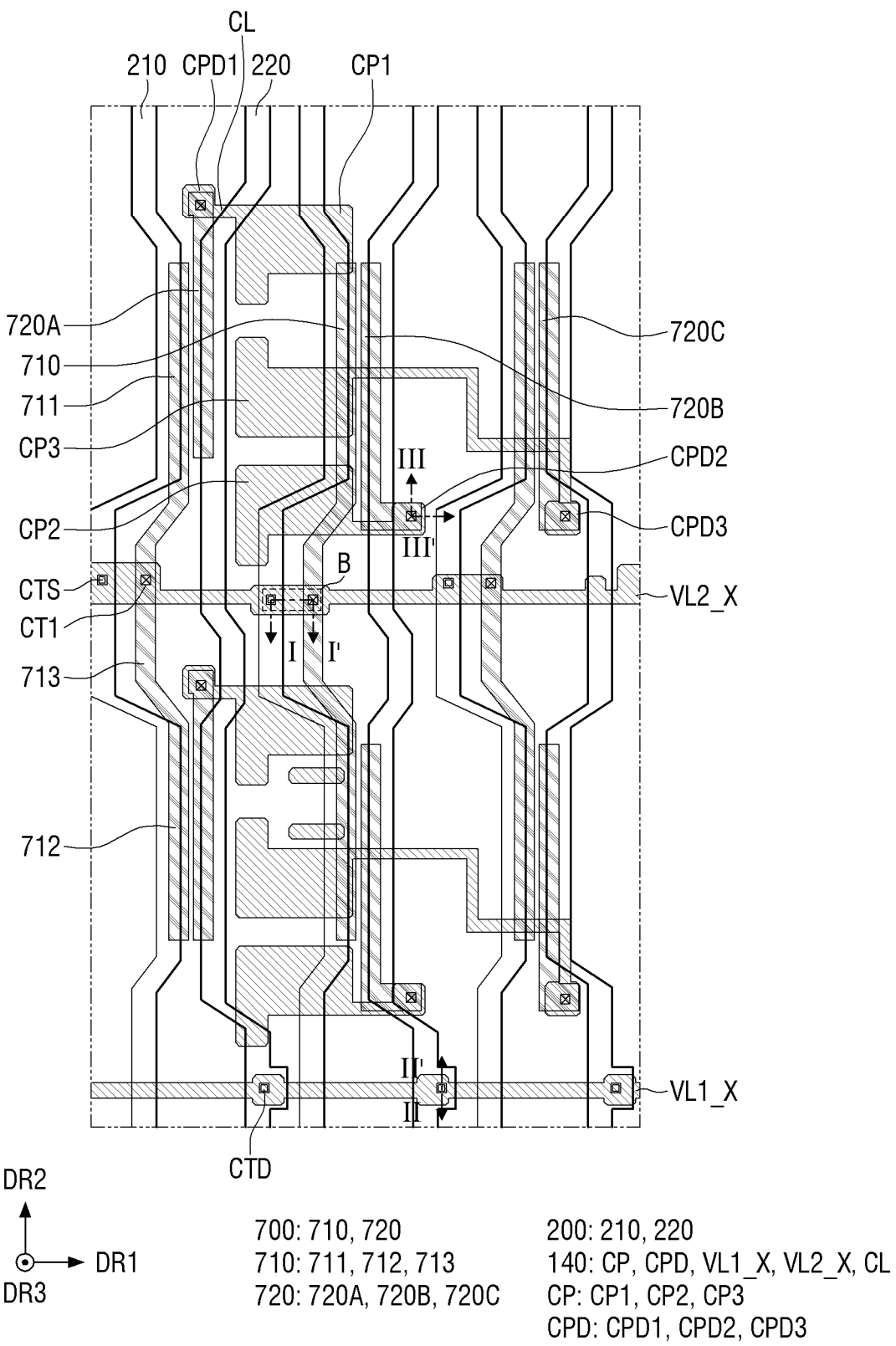
FIG. 10 is a relative planar layout view of the alignment line, the contact electrode, and the third conductive layer according to the embodiment of FIG. 9.

FIG. 10 is a relative planar layout view of the alignment line, the contact electrode, and the third conductive layer according to the embodiment of FIG. 9.

FIG. 10 illustrates the alignment line 200 and the contact electrode 700 of the light emitting element layer EML, the first horizontal voltage line VL1_X and the second horizontal voltage line VL2_X included in the third conductive layer 140 of the circuit element layer CCL, and the first to third contact conductive patterns CPD1, CPD2, and CPD3.

Referring to FIGS. 9 and 10, the alignment line 200 of the light emitting element layer EML may contain a conductive material having high reflectivity. For example, the alignment line 200 may contain, as a material having high reflectivity, a metal such as silver (Ag), copper (Cu), aluminum (Al), molybdenum (Mo), titanium (Ti), or the like, or an alloy containing aluminum (Al), nickel (Ni), lanthanum (La), and the like. However, the present disclosure is not limited thereto, and the alignment line 200 may further include a transparent conductive material. For example, the alignment line 200 may include a material such as ITO, IZO, and ITZO. In one or more embodiments, the alignment line 200 may have a structure in which at least one transparent conductive material and at least one metal layer having high reflectivity are stacked, or may be formed as one layer including them. In one or more embodiments, the alignment line 200 may contain aluminum (Al), but the present disclosure is not limited thereto.

The first alignment line 210 and the second alignment line 220 of the light emitting element layer EML may be electrically connected to the first voltage line VL1 and the second voltage line VL2 of the circuit element layer CCL, respectively. Specifically, the first alignment line 210 may be electrically connected to the second horizontal voltage line VL2_X of the third conductive layer 140 through the first alignment contact hole CTS, and the second alignment line 220. may be electrically connected to the first horizontal voltage line VL1_X of the third conductive layer 140 through the second alignment contact hole CTD. As will be described later, the first alignment line 210 may be in contact (e.g., direct contact) with the top surface of the second horizontal voltage line VL2_X exposed through the first alignment contact hole CTS to be electrically connected to the second voltage line VL2, and the second alignment line 220 may be in contact (e.g., direct contact) with the top surface of the first horizontal voltage line VL1_X exposed through the second alignment contact hole CTD to be electrically connected to the first voltage line VL1.

The first alignment lines 210 disposed in each of the first to third sub-pixels SPX1, SPX2, and SPX3 and extending in the second direction DR2 may cross the second horizontal voltage line VL2_X extending in the first direction DR1 on the lower side of the emission area EMA of the first pixel PX1. The first alignment lines 210 disposed in each of the first to third sub-pixels SPX1, SPX2, and SPX3 and the second horizontal voltage line VL2_X may be electrically connected to each other through the first alignment contact hole CTS in the crossing region.

The second alignment lines 220 disposed in each of the first to third sub-pixels SPX1, SPX2, and SPX3 and extending in the second direction DR2 may cross the first horizontal voltage line VL1_X extending in the first direction DR1 on the lower side of the emission area EMA of the second pixel PX2. The second alignment lines 220 disposed in each of the first to third sub-pixels SPX1, SPX2, and SPX3 and the first horizontal voltage line VL1_X may be electrically connected to each other through the second alignment contact hole CTD in the crossing region.

As described above, the first alignment line 210 and the second alignment line 220 may be used for generating an electric field such that specific ends of the light emitting elements ED face (e.g., oppose) a specific alignment line in the process of aligning the plurality of light emitting elements ED during the manufacturing process of the display device 10. The first alignment line 210 may be electrically connected to the second voltage line VL2 through the first alignment contact hole CTS, and the second alignment line 220 may be electrically connected to the first voltage line VL1 through the second alignment contact hole CTD. Accordingly, when a first alignment signal is applied to the first voltage line VL1, the first alignment signal may be transmitted to the second alignment line 220 through the second alignment contact hole CTD, and when a second alignment signal is applied to the second voltage line VL2, the second alignment signal may be transmitted to the first alignment line 210 through the first alignment contact hole CTS. In response to the first alignment signal and the second alignment signal, specific ends of the plurality of light emitting elements ED may be aligned to face (e.g., oppose) a specific alignment line in the emission area EMA of each sub-pixel SPX.

In the present embodiment, the first and second alignment lines 210 and 220 are formed across the sub-pixels SPX arranged in the same column, so that the alignment signal may be concurrently (e.g., simultaneously) transmitted to the sub-pixels SPX arranged in the same column even if the alignment signal is not applied for each sub-pixel SPX. Further, because the first voltage line VL1 and the second voltage line VL2 included in the circuit element layer CCL have a mesh structure in the entire display area DPA, the alignment signal may be concurrently (e.g., simultaneously) transmitted to the sub-pixels SPX arranged in the entire display area DPA even if the alignment signal is not applied for each sub-pixel SPX.

The contact electrode 700 may include a conductive material. For example, the contact electrode 700 may contain ITO, IZO, ITZO, or the like. For example, the contact electrode 700 may contain a transparent conductive material. In one or more embodiments, the contact electrode 700 may contain ITO, but the present disclosure is not limited thereto.

The first contact pattern 710 of the light emitting element layer EML may be electrically connected to the second voltage line VL2 of the circuit element layer CCL. Specifically, the first contact pattern 710 may be electrically connected to the second horizontal voltage line VL2_X of the third conductive layer 140 through the first electrode contact hole CT1. As will be described later, the first contact pattern 710 may be in contact (e.g., direct contact) with the top surface of the second horizontal voltage line VL2_X exposed through the first electrode contact hole CT1 to be electrically connected to the second voltage line VL2.

The first electrode contact hole CT1 may be disposed in the sub-region SA positioned between the emission area EMA of the first pixel PX1 and the emission area EMA of the second pixel PX2.

In one or more embodiments, the first electrode contact hole CT1 may not overlap the alignment line 200 in a plan view. Specifically, the first electrode contact hole CT1 may not overlap the first alignment line 210 in a plan view. Accordingly, the first contact pattern 710 may be in contact (e.g., direct contact) with the top surface of the second horizontal voltage line VL2_X without passing through the first alignment line 210 to be electrically connected to the second voltage line VL2. In one or more embodiments, the first electrode contact hole CT1 may be disposed adjacent to the first alignment contact hole CTS of the corresponding sub-pixel SPX. The first electrode contact hole CT1 and the first alignment contact hole CTS of the corresponding sub-pixel SPX may be disposed adjacent to each other and concurrently exposed (e.g., simultaneously exposed) through the same first opening OP1, so that it is possible to prevent a photoresist layer for forming the insulating layer of the light emitting element layer EML and/or the pattern of the contact electrode 700 from remaining between the first electrode contact hole CT1 and the first alignment contact hole CTS due to the via layer 165 and/or the stepped portion of the first bank 600 in the manufacturing process of the display device 10.

The first contact pattern 710 may be concurrently (e.g., simultaneously) in contact with one ends of the plurality of light emitting elements ED disposed in the emission area EMA of the first pixel PX1 and one ends of the plurality of light emitting elements disposed in the emission area EMA of the second pixel PX2. The first contact pattern 710 may serve to transmit the second power voltage transmitted through one second horizontal voltage line VL2_X to one end of the light emitting element ED disposed in each of the first pixel PX1 and the second pixel PX2. That is, the driving signal applied through the second voltage line VL2 may be concurrently (e.g., simultaneously) transmitted to the first pixel PX1 and the second pixel PX2 disposed in the same column through one first contact pattern 710.

The second contact pattern 720 of the light emitting element layer EML may be electrically connected to the transistor (or the capacitor) disposed on the circuit element layer CCL. Specifically, the second contact pattern 720 may be electrically connected to the contact conductive pattern CPD of the third conductive layer 140. The second contact pattern 720 disposed in each sub-pixel SPX may be electrically connected to the contact conductive pattern CPD connected to the transistor of each sub-pixel SPX.

Specifically, the second contact pattern 720A disposed in the first sub-pixel SPX1 may be electrically connected to the first contact conductive pattern CPD1 through the second electrode contact hole CT2. As will be described later, the second contact pattern 720A disposed in the first sub-pixel SPX1 may be in contact (e.g., direct contact) with the top surface of the first contact conductive pattern CPD1 exposed through the second electrode contact hole CT2 to be electrically connected to the source electrode (or capacitor second electrode) of the first transistor T1 of the first sub-pixel SPX1 disposed in the first sub-pixel circuit area SPA1 (see FIG. 8).

The second contact pattern 720B disposed in the second sub-pixel SPX2 may be electrically connected to the second contact conductive pattern CPD2 through the second electrode contact hole CT2. The second contact pattern 720B disposed in the second sub-pixel SPX2 may be in contact (e.g., direct contact) with the top surface of the second contact conductive pattern CPD2 exposed through the second electrode contact hole CT2 to be electrically connected to the source electrode (or capacitor second electrode) of the first transistor T1 of the second sub-pixel SPX2 disposed in the second sub-pixel circuit area SPA2 (see FIG. 8).

The second contact pattern 720C disposed in the third sub-pixel SPX3 may be electrically connected to the third contact conductive pattern CPD3 through the second electrode contact hole CT2. The second contact pattern 720C disposed in the third sub-pixel SPX3 may be in contact (e.g., direct contact) with the top surface of the third contact conductive pattern CPD3 exposed through the second electrode contact hole CT2 to be electrically connected to the source electrode (or capacitor second electrode) of the first transistor T1 of the third sub-pixel SPX3 disposed in the third sub-pixel circuit area SPA3 (see FIG. 8).

In one or more embodiments, the second contact electrode 720A of the first sub-pixel SPX1 may be electrically connected to the third conductive layer 140 in the sub-region SA disposed on the upper side of the first emission area EMA1, the second contact electrode 720B of the second sub-pixel SPX2 may be electrically connected to the third conductive layer 140 in the sub-region SA disposed on the lower side of the second emission area EMA2, and the second contact electrode 720C of the third sub-pixel SPX3 may be electrically connected to the third conductive layer 140 in the sub-region SA disposed on the lower side of the third emission area EMA3. That is, with respect to the emission area EMA of each sub-pixel SPX, the position of the sub-region SA in which the second contact electrode 720A of the first sub-pixel SPX1 is electrically connected to the third conductive layer 140 and the position of the sub-regions SA in which the second contact electrodes 720B and 720C of the second and third sub-pixels SPX2 and SPX3 are electrically connected to the third conductive layer 140 may be different.

The first contact conductive pattern CPD1 may be disposed in the sub-region SA disposed on the upper side of the first emission area EMA1, the second contact conductive pattern CPD2 may be disposed in the sub-region SA disposed on the lower side of the second light emission area EMA2, and the third contact conductive pattern CPD3 may be disposed in the sub-region SA disposed on the lower side of the third emission area EMA3. Because the first contact conductive pattern CPD1 may be disposed in the sub-region SA positioned on the upper side of the first emission area EMA1, and the second and third contact conductive patterns CPD2 and CPD3 may be disposed in the sub-regions SA positioned on the lower side of the second and third light emission areas EMA2 and EMA3, the second electrode contact hole CT2 of the first sub-pixel SPX1 may be disposed in the sub-region SA positioned on the upper side of the first emission area EMA1, and the second electrode contact holes CT2 of the second and third sub-pixels SPX2 and SPX3 may be disposed in the sub-regions SA positioned on the lower side of the second and third emission areas EMA2 and EMA3.

In one or more embodiments, the second electrode contact hole CT2 may not overlap the alignment line 200 in a plan view, similarly to the first electrode contact hole CT1. Specifically, the second electrode contact hole CT2 may not overlap the second alignment line 220 in a plan view. Accordingly, the second contact pattern 720 may be in contact (e.g., direct contact) with the top surface of the contact conductive pattern CPD of each sub-pixel SPX to be electrically connected to the contact conductive pattern CPD. The second contact pattern 720 may be in contact with other ends of the plurality of light emitting elements ED disposed in the emission area EMA of each pixel PX. The second contact pattern 720 may serve to connect the transistor of each sub-pixel SPX to the other end of the light emitting element ED.

Both ends of the light emitting element ED may be in contact with the first contact pattern 710 and the second contact pattern 720, and the first and second contact patterns 710 and 720 may be in contact with the second horizontal voltage line VL2_X included in the third conductive pattern 140 of the circuit element layer CCL and the contact conductive pattern CPD, respectively, so that an electrical signal may be applied and light of a specific wavelength band may be emitted.

The first contact pattern 710 and the second contact pattern 720 may be driving signal electrodes for transmitting a driving signal to the light emitting element ED in order to drive the light emitting element ED disposed in each sub-pixel SPX of the display device 10. For example, the first contact pattern 710 may be a cathode electrode and the second contact pattern 720 may be an anode electrode, but the present disclosure is not limited thereto, and vice versa.

In one or more embodiments, the first alignment contact hole CTS, the second alignment contact hole CTD, the first electrode contact hole CT1, and the second electrode contact hole CT2 may be spaced from each other in a plan view. That is, the contact hole (the alignment contact hole CTS or CTD) for contact (e.g., direct contact) between the alignment line 200 and the third conductive layer 140 and the contact hole (the electrode contact hole CT1 or CT2) for contact (e.g., direct contact) between the contact electrode 700 and the third conductive layer 140 may be different.

Further, the first and second electrode contact holes CT1 and CT2 may not overlap the alignment line 200 in a plan view. That is, the electrode contact holes CT1 and CT2 electrically connecting the contact electrode 700 of the light emitting element layer EML and the third conductive layer 140 of the circuit element layer CCL may be formed so as not to overlap the alignment line 200 in a plan view, so that the contact electrode 700 may be in contact (e.g., direct contact) with the third conductive layer 140 of the circuit element layer CCL through the electrode contact holes CT1 and CT2 without passing through the alignment line 200 and electrically connected to the circuit element layer CCL. Accordingly, the alignment line 200 and the contact electrode 700 may be physically separated from each other, and may not be in contact (e.g., direct contact) with each other. In one or more embodiments in which the alignment line 200 contains aluminum (Al) and the contact electrode 700 contains ITO, when the alignment line 200 and the contact electrode 700 are in contact (e.g., direct contact), an oxide layer may be formed, and contact resistance may be increased by the oxide layer. In one or more embodiments, the contact (e.g., direct contact) between the alignment line 200 and the contact electrode 700 is prevented and the contact electrode 700 is connected to the third conductive layer 140 of the circuit element layer CCL by allowing contact (e.g., direct contact) therebetween, so that it is possible to prevent an increase in contact resistance that may be caused by the contact between the alignment line 200 and the contact electrode 700.

Further, the second contact electrode 720 electrically connecting the light emitting element ED and the transistor during the driving of the display device 10 and the second alignment line 220 electrically connected to the first horizontal voltage line VL1_X to generate an electric field in the alignment process during the manufacturing process of the display device 10 may be physically separated from each other. Accordingly, in the manufacturing process of the display device 10, the alignment line separation process for separating the second alignment line 220 extending in the same column for each sub-pixel SPX may be omitted. Therefore, because the separation process is omitted, the number of masks used in the manufacturing process of the display device 10 may be reduced and the manufacturing process of the display device may be simplified, the manufacturing process efficiency of the display device 10 may be improved. Further, because the region for separating the alignment line is omitted in the sub-region, the length of the sub-region may be reduced. Accordingly, the emission area may be increased compared to the same planar area. Accordingly, the area of the emission area EMA may be increased, and the margin of the ink process in the inkjet printing process of the light emitting element ED may be secured.

In one or more embodiments, the first and second electrode contact holes CT1 and CT2 may not overlap the first bank 600 in a plan view. Because the first and second electrode contact holes CT1 and CT2 are exposed by the first bank 600, the contact electrode 700 disposed on the first bank 600 may be in contact with the third conductive layer 140 of the circuit element layer CCL.

Figure 11:
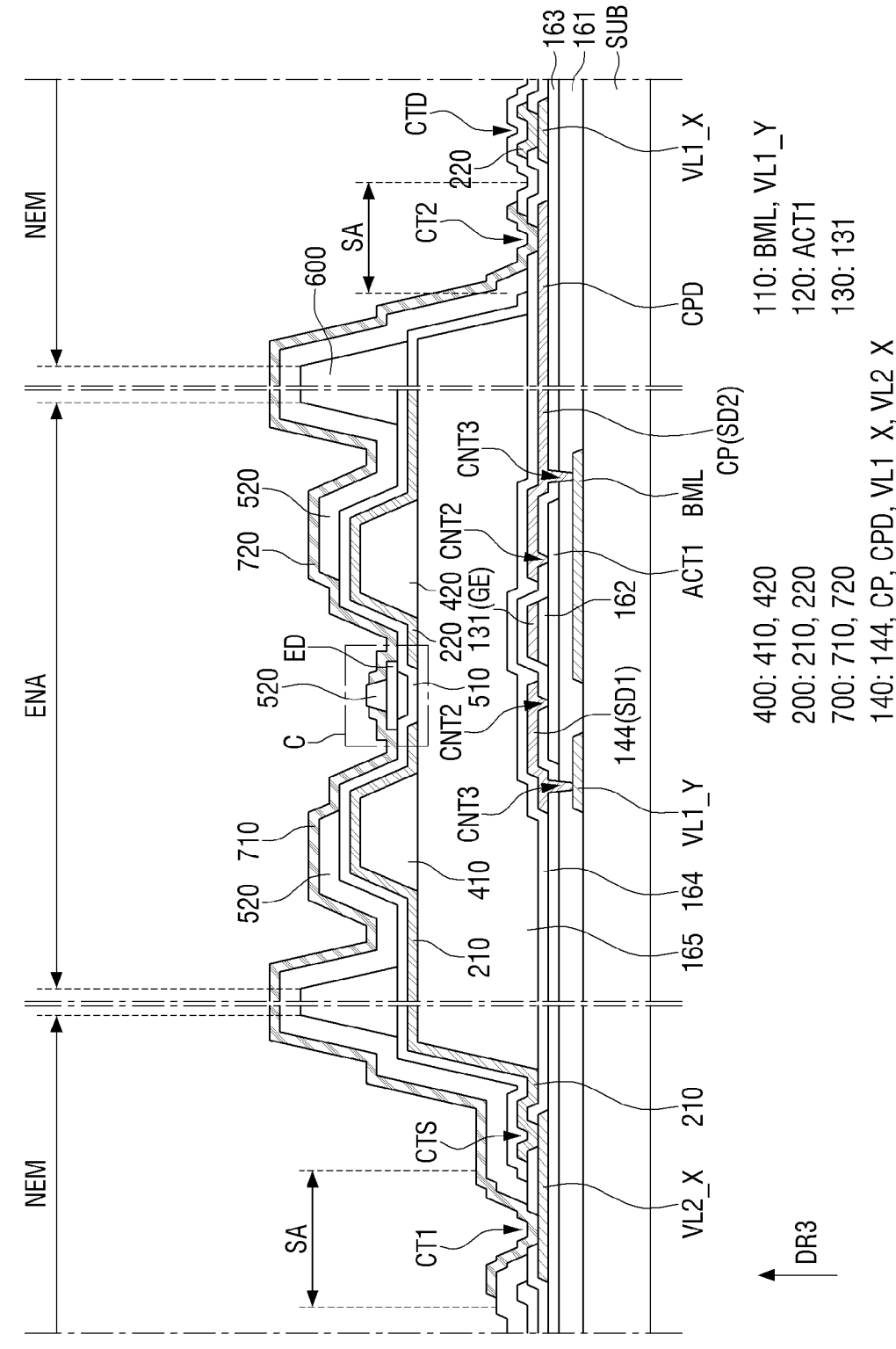
FIG. 11 is a cross-sectional view illustrating an example of the display device according to the embodiment of FIGS. 9 and 10.

FIG. 11 is a cross-sectional view illustrating an example of the display device according to the embodiment of FIGS. 9 and 10.

Referring to FIG. 11, the first conductive layer 110 may be disposed on the substrate SUB. As described above, the light blocking pattern BML and the first vertical voltage line VL1_Y may be formed of the first conductive layer 110. However, the present disclosure is not limited thereto, and the data line DL, the initialization voltage line VIL, the second vertical voltage line VL2_Y or the vertical scan line SL_Y that are described above may also be formed of the first conductive layer 110.

The first vertical voltage line VL1_Y may overlap at least a part of a drain electrode SD1 of the transistor to be described later in the thickness direction of the substrate SUB (e.g., the third direction DR3). The drain electrode SD1 of the transistor may be a part of the fourth connection pattern 144 of the above-described third conductive layer 140. The first vertical voltage line VL1_Y may be electrically connected to the drain electrode SD1 of the transistor through the third contact hole CNT3. The high potential voltage (or the first power voltage) supplied to the transistor may be applied to the first vertical voltage line VL1_Y.

The light blocking pattern BML may be disposed under the semiconductor pattern ACT1 to cover at least the channel region of the first semiconductor pattern ACT1 of the transistor. The light blocking pattern BML may be a light blocking layer serving to protect the first semiconductor pattern ACT1 of the transistor from external light. However, the present disclosure is not limited thereto, and the light blocking pattern BML may be omitted.

In one or more embodiments, the first conductive layer 110 may contain a material that blocks light. For example, the first conductive layer 110 may be made of an opaque metal material that blocks transmission of light. In some other embodiments, the first conductive layer 110 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto. In one or more embodiments, the first conductive layer 110 may be formed of a Ti/Cu double layer in which a titanium layer and a copper layer are stacked, but the present disclosure is not limited thereto.

A buffer layer 161 may be disposed on the first conductive layer 110. The buffer layer 161 may be disposed to cover the entire surface of the substrate SUB on which the first conductive layer 110 is disposed. The buffer layer 161 may constitute the third contact hole CNT3 exposing a part of the first conductive layer 110 together with an interlayer insulating layer 163.

The buffer layer 161 may serve to protect a plurality of transistors from moisture permeating through the substrate SUB that is susceptible to moisture permeation. The buffer layer 161 may contain an inorganic insulating material such as silicon oxide (SiOx), silicon nitride (SiNx), silicon oxynitride (SiOxNy), or the like.

The semiconductor layer 120 is disposed on the buffer layer 161. The semiconductor layer 120 may include the first semiconductor pattern ACT1 of the transistor. The first semiconductor pattern ACT1 of the transistor may be disposed to overlap the light blocking pattern BML in the third direction DR3, as described above.

The semiconductor layer 120 may include polycrystalline silicon, monocrystalline silicon, an oxide semiconductor, or the like. In one or more embodiments, when the semiconductor layer 120 contains polycrystalline silicon, the polycrystalline silicon may be formed by crystallizing amorphous silicon. When the semiconductor layer 120 contains polycrystalline silicon, the semiconductor pattern ACT of the transistor may include a plurality of doped regions doped with impurities and the channel region therebetween. In one or more embodiments, the semiconductor layer 120 may contain an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like.

A gate insulating layer 162 may be disposed on the semiconductor pattern ACT of the semiconductor layer 120. The gate insulating layer 162 may be formed in the same pattern as the second conductive layer 130 to be described later. The sidewall of the gate insulating layer 162 may be substantially aligned with the sidewall of the second conductive layer 130, but the present disclosure is not limited thereto. The gate insulating layer 162 may be formed as a multilayer in which inorganic layers including an inorganic material, for example, at least one of silicon oxide (SiOx), silicon nitride (SiNx) or silicon oxynitride (SiOxNy) are alternately stacked.

The second conductive layer 130 may be disposed on the gate insulating layer 162. The second conductive layer 130 may include a gate electrode GE of the transistor. The gate electrode GE may be disposed to overlap the channel region of the first semiconductor pattern ACT in the third direction DR3 that is the thickness direction of the substrate SUB. The gate electrode GE of the transistor may be a part of the first gate pattern 131 of the above-described second conductive layer 130. In addition, the second gate pattern 132, the auxiliary scan line BSL, and the like described above may be formed of the second conductive layer 130.

The interlayer insulating layer 163 may be disposed on the second conductive layer 130, the semiconductor pattern ACT of the semiconductor layer 120, and the buffer layer 161. The interlayer insulating layer 163 may be disposed to cover the second conductive layer 130. The interlayer insulating layer 163 may function as an insulating layer between the second conductive layer 130 and other layers disposed thereon and may protect the second conductive layer 130.

The third conductive layer 140 may be disposed on the interlayer insulating layer 163. The first horizontal voltage line VL1_X, the second horizontal voltage line VL2_X, the contact conductive pattern CPD, the first conductive pattern CP, and the fourth connection pattern 144 may be formed of the third conductive layer 140. However, the present disclosure is not limited thereto, and the first to third connection patterns 141, 142, and 143 and the fifth connection pattern 145 that are described above may be formed of the third conductive layer 140.

A part of the fourth connection pattern 144 may be the drain electrode SD1 of the transistor, and a part of the first conductive pattern CP may be a source electrode SD2 of the transistor. The drain electrode SD1 of the transistor and the source electrode SD2 of the transistor may be electrically connected to both ends of the first semiconductor pattern ACT1 of the transistor through the second contact hole CNT2 penetrating the interlayer insulating layer 163. Further, the source electrode SD2 of the transistor TR may be electrically connected to the light blocking pattern BML of the first conductive layer 110 through the third contact hole CNT3 penetrating the first interlayer insulating layer 163 and the buffer layer 161. Further, the drain electrode SD1 of the transistor TR may be electrically connected to the first vertical voltage line VL1_Y of the first conductive layer 110 through the third contact hole CNT3 penetrating the first interlayer insulating layer 163 and the buffer layer 161.

The first horizontal voltage line VL1_X may be electrically connected to the second alignment line 220 through a second alignment contact hole CTD penetrating a passivation layer 164 to be described later. The second alignment contact hole CTD may be formed by the sidewall of the passivation layer 164. In one or more embodiments, the first horizontal voltage line VL1_X may be electrically connected to the first vertical voltage line VL1_Y through the first contact hole CNT1 penetrating the interlayer insulating layer 163 and the buffer layer 161. Accordingly, the first horizontal voltage line VL1_X may be used as the signal line for transmitting the alignment signal to the second alignment line 220 used in the alignment process of the light emitting element ED during the manufacturing process of the display device 10. The first horizontal voltage line VL1_X may be the driving signal line that applies the high potential voltage when the display device 10 is driven to allow the light emitting element ED to emit light.

A part of the second horizontal voltage line VL2_X may be electrically connected to the first alignment line 210 through the second alignment contact hole CTS penetrating the passivation layer 164 to be described later. The second alignment contact hole CTS may be formed by the sidewall of the passivation layer 164. In one or more embodiments, the second horizontal voltage line VL2_X may be electrically connected to the second vertical voltage line VL2_Y through the first contact hole CNT1 penetrating the interlayer insulating layer 163 and the buffer layer 161. Accordingly, the second horizontal voltage line VL2_X may be used as the signal line for transmitting the alignment signal to the first alignment line 210 used in the alignment process of the light emitting element ED during the manufacturing process of the display device 10.

Another part of the second horizontal voltage line VL2_X may be electrically connected to the first contact electrode 710 through the first electrode contact hole CT1 penetrating the passivation layer 164 to be described later, the first insulating layer 510, and the second insulating layer 520. The first electrode contact hole CT1 may be formed by the sidewalls of the passivation layer 164, the first insulating layer 510, and the second insulating layer 520.

The low potential voltage lower than the high potential voltage supplied to the first voltage line VL1 may be applied to the second horizontal voltage line VL2_X. That is, the high potential voltage supplied to the transistor may be applied to the first voltage line VL1, and the low potential voltage lower than the high potential voltage supplied to the first voltage line VL1 may be applied to the second voltage line VL2 (specifically, the second horizontal voltage line VL2_X).

The contact conductive pattern CPD may be integrated with the first conductive pattern CP to form a single pattern. Accordingly, the contact conductive pattern CPD may be electrically connected to the transistor. Specifically, the contact conductive pattern CPD may be electrically connected to the source electrode SD2 of the transistor. The contact conductive pattern CPD may be disposed in the sub-region SA. The contact conductive pattern CPD may be electrically connected to the second contact electrode 720 through the second electrode contact hole CT2 penetrating the passivation layer 164 to be described later, the first insulating layer 510, and the second insulating layer 520. The second electrode contact hole CT2 may be formed by the sidewalls of the passivation layer 164, the first insulating layer 510, and the second insulating layer 520.

The passivation layer 164 may be disposed on the third conductive layer 140 and the interlayer insulating layer 163. The passivation layer 164 may include the first alignment contact hole CTS and the second alignment contact hole CTD penetrating the passivation layer 164. Further, the passivation layer 164 may further include holes penetrating the passivation layer 164 and constituting the first electrode contact hole CT1 and the second electrode contact hole CT2. That is, the passivation layer 164 may be formed to expose a part of the second horizontal voltage line VL2_X, a part of the contact conductive pattern CPD, and a part of the first horizontal voltage line VL1_X. The passivation layer 164 may serve to protect the third conductive layer 140.

The buffer layer 161, the gate insulating layer 162, the interlayer insulating layer 163, and the passivation layer 164 described above may be formed as a double layer formed by stacking, or a multilayer formed by alternately stacking, inorganic layers including at least one of silicon oxide (SiOx), silicon nitride (SiNx), or silicon oxynitride (SiOxNy). However, the present disclosure is not limited thereto, and the buffer layer 161, the gate insulating layer 162, the interlayer insulating layer 163, and the passivation layer 164 may be formed as a single inorganic layer containing the above-described insulating material.

The via layer 165 may be disposed on the passivation layer 164. The via layer 165 may include an organic insulating material, for example, an organic material such as polyimide (PI). The via layer 165 may function to flatten a surface. Accordingly, the top surface (or the surface) of the via layer 165, on which the light emitting element layer to be described later is disposed, may be substantially flat regardless of a shape or presence of a pattern disposed thereunder.

The via layer 165 may not overlap the first alignment contact hole CTS, the second alignment contact hole CTD, the first electrode contact hole CT1, and the second electrode contact hole CT2 in the third direction DR3. Accordingly, the via layer 165 may expose the first alignment contact hole CTS, the second alignment contact hole CTD, the first electrode contact hole CT1, and the second electrode contact hole CT2 in the third direction DR3.

The display device 10 may further include a second bank 400. The second bank 400 may be disposed on the via layer 165 in the emission area EMA. The second bank 400 may be directly disposed on one surface of the via layer 165. The second bank 400 may have a structure in which at least a part of the first bank 400 protrudes upward (e.g., one side in the third direction DR3) with respect to one surface of the via layer 165. The protruding part of the second bank 400 may have an inclined side surface. The second bank 400 may serve to change the traveling direction of the light emitted from the light emitting element ED toward the inclined side surface of the second bank 400 to an upward direction (e.g., a display direction).

The second bank 400 may include a first sub-bank 410 and a second sub-bank 420 that are spaced from each other. The first sub-bank 410 and the second sub-bank 420, which are spaced from each other, may provide a space in which the light emitting element ED is disposed, while assisting the function of a reflective partition wall that changes the traveling direction of the light emitted from the light emitting element ED to the display direction.

Although it is illustrated in the drawing that the side surface of the second bank 400 is inclined in a linear shape, the present disclosure is not limited thereto. For example, the side surface (or outer surface) of the second bank 400 may have a round shape, a semicircular shape, or a semielliptical shape. In one or more embodiments, the second bank 400 may include an organic insulating material such as polyimide (PI), but is not limited thereto.

The alignment line 200 may be disposed on the via layer 165 on which the second bank 400 is formed. The alignment line 200 may extend from the emission area EMA to be disposed in the non-emission area NEM.

The alignment line 200 may be disposed on the second bank 400 and one surface of the via layer 165 exposed by the second bank 400 in the emission area EMA. In the emission area EMA, the first alignment line 210 may be disposed on the first sub-bank 410, and the second alignment line 220 may be disposed on the second sub-bank 420.

The first alignment line 210 may extend outward from the first sub-bank 410 to be disposed on one surface of the via layer 165 exposed by the first sub-bank 410. Similarly, the second alignment line 220 may extend outward from the second sub-bank 420 to be disposed on one surface of the via layer 165 exposed by the second sub-bank 420. The first alignment line 210 and the second alignment line 220 may be spaced from each other and oppose each other in a separation region between the first sub-bank 410 and the second sub-bank 420. The via layer 165 may be exposed in the region where the first alignment line 210 and the second alignment line 220 are spaced from each other and face each other.

The alignment line 200 may be disposed on the passivation layer 164 exposed by the via layer 165 in the non-emission area NEM. The alignment line 200 may be in contact (e.g., direct contact) with and electrically connected to a part of the third conductive layer 140 exposed by the passivation layer 164 in the non-emission area NEM.

Specifically, the first alignment line 210 may be electrically connected to the second horizontal voltage line VL2_X through the first alignment contact hole CTS penetrating the passivation layer 164 and exposing a part of the second horizontal voltage line VL2_X. The first alignment line 210 may be in contact (e.g., direct contact) with the top surface of the second horizontal voltage line VL2_X exposed by the first alignment contact hole CTS.

The second alignment line 220 may be electrically connected to the first horizontal voltage line VL1_X through the second alignment contact hole CTD penetrating the passivation layer 164 and exposing the first horizontal voltage line VL1_X. The second alignment line 220 may be in contact (e.g., direct contact) with the top surface of the first horizontal voltage line VL1_X exposed by the second alignment contact hole CTD.

The first alignment line 210 and the second alignment line 220 may be used as the alignment signal lines for generating an electric field for aligning the light emitting element ED during the manufacturing process of the display device 10. When the display device 10 is driven, the first alignment line 210 may be in physical contact with the second voltage line VL2, and the second alignment line 220 may be in physical contact with the first voltage line VL1, so that the contact resistance of the first and second voltage lines VL1 and VL2 to which the power voltage is applied may be reduced.

As described above, the alignment line 200 may contain a conductive material having high reflectivity. Because the alignment line 200 contains a conductive material having high reflectivity, light emitted from the light emitting element ED and traveling to the side surface of the second bank 400 may be reflected in the upward direction of each pixel PX. In one or more embodiments, the alignment line 200 may contain aluminum (Al), but the present disclosure is not limited thereto.

The first insulating layer 510 may be disposed on the via layer 165 on which the alignment line 200 is formed. The first insulating layer 510 may completely cover the alignment line 200. The first insulating layer 510 may protect the alignment line 200 while insulating the first alignment line 210 and the second alignment line 220 from each other. The first insulating layer 510 may completely cover the alignment line 200 in the entire display area DPA. Accordingly, the contact between the alignment line 200 and the contact electrode 700 may be prevented.

The first insulating layer 510 may have a hole to expose a part of the contact conductive pattern CPD and a part of the second horizontal voltage line VL2_X. The first insulating layer 510 may include holes respectively corresponding to the first and second electrode contact holes CT1 and CT2 in the sub-region SA.

The first insulating layer 510 may include an inorganic insulating material. For example, the first insulating layer 510 may include at least one of inorganic insulating materials such as silicon oxide (SiOx), silicon nitride (SiNx), silicon oxynitride (SiOxNy), aluminum oxide (AIxOy), and aluminum nitride (AlN).

The first bank 600 may be disposed on the first insulating layer 510. The first bank 600 may be formed to have a height greater than that of the second bank 400, so that the ink in which the plurality of light emitting elements ED are dispersed may be sprayed into the emission area EMA without being mixed to the adjacent pixel PX or the adjacent sub-pixel SPX in the inkjet printing process for aligning the light emitting element ED during the manufacturing process of the display device 10.

The light emitting element ED may be arranged in the emission area EMA. The light emitting elements ED may not be disposed in the sub-region SA. The light emitting element ED may be disposed on the first insulating layer 510 between the first sub-bank 410 and the second sub-bank 420. The light emitting elements ED may be disposed between the first alignment line 210 and the second alignment line 220 on the first insulating layer 510.

The light emitting element ED may have a shape extending in one direction, and the light emitting element ED may be disposed such that at least one of both ends is placed on (or overlaps) the first alignment line 210 or the second alignment line 220. For example, the light emitting elements ED may be disposed such that one end thereof is placed on the first alignment line 210 and the other end thereof is placed on the second alignment line 220.

The second insulating layer 520 may be disposed on the light emitting element ED. The second insulating layer 520 may include an opening exposing both ends of the light emitting element ED in the emission area EMA and a hole exposing a part of the third conductive layer 140 in the sub-region SA.

Specifically, in the emission area EMA, the second insulating layer 520 may be partially disposed on the light emitting element ED to expose both ends of the light emitting element ED. The second insulating layer 520 may be disposed to partially cover the outer surface of the light emitting element ED without covering one end and the other end of the light emitting element ED.

A portion of the second insulating layer 520 disposed on the light emitting element ED may extend in the second direction DR2 on the first insulating layer 510 in a plan view, thereby forming a linear or island pattern in each sub-pixel SPX. The second insulating layer 520 may protect the light emitting element ED while fixing the light emitting element ED during the manufacturing process of the display device 10. In addition, the second insulating layer 520 may be disposed to fill a space between the light emitting element ED and the first insulating layer 510 disposed therebelow.

In the sub-region SA, the second insulating layer 520 may have holes to expose a part of the contact conductive pattern CPD and a part of the second horizontal voltage line VL2_X. The second insulating layer 520 may include holes respectively corresponding to the first and second electrode contact holes CT1 and CT2 in the sub-region SA. The second insulating layer 520 may form the first and second electrode contact holes CT1 and CT2 together with the passivation layer 164. The second insulating layer 520 may also be disposed on the portions of the first insulating layer 510 on the first alignment line 210 and the second alignment line 220.

The second insulating layer 520 may include an inorganic insulating material. For example, the second insulating layer 520 may include at least one of inorganic insulating materials such as silicon oxide (SiOx), silicon nitride (SiNx), silicon oxynitride (SiOxNy), aluminum oxide (AIxOy), and aluminum nitride (AlN). However, the present disclosure is not limited thereto, and the second insulating layer 520 may contain an organic insulating material.

The contact electrode 700 may be disposed on the second insulating layer 520. The first contact electrode 710 and the second contact electrode 720 may be spaced from each other with the second insulating layer 520 interposed therebetween.

The first contact electrode 710 may be in contact with one end of the light emitting element ED exposed by the second insulating layer 520 in the emission area EMA. The first contact electrode 710 may be in contact with the second horizontal voltage line VL2_X exposed by the first electrode contact hole CT1 penetrating the second insulating layer 520, the first insulating layer 510, and the passivation layer 164 in the sub-region SA. That is, the first contact electrode 710 may be in contact (e.g., direct contact) with the second horizontal voltage line VL2_X of the third conductive layer 140 and one end of the light emitting element ED, and serve to electrically connect the second voltage line VL2 to one end of the light emitting element ED.

The second contact electrode 720 may be in contact with the other end of the light emitting element ED exposed by the second insulating layer 520 in the emission area EMA. The second contact electrode 720 may be in contact with the contact conductive pattern CPD exposed by the second electrode contact hole CT2 penetrating the second insulating layer 520, the first insulating layer 510, and the passivation layer 164 in the sub-region SA. That is, the second contact electrode 720 may be in contact (e.g., direct contact) with the contact conductive pattern CPD of the third conductive layer 140 and the other end of the light emitting element ED, and serve to electrically connect the transistor to the other end of the light emitting element ED.

The first contact electrode 710 and the second contact electrode 720 may include the same material and may be formed of the same layer. The first contact electrode 710 and the second contact electrode 720 may be concurrently (e.g., simultaneously) formed through the same step. As described above, the contact electrode 700 may contain a transparent conductive material. In one or more embodiments, each of the first contact electrode 710 and the second contact electrode 720 may contain ITO, but the present disclosure is not limited thereto.

Because the alignment line 200 may contain aluminum (Al) having high reflectivity, and the first contact electrode 710 and the second contact electrode 720 may contain a transparent conductive material, the light emitted from the light emitting element ED may travel toward the first alignment line 210 and the second alignment line 220 while transmitting the first contact electrode 710 and the second contact electrode 720, and may be reflected from the surfaces of the first alignment line 210 and the second alignment line 220.

Figure 12:
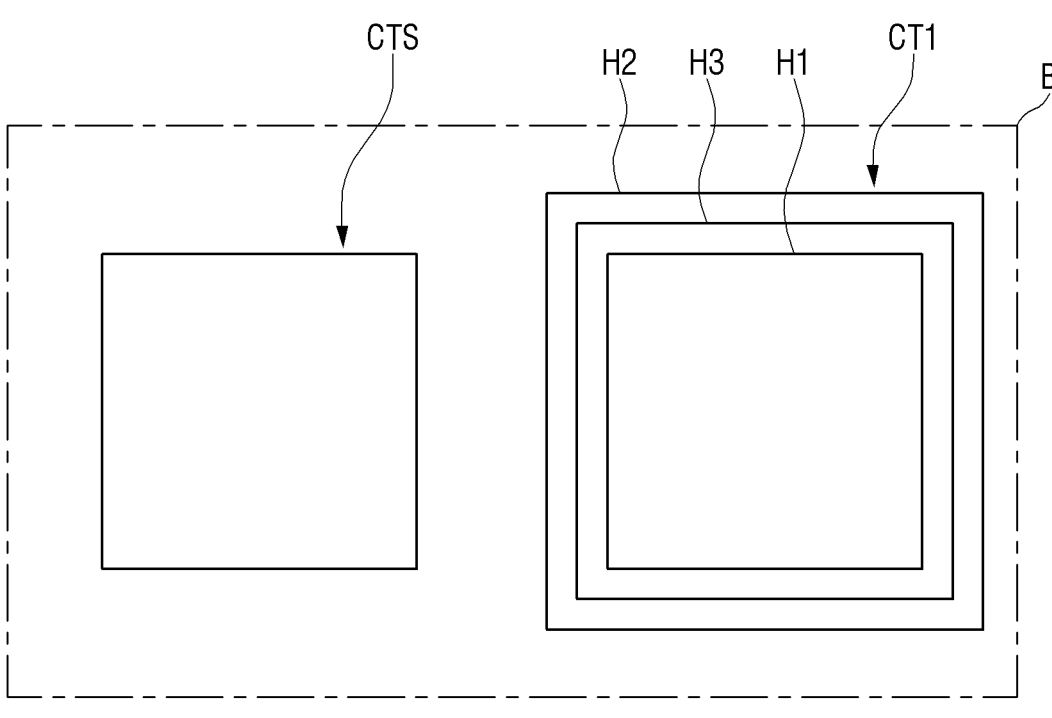
FIG. 12 is a planar arrangement view schematically illustrating the first alignment contact hole disposed in an area B of FIGS. 9 and 10 and a plurality of holes disposed in the peripheral area of the first electrode contact hole.
Figure 12:
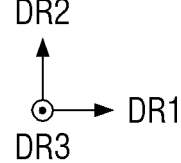
Figure 13:
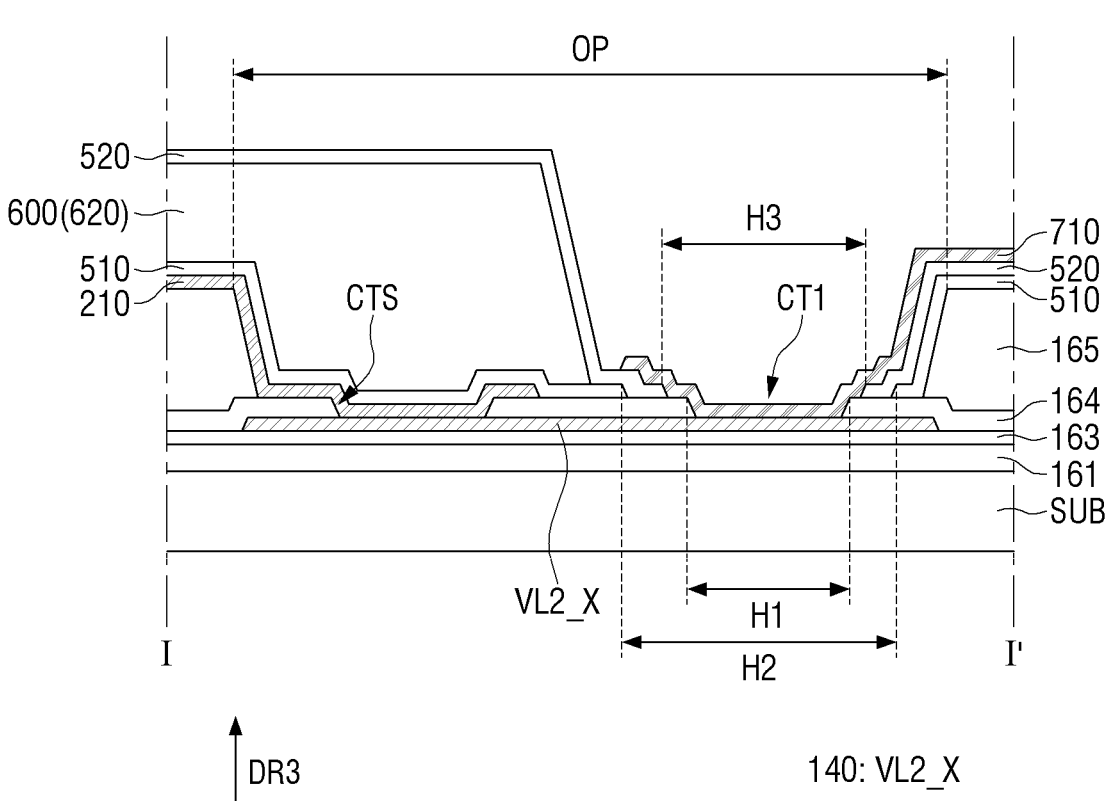
FIG. 13 is a cross-sectional view illustrating an example taken along the line I-I' of FIGS. 9 and 10.
Figure 14:
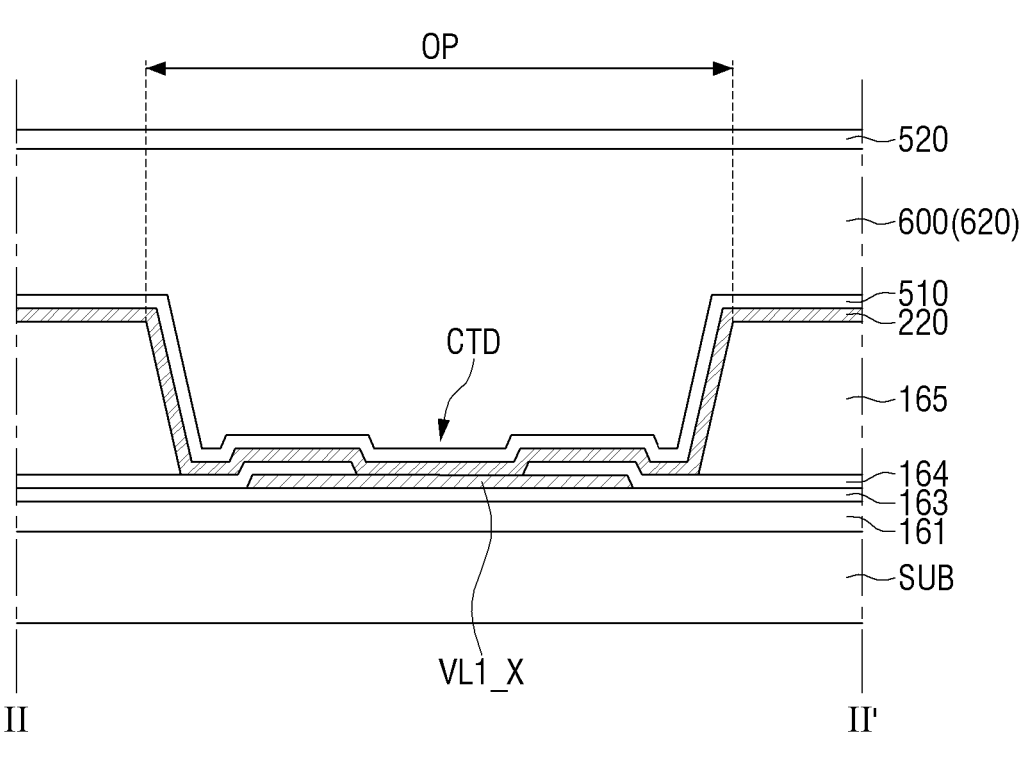
FIG. 14 is a cross-sectional view illustrating an example taken along the line II-II' of FIGS. 9 and 10.
Figure 14:
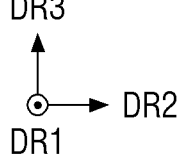
Figure 15:
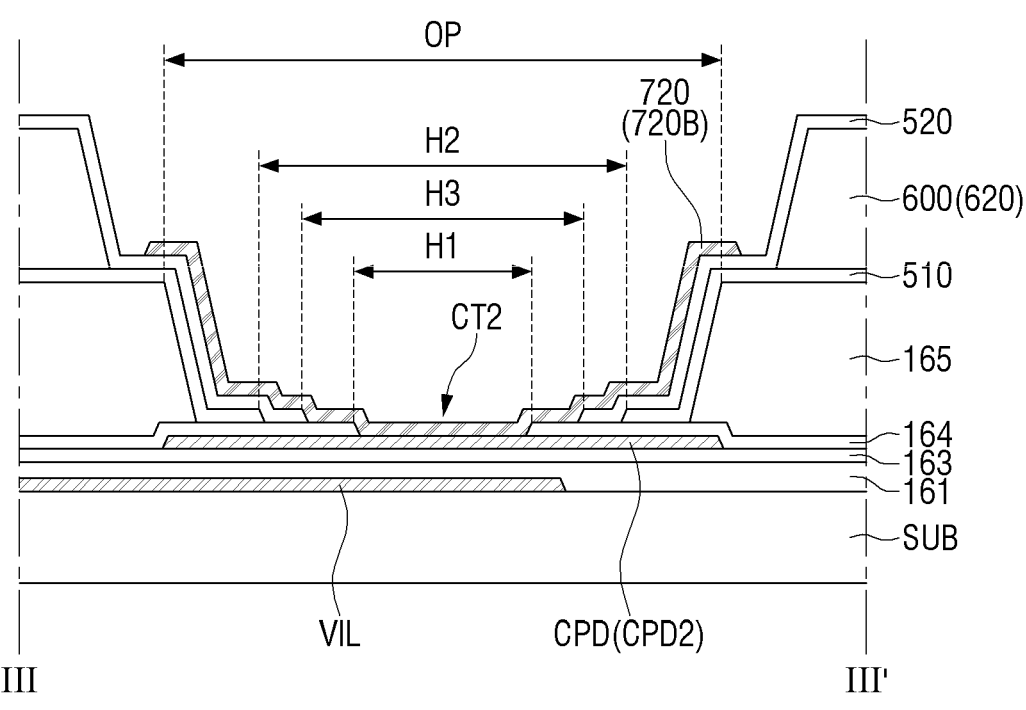
FIG. 15 is a cross-sectional view illustrating an example taken along the line III-III' of FIGS. 9 and 10.

FIG. 12 is a planar arrangement view schematically illustrating the first alignment contact hole disposed in an area B of FIGS. 9 and 10 and a plurality of holes disposed in the peripheral area of the first electrode contact hole. FIG. 13 is a cross-sectional view illustrating an example taken along the line I-I' of FIGS. 9 and 10. FIG. 14 is a cross-sectional view illustrating an example taken along the line II-II' of FIGS. 9 and 10. FIG. 15 is a cross-sectional view illustrating an example taken along the line III-III' of FIGS. 9 and 10.

Hereinafter, FIGS. 12 and 13 show the peripheral areas of the first alignment contact hole CTS and the first electrode contact hole CT1, FIG. 14 shows the peripheral area of the second alignment contact hole CTD, and FIG. 15 shows the peripheral area of the second electrode contact hole CT2.

Referring to FIGS. 12 to 15, the first and second alignment contact holes CTS and CTD may penetrate the passivation layer 164, and may be formed by the sidewall of the passivation layer 164. The first alignment line 210 may be in contact with the top surface of the second horizontal voltage line VL2_X exposed by the first alignment contact hole CTS penetrating the passivation layer 164, and the second alignment line 220 may be in contact with the top surface of the first horizontal voltage line VL1_X exposed by the second alignment contact hole CTD penetrating the passivation layer 164.

As shown in FIG. 12, the first electrode contact hole CT1 may overlap a first hole H1 penetrating the passivation layer 164, a second hole H2 penetrating the first insulating layer 510, and a third hole H3 penetrating the second insulating layer 520. As shown in FIGS. 13 and 15, the first hole H1, the second hole H2, and the third hole H3 may overlap each other, and may constitute the first electrode contact hole CT1 or the second electrode contact hole CT2.

The passivation layer 164 may include the first alignment contact hole CTS exposing a part of the second horizontal voltage line VL2_X and the first hole H1 spaced from the first alignment contact hole CTS and exposing a part of the second horizontal voltage line VL2_X. Further, the passivation layer 164 may include the second alignment contact hole CTD exposing a part of the first horizontal voltage line VL1_X and the first hole H1 exposing a part of the contact conductive pattern CPD.

The via layer 165 may include the opening OP exposing both the first electrode contact hole CT1 and the first alignment contact hole CTS. The opening OP may also expose the second electrode contact hole CT2 and the second alignment contact hole CTD. Accordingly, the via layer 165 may not overlap the first and second electrode contact holes CT1 and CT2 and the first and second alignment contact holes CTS and CTD in the third direction DR3.

The opening OP may be the via hole penetrating the via layer 165. Because the opening OP is formed in a large area to concurrently expose (e.g., simultaneously expose) the first alignment contact hole CTS and the first electrode contact hole CT1, the via layer 165 may not be disposed between the first alignment contact hole CTS and the first electrode contact hole CT1.

The first alignment line 210 and the second alignment line 220 may extend from the top surface of the via layer 165 to be disposed on the sidewall of the via layer 165 constituting the opening OP of the via layer 165. The first alignment line 210 may be in contact with the top surface of the second horizontal voltage line VL2_X exposed by the first alignment contact hole CTS of the passivation layer 164, and the second alignment line 220 may be in contact with the top surface of the first horizontal voltage line VL1_X exposed by the second alignment contact hole CTD of the passivation layer 164.

The first insulating layer 510 may be disposed on the first and second alignment lines 210 and 220. The first insulating layer 510 may completely cover the first and second alignment lines 210 and 220. As described above, because the opening OP included in the via layer 165 is formed in a large area to concurrently expose (e.g., simultaneously expose) the contact holes CTD, CTS, CT1, and CT2, the first insulating layer 510 may be in direct contact with the top surface of the passivation layer 164 in the peripheral areas of the first and second electrode contact holes CT1 and CT2.

The first insulating layer 510 may include the second hole H2 overlapping each of the first and second electrode contact holes CT1 and CT2. The diameter of the second hole H2 included in the first insulating layer 510 may be greater than the diameter of the first hole H1 included in the passivation layer 164. Accordingly, the first insulating layer 510 may expose the top surface of the passivation layer 164 in the peripheral areas of the first electrode contact hole CT1 and the second electrode contact hole CT2.

The first bank 600 may be disposed on the first insulating layer 510. The first bank 600 may overlap the first alignment contact hole CTS and the second alignment contact hole CTD in the third direction DR3. Accordingly, the first insulating layer 510 disposed on the first alignment contact hole CTS and the second alignment contact hole CTD may cover the first bank 600. Although not limited to the following, the first bank 600 and the via layer 165 may be formed to be spaced from each other by a suitable gap (e.g., predetermined gap) in the peripheral areas of the first and second electrode contact holes CT1 and CT2.

The second insulating layer 520 may be disposed on the first bank 600. The second insulating layer 520 may include the third hole H3 overlapping each of the first and second electrode contact holes CT1 and CT2. The diameter of the third hole H3 included in the second insulating layer 520 may be greater than the diameter of the first hole H1 included in the passivation layer 164, and may be smaller than the diameter of the hole H2 included in the first insulating layer 510. Accordingly, the second insulating layer 520 may expose the top surface of the passivation layer 164 in the peripheral areas of the first electrode contact hole CT1 and the second electrode contact hole CT2, and may cover the end of the first insulating layer 510.

The first hole H1 of the passivation layer 164, the second hole H2 of the first insulating layer 510, and the third hole H3 of the second insulating layer 520 may expose a part of the second horizontal voltage line VL2_X or the contact conductive pattern CPD. The first contact electrode 710 may be in contact (e.g., direct contact) with the top surface of the second horizontal voltage line VL2_X exposed by the first electrode contact hole CT1, and the second contact electrode 720 may be in contact (e.g., direct contact) with the top surface of the contact conductive pattern CPD exposed by the second electrode contact hole CT2.

Figure 16:
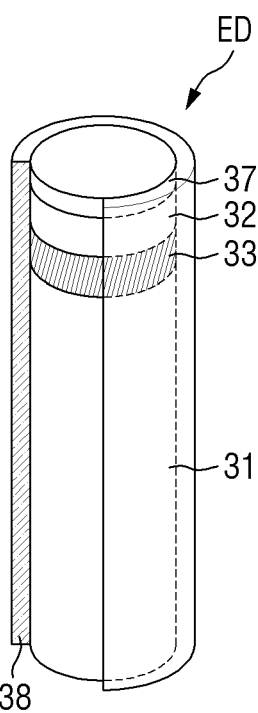
FIG. 16 is a schematic perspective cutaway view of a light emitting element according to one or more embodiments.

FIG. 16 is a schematic perspective cutaway view of a light emitting element according to one or more embodiments.

Referring to FIG. 16, the light emitting element ED which is a particulate element, may have a rod or cylindrical shape having a suitable aspect ratio (e.g., a predetermined aspect ratio). The length of the light emitting element ED may be larger than the diameter of the light emitting element ED, and the aspect ratio may be 6:5 to 100:1, but the present disclosure is not limited thereto.

The light emitting element ED may have a size of a nanometer scale (equal to or greater than 1 nm and less than 1 μm) to a micrometer scale (equal to or greater than 1 μm and less than 1 mm). In one or more embodiments, both the diameter and the length of the light emitting element ED may be on a nanometer scale, or on a micrometer scale. In one or more embodiments, the diameter of the light emitting element ED may be on a nanometer scale, while the length of the light emitting element ED may be on a micrometer scale. In one or more embodiments, some of the light emitting elements ED may have a diameter and/or length on a nanometer scale, while some others of the light emitting elements ED may have a diameter and/or length on a micrometer scale.

In one or more embodiments, the light emitting element ED may be an inorganic light emitting diode. The inorganic light emitting diode may include a plurality of semiconductor layers. For example, the inorganic light emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity type semiconductor layer and the second conductivity type semiconductor layer, respectively, and the holes and electrons that have reached the active semiconductor layer may be coupled to emit light.

When the first alignment signal and the second alignment signal are applied to the first alignment line 210 and the second alignment line 220, respectively, the light emitting element ED may be aligned such that the first conductivity type semiconductor layer and the second conductivity type semiconductor layer may face (or oppose) the specific alignment line 200 by the electric field generated between the first alignment line 210 and the second alignment line 220.

In one or more embodiments, the above-described semiconductor layers may be sequentially stacked along one direction, which is a length direction of the light emitting element ED. The light emitting element ED may include a first semiconductor layer 31, an element active layer 33, and a second semiconductor layer 32 that are sequentially stacked in one direction. The first semiconductor layer 31, the element active layer 33, and the second semiconductor layer 32 may be the first conductivity type semiconductor layer, the active semiconductor layer, and the second conductivity type semiconductor layer described above, respectively.

The first semiconductor layer 31 may be doped with a first conductivity type dopant. The first conductivity type dopant may be Si, Ge, Sn, or the like. In one or more embodiments, the first semiconductor layer 31 may be n-GaN doped with n-type Si.

The second semiconductor layer 32 may be spaced from the first semiconductor layer 31 with the element active layer 33 interposed therebetween. The second semiconductor layer 32 may be doped with a second conductivity type dopant such as Mg, Zn, Ca, Sr, Ba, or the like. In one or more embodiments, the second semiconductor layer 32 may be p-GaN doped with p-type Mg.

The element active layer 33 may include a material having a single or multiple quantum well structure. As described above, the element active layer 33 may emit light by coupling of electron-hole pairs according to an electrical signal applied through the first semiconductor layer 31 and the second semiconductor layer 32.

In one or more embodiments, the element active layer 33 may have a structure in which semiconductor materials having large band gap energy and semiconductor materials having small band gap energy are alternately stacked, and may include other Group III to V semiconductor materials according to the wavelength band of the emitted light.

Light emitted from the element active layer 33 may be emitted not only to both end surfaces of the light emitting element ED in the length direction, but also to the outer peripheral surface (or outer surface or side surface) of the light emitting element. That is, the directionality of light emitted from the element active layer 33 is not limited to one direction.

The light emitting element ED may further include an element electrode layer 37 disposed on the second semiconductor layer 32. The element electrode layer 37 may be in contact with the second semiconductor layer 32. The element electrode layer 37 may be an ohmic contact electrode. However, the element electrode layer 37 is not limited thereto, and may be a Schottky contact electrode.

The element electrode layer 37 may be disposed between the semiconductor layer 32 and a contact electrode 700 and may serve to reduce resistance when the both ends of the light emitting element ED are electrically connected to the contact electrode 700 to apply an electrical signal to the first and second semiconductor layers 31 and 32. The element electrode layer 37 may include at least one of aluminum (Al), titanium (Ti), indium (In), gold (Au), silver (Ag), indium tin oxide (ITO), indium zinc oxide (IZO), or indium tin zinc oxide (ITZO). The element electrode layer 37 may include an n-type or p-type doped semiconductor material.

The light emitting element ED may further include an element insulating layer 38 around (e.g., surrounding) the outer surfaces (e.g., the outer peripheral or circumferential surfaces) of the first semiconductor layer 31, the second semiconductor layer 32, and the element active layer 33 and/or the element electrode layer 37. The element insulating layer 38 may be disposed to surround at least the outer surface (e.g., the outer peripheral or circumferential surface) of the element active layer 33 and may extend in one direction in which the light emitting element ED extends. The element insulating layer 38 may function to protect the members. Because the element insulating layer 38 is made of materials having insulating properties, it is possible to prevent an electrical short circuit that may occur when the element active layer 33 directly contacts an electrode through which an electric signal is transmitted to the light emitting element ED. Further, because the element insulating layer 38 protects the outer surfaces (e.g., the outer peripheral or circumferential surfaces) of the first and second semiconductor layers 31 and 32 including the element active layer 33, it is possible to prevent degradation in luminous efficiency.

Figure 17:
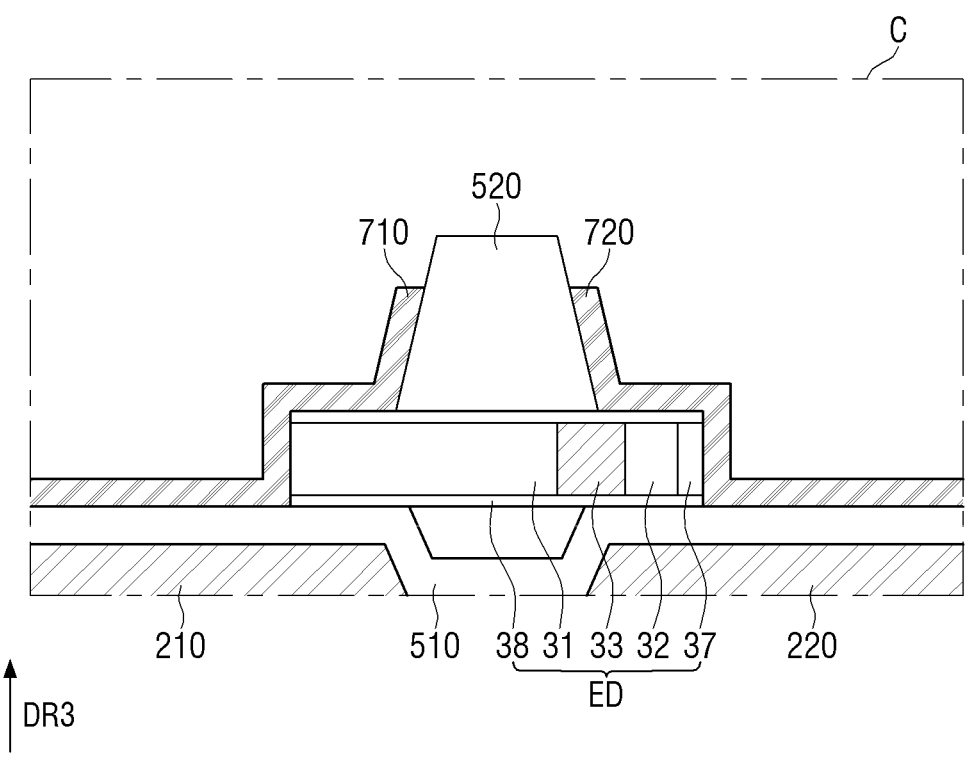
FIG. 17 is an enlarged cross-sectional view illustrating an example of an area C of FIG. 11.

FIG. 17 is an enlarged cross-sectional view illustrating an example of an area C of FIG. 11.

Referring to FIG. 17, the region where the light emitting element ED is disposed between the first alignment line 210 and the second alignment line 220 is enlarged and illustrated.

Specifically, the light emitting element ED may be disposed such that the extension direction of the light emitting element ED is parallel to one surface of the substrate SUB. The plurality of semiconductor layers included in the light emitting element ED may be sequentially arranged along the direction parallel to the top surface of the substrate SUB. For example, the first semiconductor layer 31, the element active layer 33, and the second semiconductor layer 32 of the light emitting element ED may be sequentially arranged in the direction parallel to the top surface of the substrate SUB.

Specifically, in the light emitting element ED, the first semiconductor layer 31, the element active layer 33, the second semiconductor layer 32, and the element electrode layer 37 may be sequentially formed in the direction parallel to the top surface of the substrate SUB in cross-sectional view across both ends of the light emitting element ED.

The light emitting element ED may be disposed such that one end thereof is located on the first alignment line 210 and the other end thereof is located on the second alignment line 220. One end of the light emitting element ED may be an end where the first semiconductor layer 31 is positioned, and the other end of the light emitting element ED may be an end where the second semiconductor layer 32 is positioned. However, the present disclosure is not limited thereto, and the light emitting element ED may be disposed such that one end thereof is located on the second alignment line 220 and the other end thereof is located on the first alignment line 210.

The second insulating layer 520 may be disposed on the light emitting element ED. The second insulating layer 520 may be disposed to be around (e.g., to surround) the outer surface (e.g., the outer peripheral or circumferential surface) of the light emitting element ED. In the region where the light emitting element ED is disposed, the second insulating layer 520 may be disposed to be around (e.g., to surround) the outer surface (e.g., the outer peripheral or circumferential surface) of the light emitting element ED, and in the region where the light emitting element ED is not disposed, the second insulating layer 520 may be disposed on the first insulating layer 510 or the first bank 600 exposed by the light emitting element ED.

The first contact electrode 710 may be in contact with one end of the light emitting element ED exposed by the second insulating layer 520. Specifically, the first contact electrode 710 may be disposed to be around (e.g., to surround) one end surface of the light emitting element ED exposed by the second insulating layer 520. The first contact electrode 710 may be in contact with the element insulating layer 38 and the first semiconductor layer 31 of the light emitting element ED.

The second contact electrode 720 may be in contact with the other end of the light emitting element ED exposed by the second insulating layer 520. Specifically, the second contact electrode 720 may be disposed to be around (e.g., to surround) the other end surface of the light emitting element ED exposed by the second insulating layer 520. The second contact electrode 720 may be in contact with the element insulating layer 38 and the element electrode layer 37 of the light emitting element ED.

The first contact electrode 710 and the second contact electrode 720 may be spaced from each other with the second insulating layer 520 interposed therebetween. The first contact electrode 710 and the second contact electrode 720 may expose at least a part of the top surface of the second insulating layer 520.

The first contact electrode 710 and the second contact electrode 720 may be formed on (or at) the same layer and may include the same material. That is, the first contact electrode 710 and the second contact electrode 720 may be concurrently (e.g., simultaneously) formed in one mask process. Accordingly, an additional mask process for forming the first contact electrode 710 and the second contact electrode 720 is not required, so that the manufacturing process efficiency of the display device can be improved.

Figure 18:
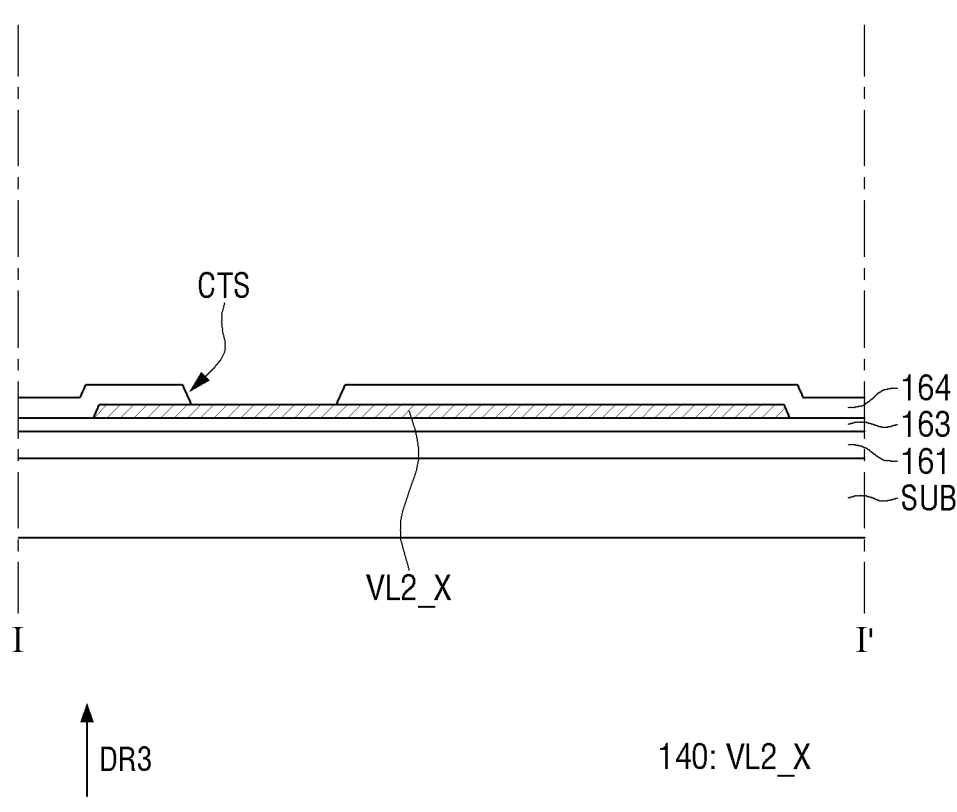
FIGS. 18 to 20 are cross-sectional views showing the steps of a method of manufacturing a display device that are taken along the line I-I' of FIGS. 9 and 10.
Figure 19:
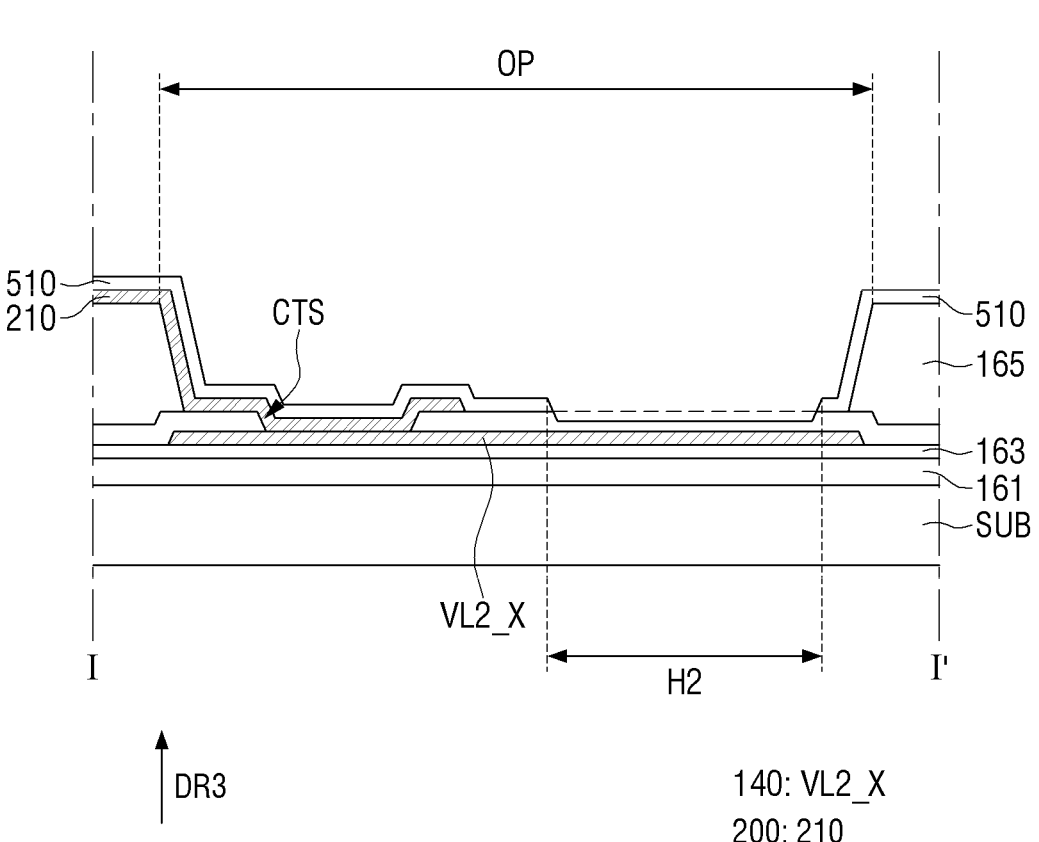
Figure 20:
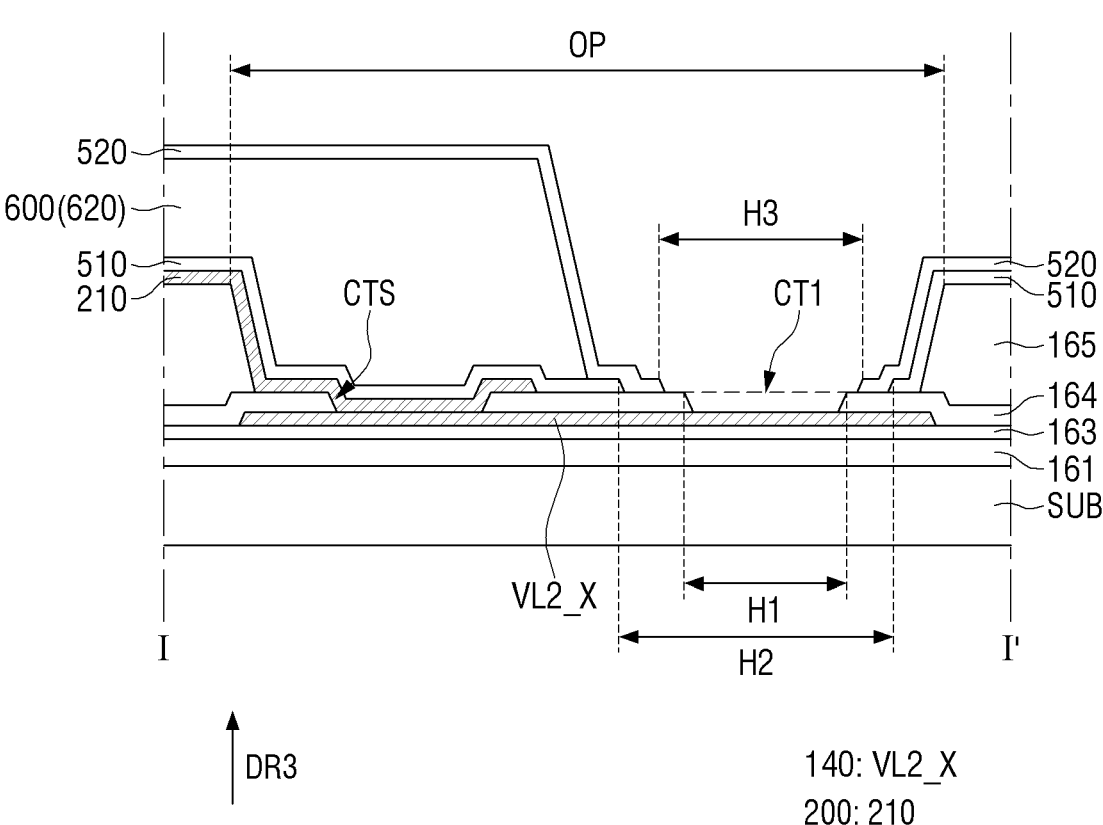

FIGS. 18 to 20 are cross-sectional views showing the steps of a method of manufacturing a display device which are taken along the line I-I' of FIGS. 9 and 10.

FIGS. 18 to 20 may be cross-sectional views illustrating steps for forming the first alignment contact hole CTS and the first electrode contact hole CT1 during the manufacturing process of the display device 10. In one or more embodiments, a step for forming the second alignment contact hole CTD may be substantially the same as the step for forming the first alignment contact hole CTS, and a step for forming the second electrode contact hole CT2 may be substantially the same as the step for forming the first electrode contact hole CT1. Therefore, the steps for forming the first alignment contact hole CTS and the first electrode contact hole CT1 will be mainly described, and the redundant description of the steps for forming the second alignment contact hole CTD and the second electrode contact hole CT2 will be omitted.

First, referring to FIG. 18, a patterned third conductive layer 140 is formed on the substrate SUB, and a patterned passivation layer 164 is formed on the third conductive layer 140.

Specifically, the patterned third conductive layer 140 may include the second horizontal voltage line VL2_X. The second horizontal voltage line VL2_X may be disposed on the interlayer insulating layer 163.

Next, the patterned passivation layer 164 is formed on the patterned third conductive layer 140. The patterned passivation layer 164 may include the first alignment contact hole CTS exposing a part of the second horizontal voltage line VL2_X. The first alignment contact hole CTS may be formed by the sidewall of the passivation layer 164. The patterned passivation layer 164 may cover the second horizontal voltage line VL2_X overlapping the region where the first electrode contact hole CT1 is formed.

Then, referring to FIG. 19, after a patterned via layer 165 is formed on the passivation layer 164, a patterned alignment line 200 is formed on the patterned via layer 165. Next, a patterned first insulating layer 510 is formed on the patterned alignment line 200.

Specifically, the patterned via layer 165 may include the opening OP. The opening OP may be defined by the sidewall of the via layer 165. The opening OP may concurrently expose (e.g., simultaneously expose) regions where the first alignment contact hole CTS and the first electrode contact hole CT1 will be formed. Accordingly, because the via layer 165 is not disposed between the first alignment contact hole CTS and the first electrode contact hole CT1, it is possible to prevent the photoresist layer used in the patterning process for forming the first insulating layer 510, the second insulating layer 520, or the contact electrode 700 from remaining in the opening of the via layer 165 due to the thickness of the via layer 165.

Then, a patterned alignment line 200 is formed on the patterned via layer 165. Specifically, the patterned alignment line 200 shown in FIG. 19 may be formed by depositing an alignment line material layer on the entire via layer 165 and then patterning it by a photolithography process. In this step, the first alignment line 210 may be in contact (e.g., direct contact) with the top surface of the second horizontal voltage line VL2_X exposed by the first alignment contact hole CTS included in the passivation layer 164.

In one or more embodiments, the passivation layer 164 may be disposed to include the first alignment contact hole CTS exposing a part of the second horizontal voltage line VL2_X and cover another part of the second horizontal voltage line VL2_X. Accordingly, the passivation layer 164 may protect the second horizontal voltage line VL2_X overlapping the region where the first electrode contact hole CT1 will be formed from being exposed to the etching solution of the alignment line 200 that is used for pattering the alignment line 200. Therefore, it is possible to prevent the second horizontal voltage line VL2_X from being damaged by the etching solution for patterning the alignment line 200.

Next, the patterned first insulating layer 510 is formed on the patterned alignment line 200. For example, a first insulating layer material layer is entirely deposited on the via layer 165 and the passivation layer 164 on which the patterned alignment line 200 is formed. Next, a photoresist pattern overlapping a part of the second horizontal voltage line VL2_X and exposing a part of the passivation layer 164 is formed on the first insulating layer material layer, and the first insulating layer material layer is etched while using the photoresist pattern as an etching mask, thereby forming the patterned first insulating layer 510 shown in FIG. 19. The patterned first insulating layer 510 may completely cover the alignment line 200. Accordingly, the first insulating layer 510 may completely cover the top and side surfaces of the alignment line 200.

The patterned first insulating layer 510 may include the second hole H2 that does not overlap the first alignment contact hole CTS. The second hole H2 included in the first insulating layer 510 may correspond to and overlap the region where the first electrode contact hole CT1 is formed in the third direction DR3. In this step of forming the patterned first insulating layer 510, a part of the passivation layer 164 overlapping the second hole H2 may be over-etched during the etching of the first insulating layer material layer, so that the thickness of the passivation layer 164 overlapping the second hole H2 may be reduced.

In one or more embodiments, in the step of forming the patterned passivation layer 164, the passivation layer 164 is formed to cover the second horizontal voltage line VL2_X in the region overlapping the first electrode contact hole CT1, so that it is possible to prevent the second horizontal voltage line VL2_X from being exposed and damaged by a chemical material (etching solution or etchant) for forming the alignment line 200 and the first insulating layer 510.

Next, referring to FIG. 20, a patterned first bank 600 is formed, and a patterned second insulating layer 520 is formed on the first bank 600.

Specifically, the patterned first bank 600 may be formed on the passivation layer 164. The patterned first bank 600 may be disposed to expose the second hole H2 included in the first insulating layer 510.

Next, the patterned second insulating layer 520 is formed on the patterned first bank 600. For example, a second insulating layer material layer is deposited on the entire patterned first bank 600. Next, a photoresist pattern overlapping a part of the second horizontal voltage line VL2_X and exposing a part of the passivation layer 164 may be formed on the second insulating layer material layer, and the second insulating layer material layer may be etched while using the photoresist pattern as an etching mask, thereby forming the patterned second insulating layer 520 shown in FIG. 20.

Specifically, the patterned second insulating layer 520 may include the third hole H3 overlapping the first electrode contact hole CT1. The third hole H3 included in the second insulating layer 520 may overlap the region where the first electrode contact hole CT1 is formed in the third direction DR3, and may constitute the first electrode contact hole CT1.

In this step of forming the patterned second insulating layer 520, the passivation layer 164 overlapping the third hole H3 may be over-etched during the etching of the second insulating layer material layer, so that the passivation layer 164 overlapping the third hole H3 may be completely removed. Accordingly, the passivation layer 164 may include the first hole H1, and the first hole H1 may constitute the first electrode contact hole CT1 together with the third hole H3. Accordingly, the first electrode contact hole CT1 may expose a part of the second horizontal voltage line VL2_X as shown in FIG. 20.

Then, as shown in FIG. 13, a patterned contact electrode 700 is formed. The process of forming the patterned contact electrode 700 may be performed by a mask process. For example, the contact electrode material layer may be deposited on the entire second insulating layer 520 and then patterned by a photolithography process, thereby forming the patterned contact electrode 700 shown in FIG. 13. As described above, the contact electrode 700 may include the first contact electrode 710.

Hereinafter, other embodiments of the peripheral area in which the first alignment contact hole CTS and the first electrode contact hole CT1 of the display device 10 are disposed will be described. In the following embodiments, a description of the same components as those of the above-described embodiment will be omitted or simplified, and differences will be mainly described.

Figure 21:
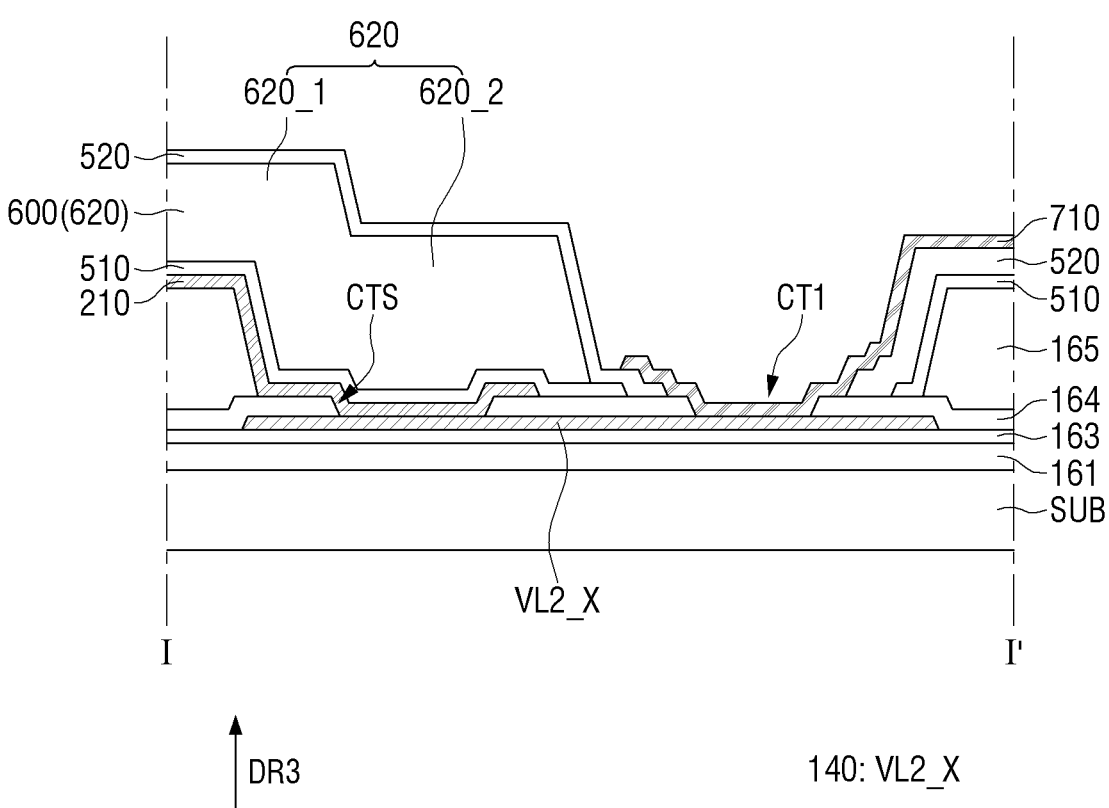
FIG. 21 is a cross-sectional view illustrating an example taken along the line I-I' of FIGS. 9 and 10.

FIG. 21 is a cross-sectional view illustrating an example taken along the line I-I' of FIGS. 9 and 10.

Referring to FIG. 21, the embodiment of FIG. 21 is different from the embodiment of FIG. 13 in that the second area 620 of the first bank 600 includes a first portion 620_1 and a second portion 620_2 having different heights.

Specifically, the second area 620 of the first bank 600 includes the first portion 620_1 having a first height and a second portion 620_2 having a second height lower than that of the first portion 620_1.

The first portion 620_1 may overlap the via layer 165, and the second portion 620_2 may not overlap the via layer 165. The second area 620 of the first bank 600 may include the first portion 620_1 and the second portion 620_2 whose heights are different in the region where the via layer 165 is formed and the region where the via layer 165 is not formed due to the thickness of the via layer 165.

Figure 22:
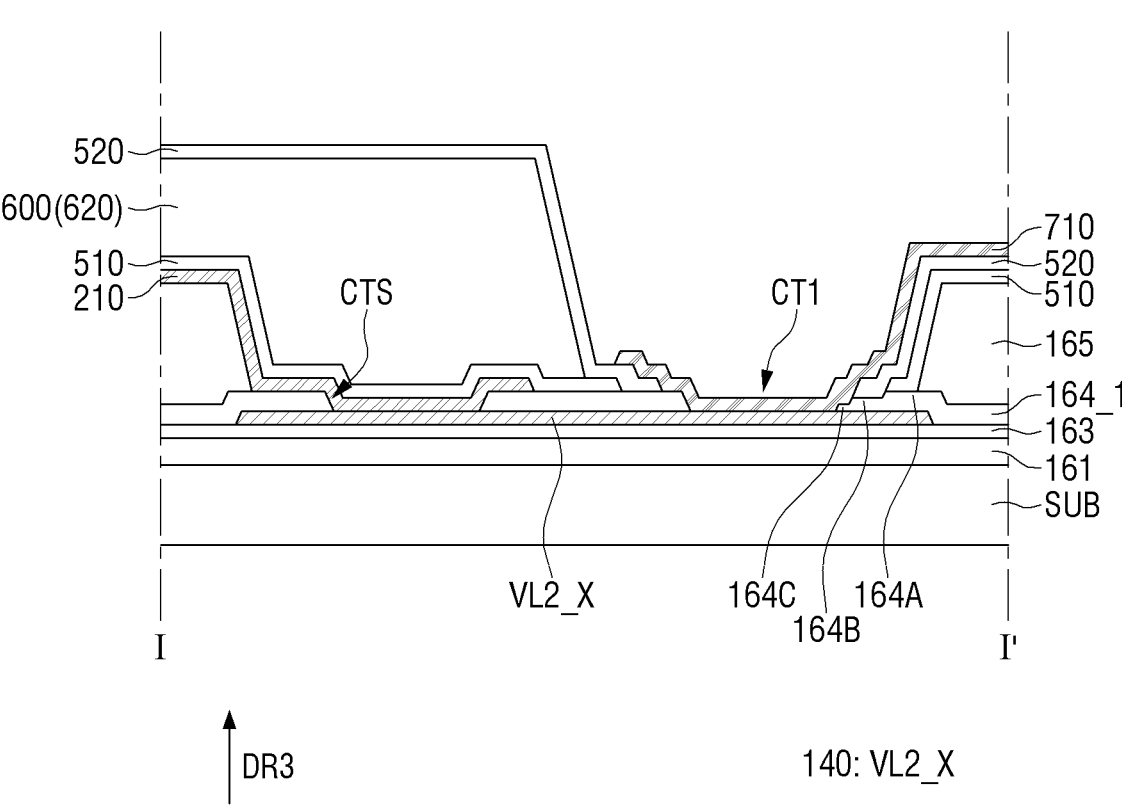
FIG. 22 is a cross-sectional view illustrating an example taken along the line I-I' of FIGS. 9 and 10.

FIG. 22 is a cross-sectional view illustrating an example taken along the line I-I' of FIGS. 9 and 10.

Referring to FIG. 22, the embodiment of FIG. 22 is different from the embodiment of FIG. 13 in that a passivation layer 164_1 has different thicknesses depending on regions overlapping the first insulating layer 510 and the second insulating layer 520 in the peripheral area of the first electrode contact hole CT1.

Specifically, the passivation layer 164_1 includes a first portion 164A having a first thickness, a second portion 1648 having a second thickness that is less than the first thickness, and a third portion 164C having a third thickness that is less than the second thickness in the peripheral area of the first electrode contact hole CT1.

The first portion 164A of the passivation layer 164_1 may overlap the first insulating layer 510 and the second insulating layer 520 in the third direction DR3. The top surface of the first portion 164A of the passivation layer 164_1 may be covered by the first insulating layer 510 and the second insulating layer 520. The sidewall of the first portion 164A of the passivation layer 164_1 may be aligned with the sidewall of the first insulating layer 510.

The second portion 164B of the passivation layer 164_1 may overlap the second insulating layer 520 in the third direction DR3, and may not overlap the first insulating layer 510. The top surface of the second portion 164B of the passivation layer 164_1 may be exposed by the first insulating layer 510, and may be covered by the second insulating layer 520. The sidewall of the second portion 164B of the passivation layer 164_1 may be aligned with the sidewall of the second insulating layer 520.

The third portion 164C of the passivation layer 164_1 may not overlap the first and second insulating layers 510 and 520 in the third direction DR3. The third portion 164C of the passivation layer 164_1 may be exposed from the first and second insulating layers 510 and 520.

The first to third portions 164A, 164B, and 164C of the passivation layer 164_1 may be formed in the manufacturing process for forming the first electrode contact hole CT1. Specifically, in the patterning process for forming the first insulating layer 510, the region of the passivation layer 164_1 overlapping the second hole H2 may be over-etched, so that the sidewall of the first insulating layer 510 and the sidewall of the first portion 164A of the passivation layer 164_1 may be aligned. Next, in the patterning process for forming the second insulating layer 520, the region of the passivation layer 164_1 overlapping the third hole H3 may be over-etched, so that the sidewall of the second insulating layer 520 and the sidewall of the second portion 164B of the passivation layer 164_1 may be aligned. Because the width of the third hole H3 is smaller than the width of the second hole H2, the second insulating layer 520 may be formed to cover the first insulating layer 510.

Figure 23:
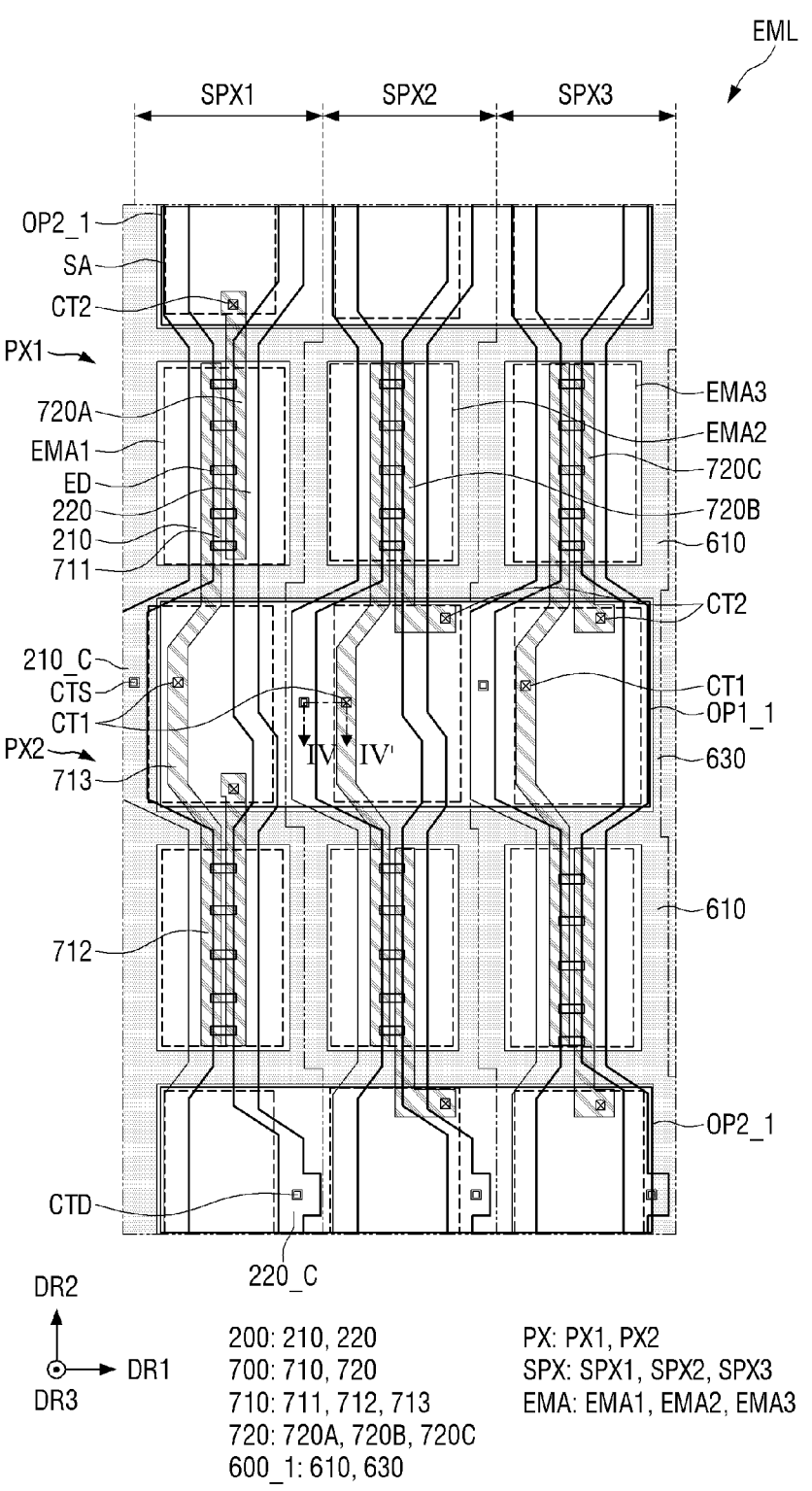
FIG. 23 is a schematic planar layout view of a light emitting element layer of a display device according to one or more embodiments.
Figure 24:
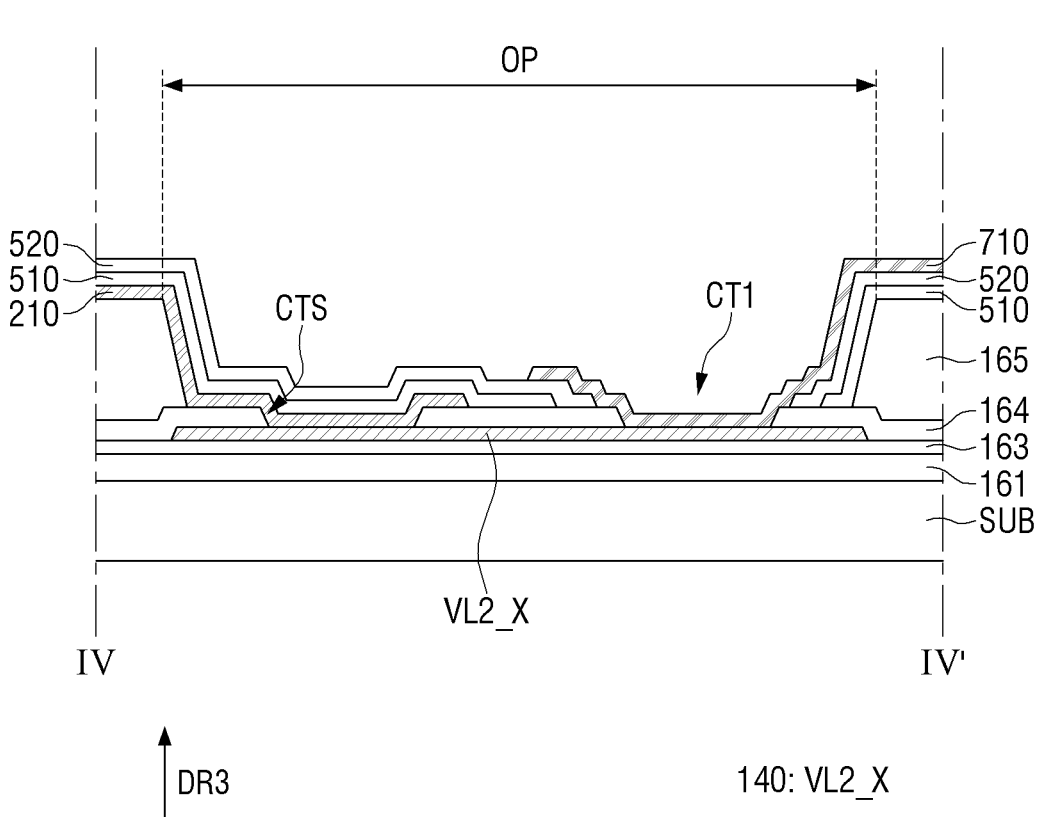
FIG. 24 is a cross-sectional view illustrating an example taken along the line IV-IV' of FIG. 23.

FIG. 23 is a schematic planar layout view of a light emitting element layer of a display device according to one or more embodiments. FIG. 24 is a cross-sectional view illustrating an example taken along the line IV-IV' of FIG. 23.

Referring to FIGS. 23 and 24, the display device 10 according to the present embodiment is different from the display device according to the embodiment of FIG. 9 in that the second area 620 of the first bank disposed between the sub-regions SA of the sub-pixels SPX included in the same pixel PX is omitted.

Specifically, a first bank 600_1 may not be disposed between the sub-regions SA of the first to third sub-pixels SPX1, SPX2, and SPX3 included in the same pixel PX. For example, the first bank 600_1 may not be disposed between the sub-region SA of the first sub-pixel SPX1 and the sub-region SA of the second sub-pixel SPX2 and between the sub-region SA of the second sub-pixel SPX2 and the sub-region SA of the third sub-pixel SPX3. Accordingly, the first bank 600_1 may include one opening that concurrently (e.g., simultaneously) exposes the sub-regions SA of the first to third sub-pixels SPX1, SPX2, and SPX3 adjacent in the first direction DR1.

Accordingly, the via layer 165 may not be disposed in the sub-regions SA of the first to third sub-pixels SPX1, SPX2, and SPX3 in the same pixel PX. Accordingly, a first opening OP1_1 and a second opening OP2_1 penetrating the via layer 165 may also concurrently (e.g., simultaneously) expose the sub-regions SA of the first to third sub-pixels SPX, SPX2, and SPX3.

The first alignment contact hole CTS connecting the first alignment line 210 of the second sub-pixel SPX2 to the circuit element layer CCL, and the first alignment contact hole CTS connecting the first alignment line 210 of the third sub-pixel SPX3 to the circuit element layer CCL may not overlap the first bank 600_1.

Figure 25:
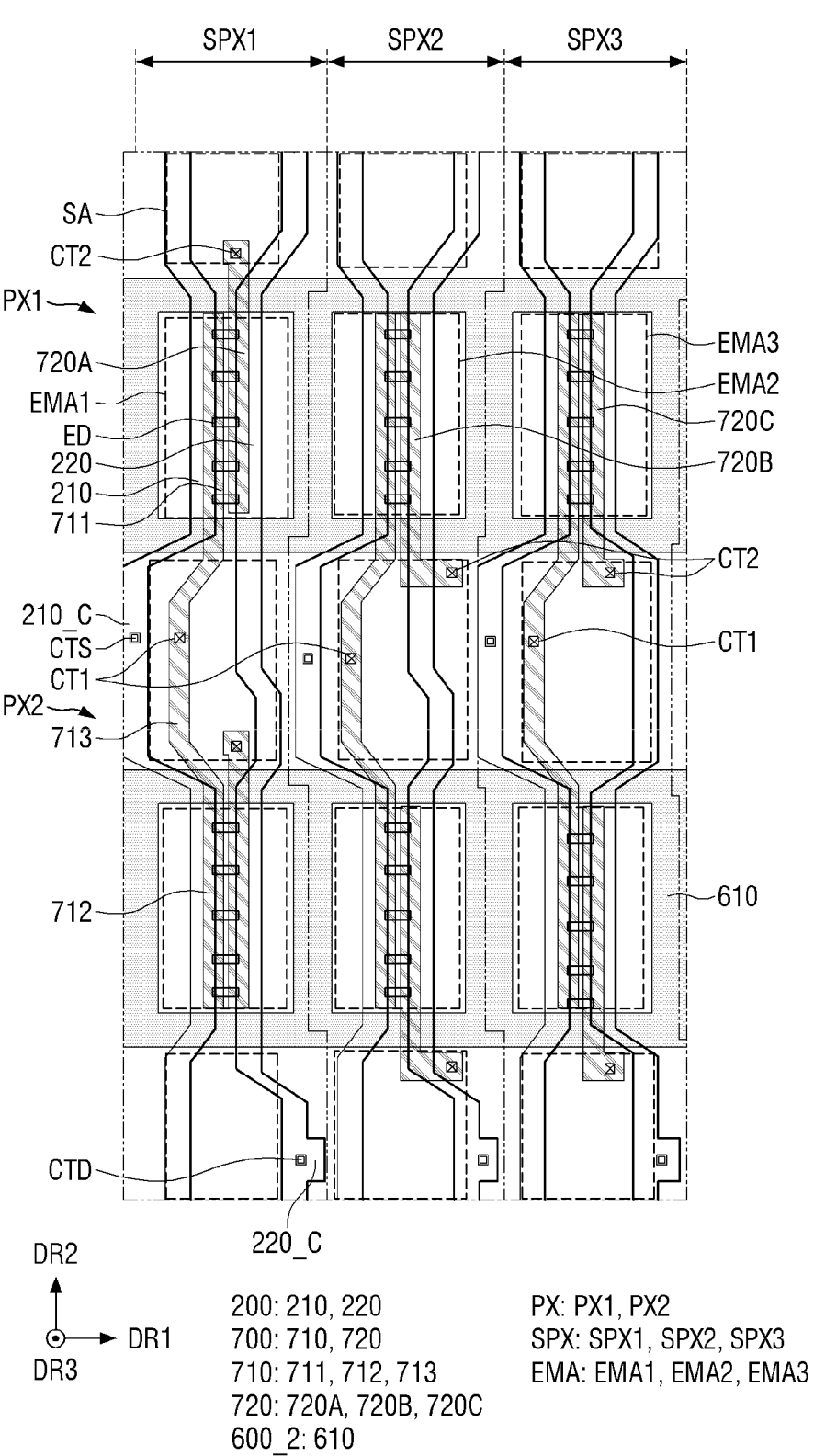
FIG. 25 is a schematic planar layout view of a light emitting element layer of a display device according to one or more embodiments.

FIG. 25 is a schematic planar layout view of a light emitting element layer of a display device according to one or more embodiments.

Referring to FIG. 25, the display device 10 according to the present embodiment is different from the display device according to the embodiment of FIG. 23 in that the third area 630 of the first bank disposed at the boundary between the sub-regions SA of the pixels PX adjacent in the first direction DR1 is further omitted.

Specifically, a first bank 600_2 may not be disposed between the sub-regions SA of the pixels PX adjacent in the first direction DR1. For example, the first bank 600_2 may not be disposed between the sub-region SA of the third sub-pixel SPX3 and the sub-region SA of the first sub-pixel SPX1. That is, the first bank 600_2 may include an opening extending in the first direction DR1. Accordingly, the via layer 165 may be formed to extend in the first direction DR1 in the region overlapping the emission area EMA, and may not be formed in the region overlapping the sub-region SA.

Figure 26:
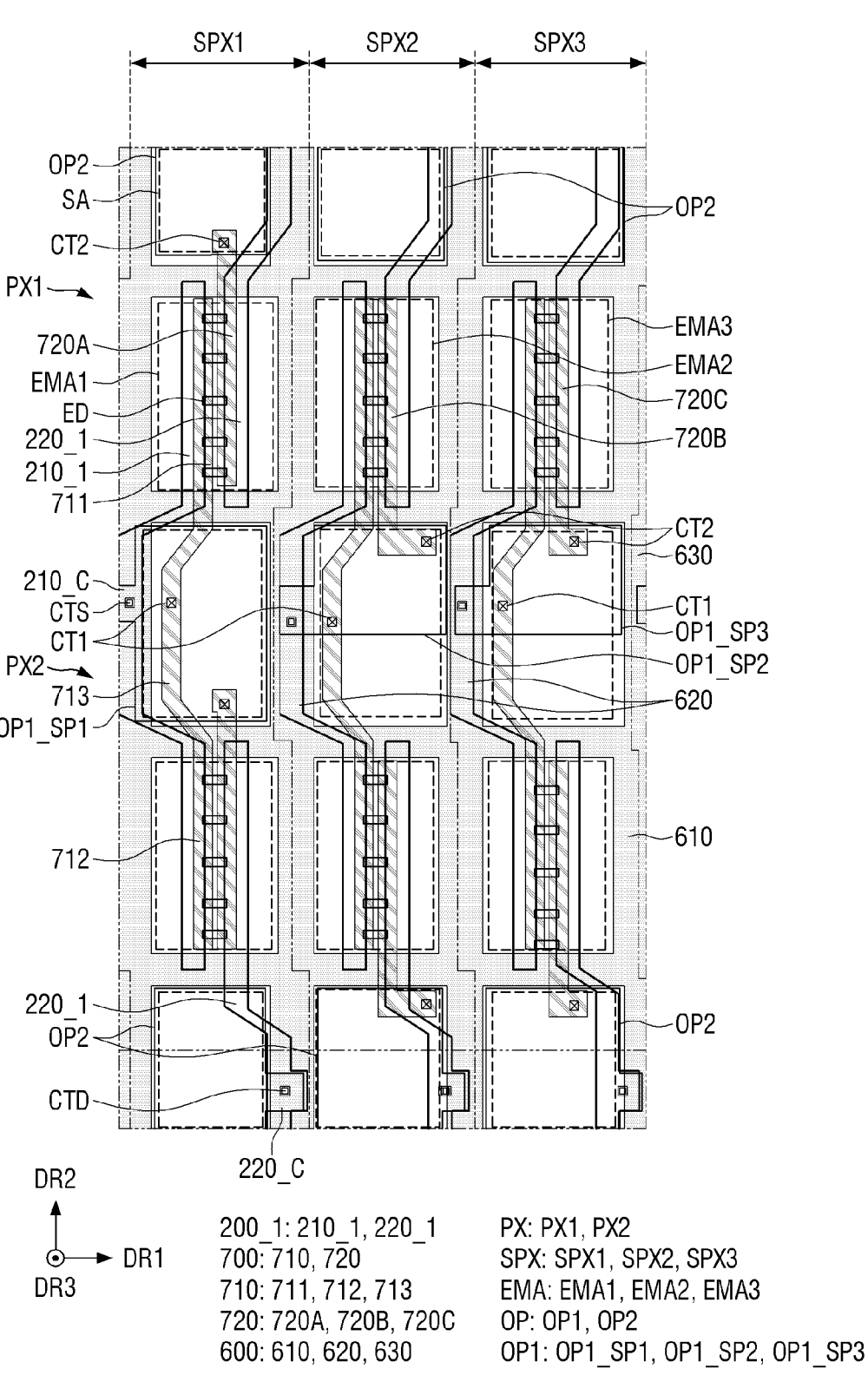
FIG. 26 is a schematic planar layout view of a light emitting element layer of a display device according to one or more embodiments.

FIG. 26 is a schematic planar layout view of a light emitting element layer of a display device according to one or more embodiments.

Referring to FIG. 26, the display device 10 according to the present embodiment is different from the display device according to the embodiment of FIG. 9 in that an alignment line 200_1 forms an island pattern that extends from the first pixel PX1 and the second pixel PX2 in the first direction DR1 and does not extend to the upper side of the PX1 and the lower side of the second pixel PX2.

Specifically, a first alignment line 210_1 may be disposed across the emission area EMA of the first pixel PX1 and the emission area of the second pixel PX2. The first alignment line 210_1 may not be disposed in the sub-region SA positioned on the upper side the emission area EMA of the first pixel PX1 and on the lower side of the emission area EMA of the second pixel PX2. Accordingly, the first alignment line 210_1 may be separated from a first alignment line 210_1 of the pixel PX disposed on the upper side of the first pixel PX1 and a first alignment line 210_1 of the pixel PX disposed on the lower side of the second pixel PX2. In the present embodiment, the first alignment line 210_1 may be connected to the second horizontal voltage line VL2_X through the first alignment contact hole CTS positioned on the lower side of the first pixel PX1 to transmit the alignment signal to the first pixel PX1 and the second pixel PX2.

A second alignment line 220_1 applying the alignment signal to the first pixel PX1 and a second alignment line 220_1 applying the alignment signal to the second pixel PX2 may be spaced from each other in the second direction DR2. The second alignment line 220_1 transmitting the alignment signal to the first pixel PX1 may be connected to the second alignment line 220_1 of the pixel PX disposed on the upper side of the first pixel PX1, and the second alignment line 220_1 applying the alignment signal to the second pixel PX2 may be connected to the second alignment line 220_1 of the pixel PX disposed on the lower side of the second pixel PX2. The second alignment line 220_1 may be connected to the first horizontal voltage line VL1_X through the second alignment contact hole CTD positioned on the lower side of the second pixel PX2 to transmit the alignment signal to the second pixel PX2 and the pixel PX disposed on the lower side of the second pixel PX2.

In the present embodiment, the first alignment line 210_1 and the second alignment line 220_1 may be disposed as a pair in two pixels PX disposed adjacent in the same column while extending in the second direction DR2. Accordingly, the first alignment line 210_1 and the second alignment line 220_1 may not be disposed across all the plurality of pixels PXs disposed in the same column. In this case as well, as described above, the first voltage line VL1 and the second voltage line VL2 have a mesh structure, so that the alignment signal may be transmitted to the first alignment line 210_1 and the second alignment line 220_1 of each pixel PX or each sub-pixel SPX.

Figure 27:
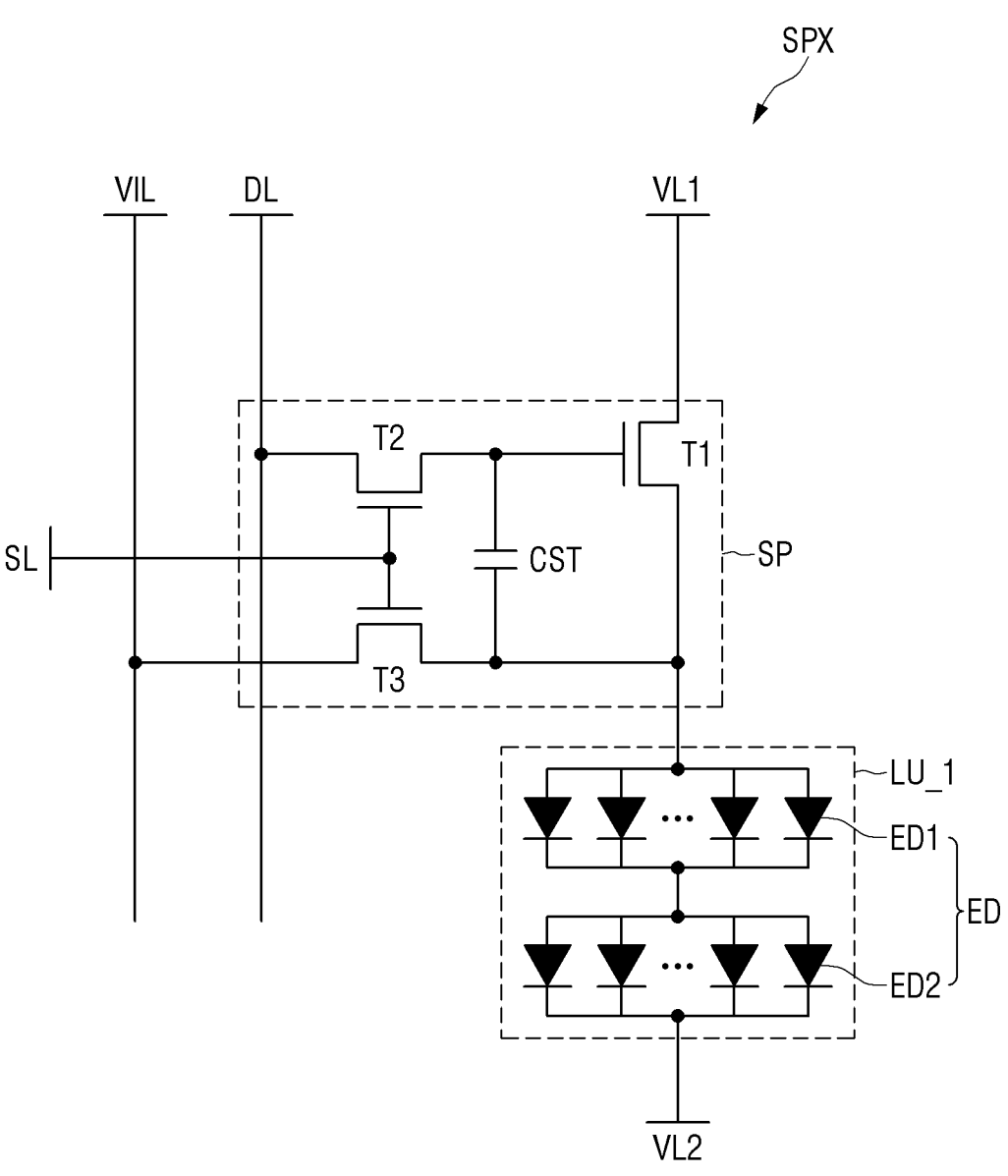
FIG. 27 is an equivalent circuit diagram of one sub-pixel of a display device according to one or more embodiments.

FIG. 27 is an equivalent circuit diagram of one sub-pixel of a display device according to one or more embodiments.

Referring to FIG. 27, in the equivalent circuit diagram of each sub-pixel SPX according to the present embodiment, the light emitting unit LU_1 may include one or more first light emitting elements ED1 connected in parallel between the sub-pixel circuit SP and the second voltage line VL2 and one or more second light emitting elements ED2 connected in parallel between the first light emitting element ED1 and the second voltage line VL2. The first light emitting element ED1 and the second light emitting element ED2 may be connected in series.

In one or more embodiments, although FIG. 27 illustrates the embodiment in which the first light emitting elements ED1 and the second light emitting elements ED2 are connected in parallel in the same direction (e.g., forward direction) between the sub-pixel circuit SP and the second voltage line VL2, the present disclosure is not limited thereto. For example, some of the first light emitting elements ED1 or the second light emitting elements ED2 may be connected in the forward direction between the sub-pixel circuit SP and the second voltage line VL2 to constitute an effective light source, and some others thereof may be connected in the reverse direction between the sub-pixel circuit SP and the second voltage line VL2.

Figure 28:
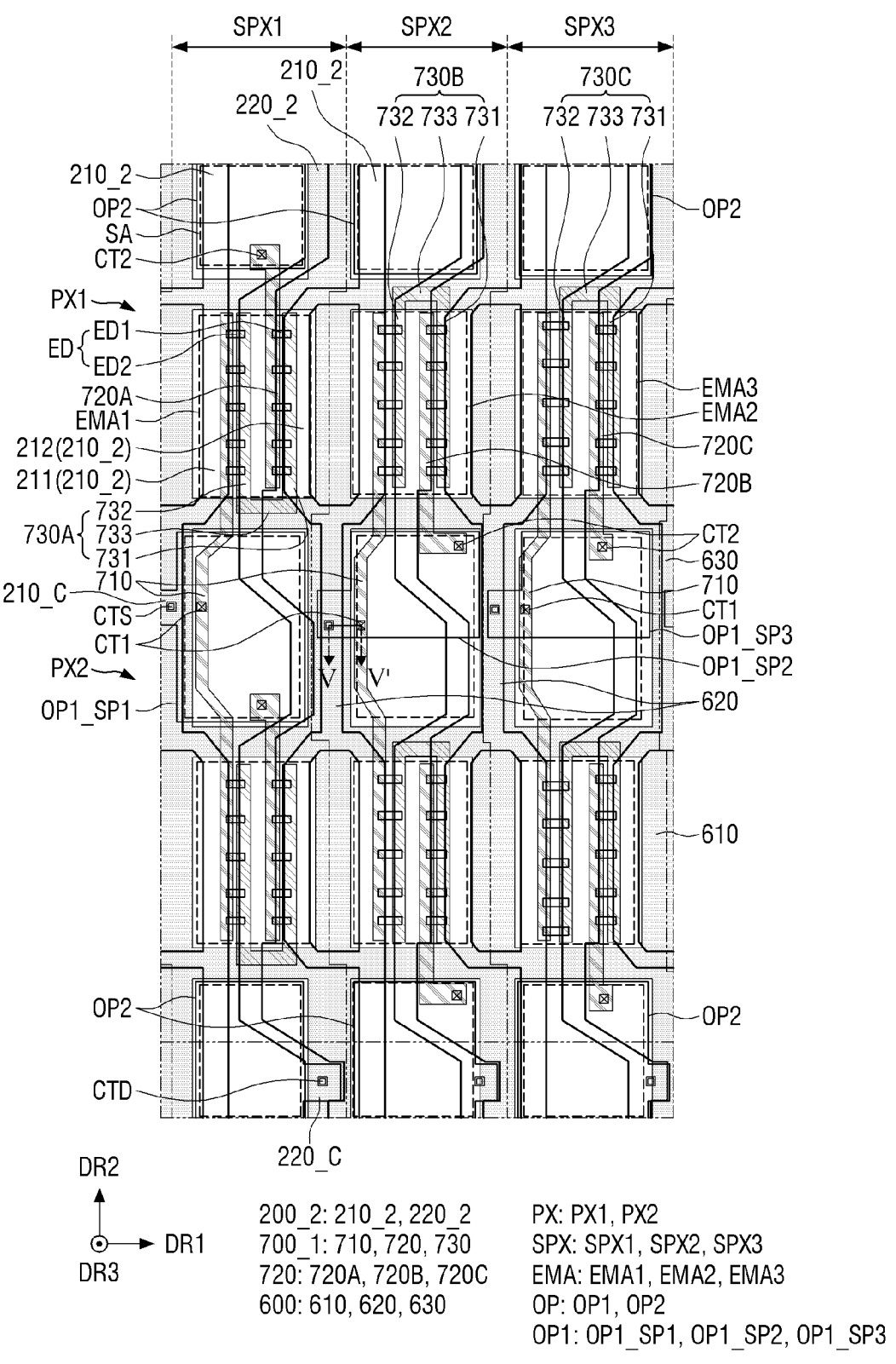
FIG. 28 is a schematic planar layout view of a light emitting element layer of a display device according to one or more embodiments.
Figure 29:
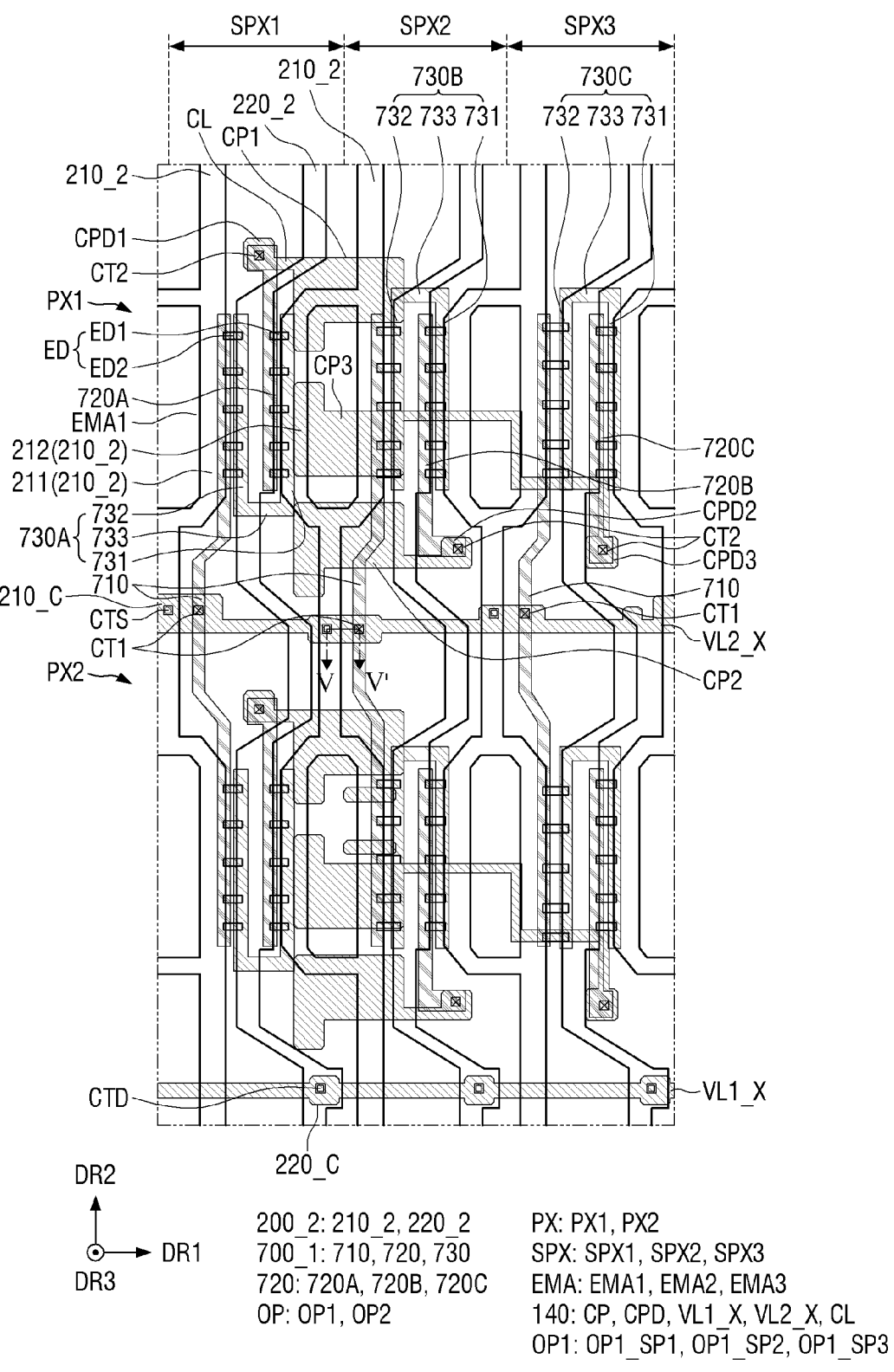
FIG. 29 is a relative planar layout view of the alignment line, the contact electrode, and the third conductive layer according to the embodiment of FIG. 28.

FIG. 28 is a schematic planar layout view of a light emitting element layer of a display device according to one or more embodiments. FIG. 29 is a relative planar layout view of the alignment line, the contact electrode, and the third conductive layer according to the embodiment of FIG. 28.

Referring to FIGS. 28 and 29, the display device 10 of FIGS. 28 and 29 is different from the display device 10 of FIGS. 9 and 10 in that the planar structure of an alignment line 200_2 is different and a contact electrode 700_1 further includes a third contact electrode 730.

Specifically, a first alignment line 210_2 may include a first sub-alignment line 211 and a second sub-alignment line 212 spaced from each other in the first direction DR1 in the emission area EMA of each sub-pixel SPX. Each of the first sub-alignment line 211 and the second sub-alignment line 212 may extend in the second direction DR2. The first sub-alignment line 211 and the second sub-alignment line 212 may be spaced from each other in the first direction DR1 with the second alignment line 220_2 interposed therebetween.

The light emitting element ED may include the first light emitting element ED1 and the second light emitting element ED2. The second light emitting element ED2 may be disposed between the first sub-alignment line 211 and the second alignment line 220_2, and the first light emitting element ED1 may be disposed between the second sub-alignment line 212 and the second alignment line 220_2.

In the present embodiment, in the process of aligning the light emitting element ED during the manufacturing process of the display device 10, the first sub-alignment line 211 and the second sub-alignment line 212 may be connected to the second horizontal voltage line VL2_X through the first alignment contact hole CTS to receive the first alignment signal, and the second alignment line 220_2 may be connected to the first horizontal voltage line VL1_X through the second alignment contact hole CTD to receive the second alignment signal. Accordingly, the second light emitting element ED2 may be aligned such that a specific end thereof faces the first sub-alignment line 211 between the first sub-alignment line 211 and the second alignment line 220_2, and the first light emitting element ED1 may be aligned such that a specific end thereof faces the second sub-alignment line 212 between the second sub-alignment line 212 and the second alignment line 220_2.

The first contact electrode 710 may be in contact with one end of the second light emitting element ED2 disposed in the emission area EMA of the first pixel PX1, one end of the second light emitting element ED2 disposed in the emission area EMA of the second pixel PX2, and the second horizontal voltage line VL2_X exposed by the first electrode contact hole CT1. One end of the second light emitting element ED2 may be the end of the second light emitting element ED2 aligned on the first sub-alignment line 211 side.

The second contact electrode 720 disposed in the first pixel PX1 may be in contact with one end of the first light emitting element ED1 disposed in the emission area EMA of the first pixel PX1 and the contact conductive pattern CPD exposed by the second electrode contact hole CT2. The second contact electrode 720 disposed in the second pixel PX2 may be in contact with one end of the first light emitting element ED1 disposed in the emission area EMA of the second pixel PX2 and the contact conductive pattern CPD exposed by the second electrode contact hole CT2. One end of the first light emitting element ED1 may be the end of the first light emitting element ED1 aligned on the second alignment line 220_2 side.

The third contact electrode 730 may be spaced from the first contact electrode 710 and the second contact electrode 720. The third contact electrode 730 may be disposed in the emission area EMA of each sub-pixel SPX.

The third contact electrode 730 may include a first area 731, a second area 732, and a third area 733.

The first area 731 of the third contact electrode 730 may be spaced from the second area 732 of the third contact electrode 730 with the second contact electrode 720 interposed therebetween in the emission area EMA. The first area 731 of the third contact electrode 730 may extend in the second direction DR2. The first area 731 of the third contact electrode 730 may overlap the other end of the first light emitting element ED1, and may be in contact with the other end of the first light emitting element ED1.

The second area 732 of the third contact electrode 730 may be disposed between the first contact electrode 710 and the second contact electrode 720 in the emission area EMA. The second area 732 of the third contact electrode 730 may extend in the second direction DR2 between the first contact electrode 710 and the second contact electrode 720. The second area 732 of the third contact electrode 730 may overlap the other end of the second light emitting element ED2, and may be in contact with the other end of the second light emitting element ED2.

The third area 733 of the third contact electrode 730 may be disposed between the first area 731 of the third contact electrode 730 and the second area 732 of the third contact electrode 730. The third area 733 of the third contact electrode 730 may be disposed between the first area 731 of the third contact electrode 730 and the second area 732 of the third contact electrode 730 to physically and/or electrically connect them.

A third contact electrodes 730A disposed in the first sub-pixel SPX1 and third contact electrodes 730B and 730C disposed in the second and third sub-pixels SPX2 and SPX3 may have different planar shapes. Specifically, in the third contact electrode 730A of the first sub-pixel SPX1 in which the second electrode contact hole CT2 is positioned on the upper side with respect to the emission area EMA, the third area 733 may be disposed on the lower side of the first and second areas 731 and 732. In the third contact electrodes 730B and 730C of the second and third sub-pixels SPX2 and SPX3 in which the second electrode contact hole CT2 is positioned on the lower side with respect to the emission area EMA, the third area 733 may be disposed on the upper side of the first and second areas 731 and 732.

The third contact electrode 730 may be a connection electrode that is in contact with the other end of the first light emitting element ED1 and the other end of the second light emitting element ED2 to connect the first light emitting element ED1 to the second light emitting element ED2 in series.

Figure 30:
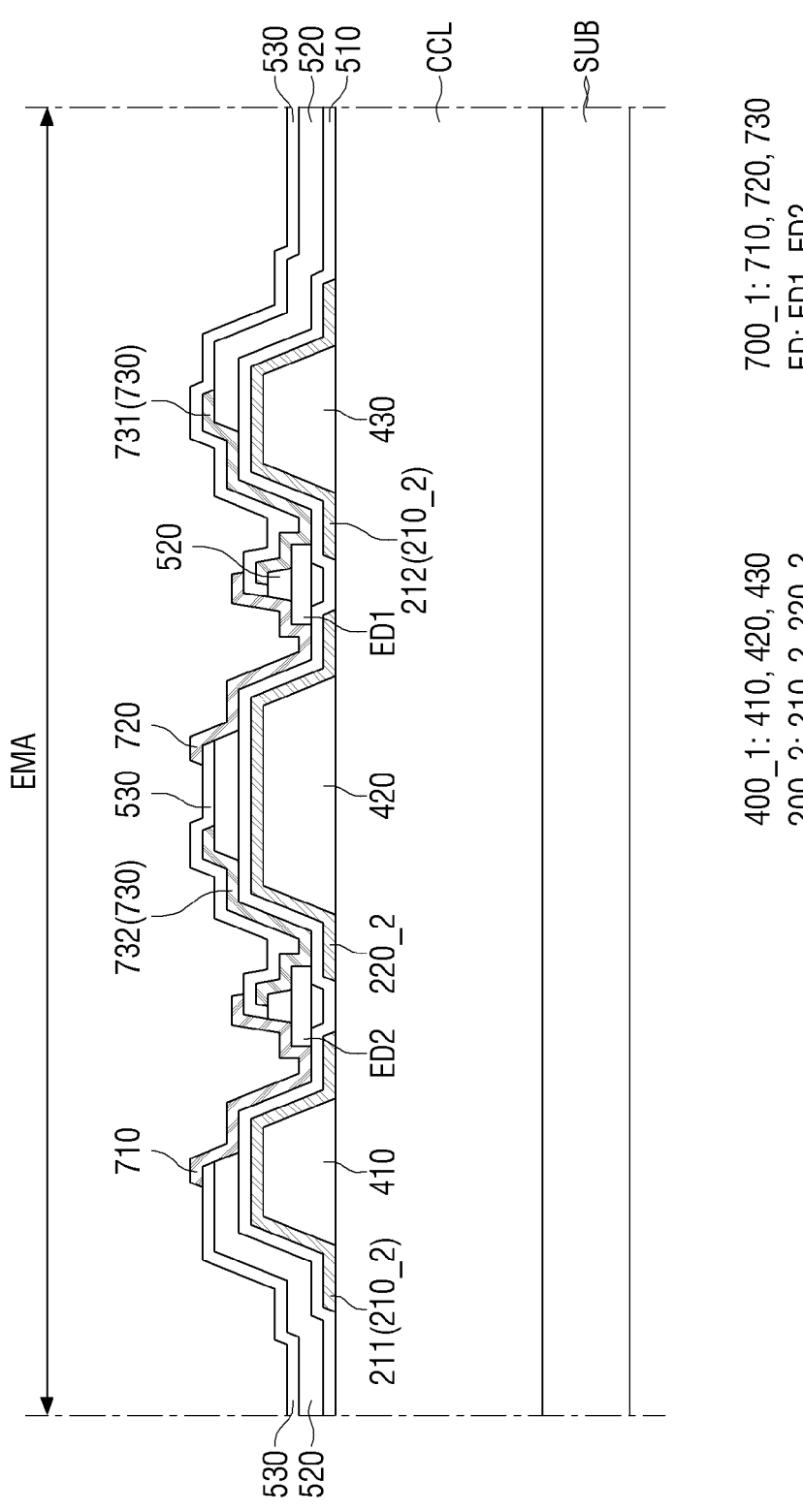
FIG. 30 is a cross-sectional view illustrating an example of the display device according to the embodiment of FIGS. 28 and 29.
Figure 31:
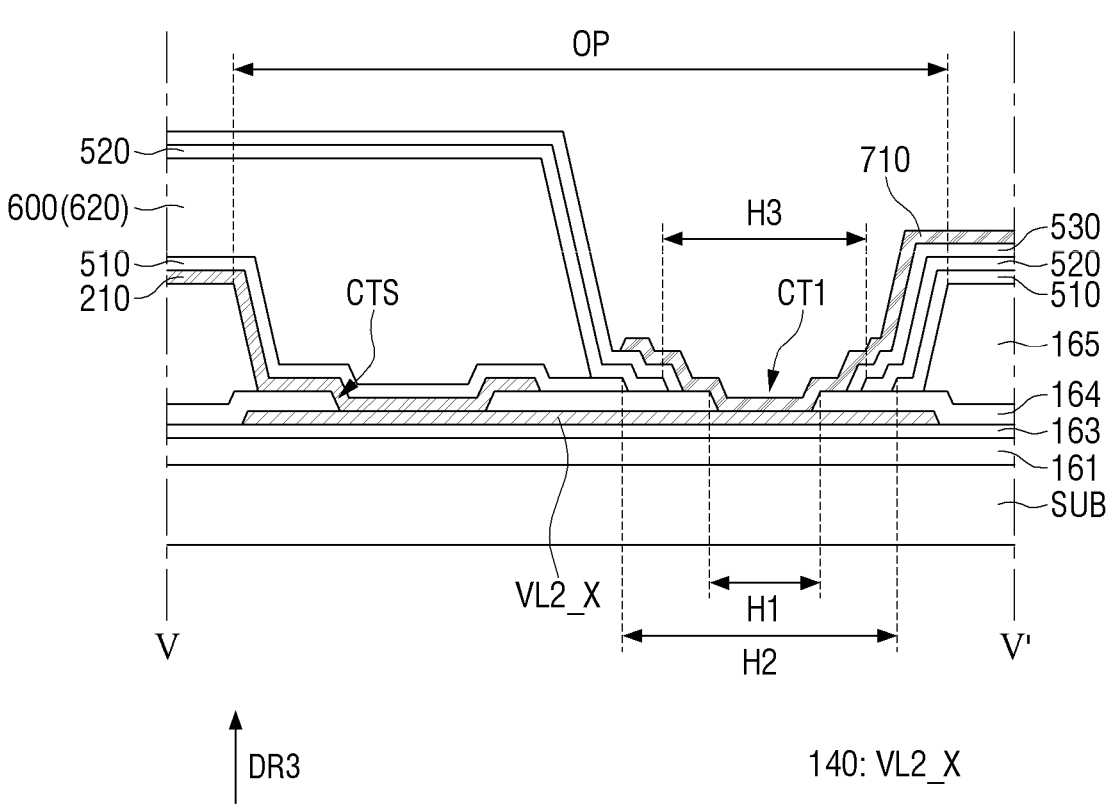
FIG. 31 is a cross-sectional view illustrating an example taken along the line V-V' of FIGS. 28 and 29.

FIG. 30 is a cross-sectional view illustrating an example of the display device according to the embodiment of FIGS. 28 and 29. FIG. 31 is a cross-sectional view illustrating an example taken along the line V-V' of FIGS. 28 and 29.

Referring to FIGS. 30 and 31, a second bank 400_1 may further include a third sub-bank 430. The third sub-bank 430 may be spaced from the first sub-bank 410 with the second sub-bank 420 interposed therebetween.

The first sub-alignment line 211 may be disposed on the first sub-bank 410, the second sub-alignment line 212 may be disposed on the third sub-bank 430, and the second alignment line 220_2 may be disposed on the second sub-bank 420.

The first light emitting element ED1 may be disposed between the second sub-alignment line 212 and the second alignment line 220_2 between the second sub-bank 420 and the third sub-bank 430. The second light emitting element ED2 may be disposed between the first sub-alignment line 211 and the second alignment line 220_2 between the first sub-bank 410 and the second sub-bank 420.

The second insulating layer 520 may be disposed on the light emitting element ED. The second insulating layer 520 may be disposed to expose both ends of the first light emitting element ED1 and both ends of the second light emitting element ED2.

The third contact electrode 730 may be disposed on the second insulating layer 520. The first area 731 of the third contact electrode 730 may be in contact with the end of the first light emitting element ED1 aligned on the second sub-alignment line 212 side, and the second area 732 of the third contact electrode 730 may be in contact with the end of the second light emitting element ED2 aligned on the second alignment line 220_2 side.

The display device 10 may further include a third insulating layer 530 disposed on the third contact electrode 730. The third insulating layer 530 may completely cover the third contact electrode 730. The third insulating layer 530 may expose the end of the first light emitting element ED1 aligned on the second alignment line 220_2 side and the end of the second light emitting element ED2 aligned on the first sub-alignment line 211 side together with the second insulating layer 520 in the emission area EMA. The third insulating layer 530 may include a hole overlapping the first electrode contact hole CT1 in the sub-region SA. The hole included in the third insulating layer 530 may constitute the first electrode contact hole CT1. The third insulating layer 530 may expose a part of the second horizontal voltage line VL2_X.

As described above, the first contact electrode 710 and the second contact electrode 720 may be formed on (or at) the same layer. The first contact electrode 710 and the second contact electrode 720 may be disposed on the third insulating layer 530. The first contact electrode 710 may be in contact with the end of the second light emitting element ED2 aligned on the first sub-alignment line 211 side exposed by the third insulating layer 530 and the second insulating layer 520. The second contact electrode 720 may be in contact with the end of the first light emitting element ED1 aligned on the second alignment line 220_2 side exposed by the third insulating layer 530 and the second insulating layer 520.

The first contact electrode 710 may be disposed on the third insulating layer 530 to be in contact (e.g., direct contact) with the top surface of the second horizontal voltage line VL2_X through the first electrode contact hole CT1 penetrating the passivation layer 164, the first insulating layer 510, the second insulating layer 520, and the third insulating layer 530 and exposing a part of the top surface of the second horizontal voltage line VL2_X in the sub-region SA. The first contact electrode 710 may be electrically connected to the second horizontal voltage line VL2_X through the first electrode contact hole CT1.

Figure 32:
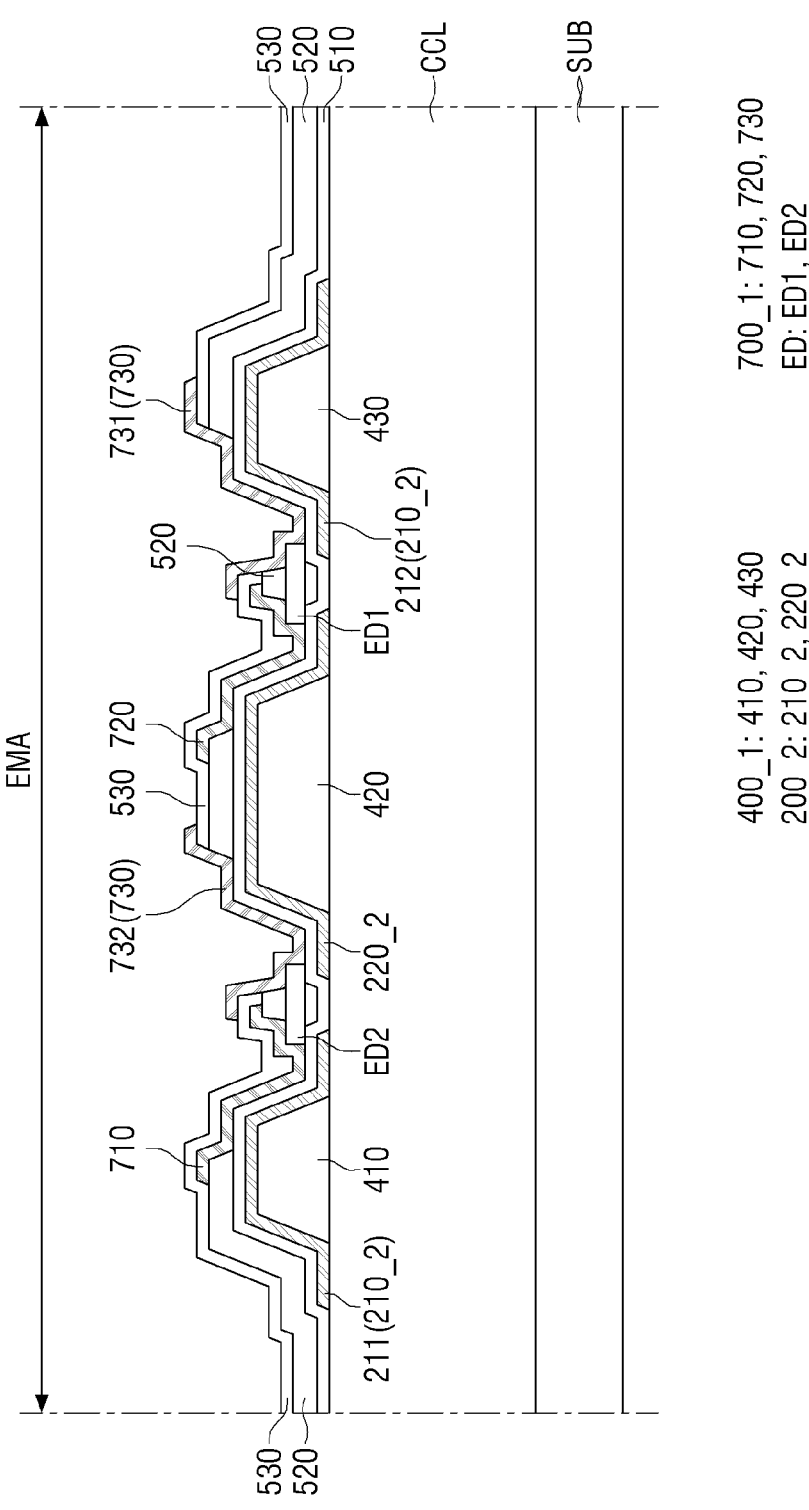
FIG. 32 is a cross-sectional view illustrating an example of the display device according to the embodiment of FIGS. 28 and 29.
Figure 33:
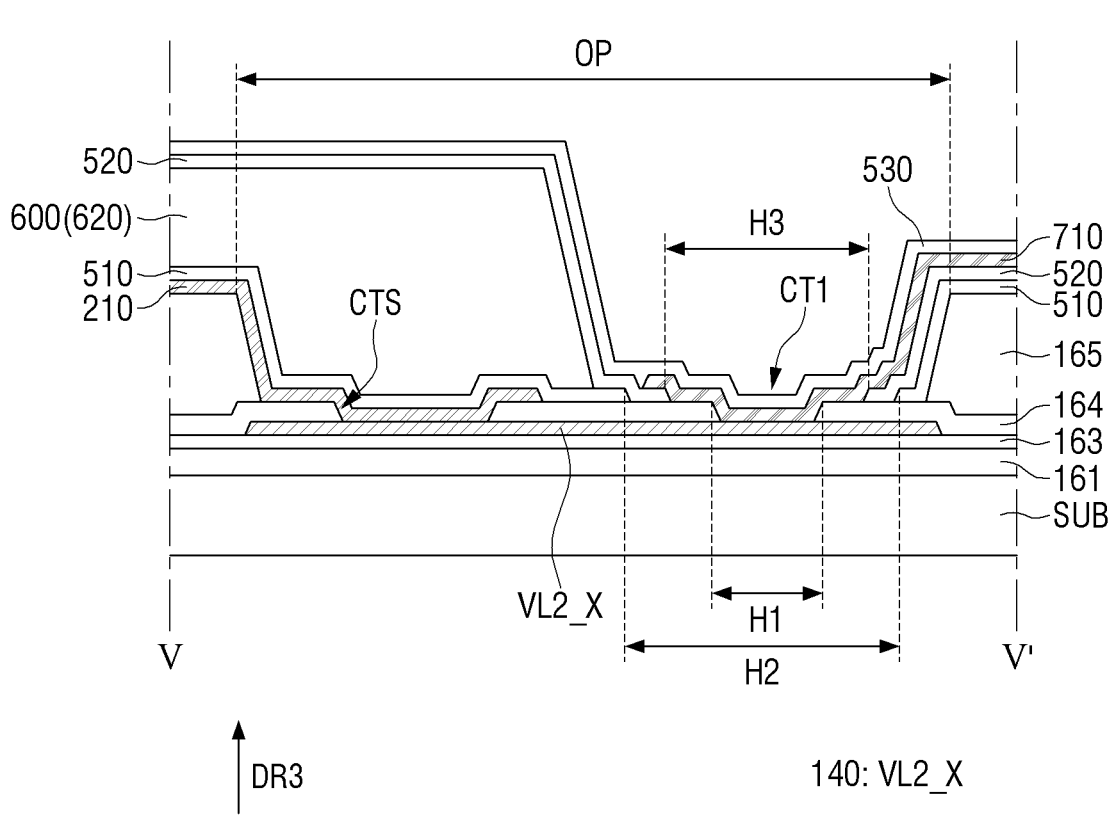
FIG. 33 is a cross-sectional view showing an example taken along the line V-V' of FIGS. 28 and 29.
Figure 34:
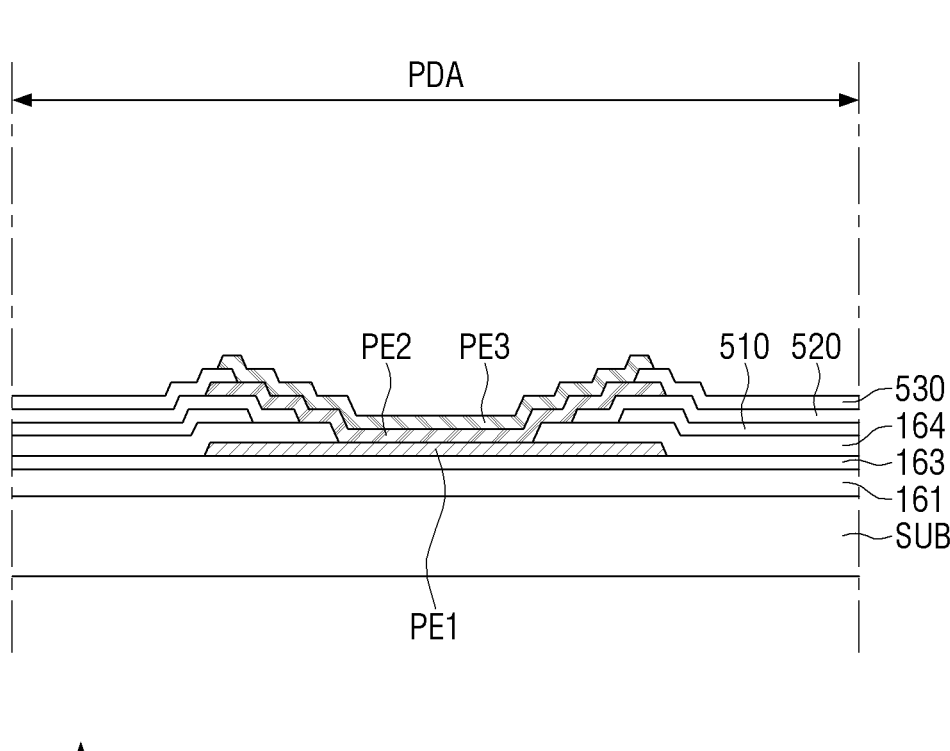
FIG. 34 is a cross-sectional view illustrating an example of the pad area of the display device of FIG. 28.

FIG. 32 is a cross-sectional view illustrating another example of the display device according to the embodiment of FIGS. 28 and 29. FIG. 33 is a cross-sectional view showing another example taken along the line V-V' of FIGS. 28 and 29. FIG. 34 is a cross-sectional view illustrating an example of the pad area of the display device of FIG. 28.

Referring to FIGS. 32 and 33, the embodiment of FIGS. 32 and 33 is different from the embodiment of FIGS. 30 and 31 in that the third insulating layer 530 is disposed on the first and second contact electrodes 710 and 720, and the third contact electrode 730 is disposed on the third insulating layer 530.

Specifically, the first and second contact electrodes 710 and 720 may be disposed on the second insulating layer 520. The first contact electrode 710 may be in contact with the end of the second light emitting element ED2 aligned on the first sub-alignment line 211 side, which is exposed by the second insulating layer 520, and the second contact electrode 720 may be in contact with the end of the first light emitting element ED1 aligned on the second alignment line 220_2 side, which is exposed by the second insulating layer 520.

The first contact electrode 710 may be in contact (e.g., direct contact) with the top surface of the second horizontal voltage line VL2_X through the first electrode contact hole CT1 penetrating the passivation layer 164, the first insulating layer 510, and the second insulating layer 520 and exposing a part of the top surface of the second horizontal voltage line VL2_X in the sub-region SA. The first contact electrode 710 may be electrically connected to the second horizontal voltage line VL2_X through the first electrode contact hole CT1.

The third insulating layer 530 may be disposed on the first and second contact electrodes 710 and 720. The third insulating layer 530 may completely cover the first and second contact electrodes 710 and 720. The third insulating layer 530 may expose the end of the first light emitting element ED1 aligned on the second sub alignment line 212 side and the end of the second light emitting element EL2 aligned on the second alignment line 220_2 side in the emission area EMA. The third insulating layer 530 may completely cover the first contact electrode 710 in the sub-region SA. In the present embodiment, the third insulating layer 530 may completely cover the first contact electrode 710 in the region overlapping the first electrode contact hole CT1 in the sub-region SA.

The third contact electrode 730 may be disposed on the third insulating layer 530. The first area 731 of the third contact electrode 730 may be in contact with the end of the first light emitting element ED1 aligned on the second sub-alignment line 212 side, which is exposed by both the second insulating layer 520 and the third insulating layer 530, and the second area 732 of the third contact electrode 730 may be in contact with the end of the second light emitting element ED2 aligned on the second alignment line 220_2 side, which is exposed by both the second insulating layer 520 and the third insulating layer 530.

Referring to FIGS. 33 and 34, the display device 10 may be disposed in the pad area PDA, and may include a first pad PE1, a first pad electrode PE2, and a second pad electrode PE3 formed of the third conductive layer 140. The first pad PE1 may be any one of the above-described wire pads WPD.

The first pad electrode PE2 may be disposed on the first pad PE1. The first pad electrode PE2 may be formed on (or at) the same layer as the first and second contact electrodes 710. Accordingly, the first pad electrode PE2 may be disposed on the second insulating layer 520. The first pad electrode PE2 may overlap the top surface of the first pad PE1 exposed by the passivation layer 164, the first insulating layer 510, and the second insulating layer 520.

The third insulating layer 530 may expose a part of the first pad electrode PE2. That is, the third insulating layer 530 may completely cover the first and second contact electrodes 710 and 720 in the display area DPA, and may include a hole exposing a part of the first pad electrode PE2 in the pad area PDA.

The second pad electrode PE3 may be disposed on the third insulating layer 530. The second pad electrode PE3 may be formed on (or at) the same layer as the third contact electrode 730. The second pad electrode PE3 may be in contact with and electrically connected to the first pad electrode PE2 through the hole penetrating the third insulating layer 530.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

What is claimed is:

1. A display device comprising:
a substrate;
a conductive layer on the substrate and comprising a first voltage line, a second voltage line, and a contact conductive pattern spaced from each other;
a passivation layer on the conductive layer;
a via layer on the passivation layer;
an alignment line on the via layer and comprising a first alignment line and a second alignment line spaced from each other;
a light emitting element between the first alignment line and the second alignment line on the alignment line; and a first contact electrode and a second contact electrode on the light emitting element and spaced from each other, wherein:
the first alignment line is electrically connected to the second voltage line through a first alignment contact hole;
the second alignment line is electrically connected to the first voltage line through a second alignment contact hole;
the first contact electrode is electrically connected to the second voltage line through a first electrode contact hole;
the second contact electrode is electrically connected to the contact conductive pattern through a second electrode contact hole; and
the first electrode contact hole and the second electrode contact hole do not overlap the alignment line in a plan view.

2. The display device of claim 1, wherein:
the first contact electrode is in contact with the second voltage line exposed by the first electrode contact hole; and
the second contact electrode is in contact with the contact conductive pattern exposed by the second electrode contact hole.

3. The display device of claim 2, wherein:
the first contact electrode is in contact with one end of the light emitting element;
the second contact electrode is in contact with other end of the light emitting element; and
the contact conductive pattern is electrically connected to a transistor.

4. The display device of claim 2, wherein:
the first alignment line is in contact with the second voltage line exposed by the first alignment contact hole; and
the second alignment line is in contact with the first voltage line exposed by the second alignment contact hole.

5. The display device of claim 1, further comprising an insulating layer on the alignment line,
wherein the light emitting element is on the insulating layer, and
wherein the insulating layer completely covers the alignment line.

6. The display device of claim 5, wherein:
the insulating layer is interposed between the first and second contact electrodes and the alignment line; and
the first and second contact electrodes and the alignment line are not in physical contact with each other.

7. The display device of claim 5, wherein the second alignment line and the second contact electrode are electrically insulated from each other.

8. The display device of claim 1, wherein the first contact electrode and the second contact electrode are at a same layer.

9. The display device of claim 8, further comprising a third contact electrode on the light emitting element and spaced from the first contact electrode and the second contact electrode, wherein:
the first alignment line comprises a first sub-alignment line and a second sub-alignment line spaced from each other with the second alignment line interposed therebetween;
the light emitting element comprises a first light emitting element between the first sub-alignment line and the second alignment line and a second light emitting element between the second sub-alignment line and the second alignment line;

the first contact electrode is in contact with one end of the first light emitting element;

the second contact electrode is in contact with one end of the second light emitting element; and the third contact electrode is in contact with other end of the first light emitting element and the other end of the second light emitting element.

10. The display device of claim 9, wherein the third contact electrode is on the first contact electrode and the second contact electrode.

11. The display device of claim 10, further comprising an insulating layer on the first contact electrode and the second contact electrode, wherein the third contact electrode is on the insulating layer, and the insulating layer completely covers the first contact electrode and the second contact electrode.

12. The display device of claim 9, wherein the first contact electrode and the second contact electrode are on the third contact electrode.

13. The display device of claim 12, further comprising an insulating layer on the third contact electrode, wherein:

the first contact electrode and the second contact electrode are on the insulating layer; and the insulating layer includes holes overlapping the first electrode contact hole and the second electrode contact hole, respectively.

14. The display device of claim 1, wherein the via layer includes an opening exposing both the first alignment contact hole and the first electrode contact hole.

15. The display device of claim 1, wherein the via layer does not overlap the first alignment contact hole, the second alignment contact hole, the first electrode contact hole, and the second electrode contact hole in a plan view.

16. The display device of claim 15, further comprising an insulating layer on the alignment line, wherein:

the first contact electrode and the second contact electrode are on the insulating layer;

the first alignment contact hole and the second alignment contact hole are formed by a sidewall of the passivation layer; and the first electrode contact hole and the second electrode contact hole comprise a sidewall of the passivation layer and a sidewall of the insulating layer.

17. A display device comprising a first pixel and a second pixel arranged along a first direction, the display device comprising:

a circuit element layer on a substrate and comprising transistors to drive the first pixel and the second pixel, respectively;

a first alignment line and a second alignment line extending in the first direction on the circuit element layer, across the first pixel and the second pixel, and spaced from each other in a second direction crossing the first direction;

a light emitting element in each of the first pixel and the second pixel and located between the first alignment line and the second alignment line;

a first contact electrode in each of the first pixel and the second pixel, overlapping one end of the light emitting element, and extending in the first direction; and a second contact electrode in each of the first pixel and the second pixel, overlapping other end of the light emitting element, and extending in the first direction, wherein:

the first contact electrode and the second contact electrode are spaced from each other in the second direction;

the first contact electrode is electrically connected to the circuit element layer through a first electrode contact hole;

the second contact electrode is electrically connected to the circuit element layer through a second electrode contact hole; and the first electrode contact hole and the second electrode contact hole do not overlap the first alignment line and the second alignment line in a plan view.

18. The display device of claim 17, wherein:

the circuit element layer comprises a first voltage line and a first contact conductive pattern spaced from each other;

the first contact conductive pattern is electrically connected to a transistor from among the transistors of the first pixel;

the first contact electrode of the first pixel is in contact with the first voltage line exposed by the first electrode contact hole; and the second contact electrode of the first pixel is in contact with the first contact conductive pattern exposed by the second electrode contact hole.

19. The display device of claim 18, wherein:

the circuit element layer further comprises a second voltage line spaced from the first voltage line and the first contact conductive pattern;

the first alignment line is in contact with the first voltage line exposed by a first alignment contact hole; and the second alignment line is in contact with the second voltage line exposed by a second alignment contact hole.

20. The display device of claim 19, wherein:

the first contact electrode of the first pixel and the first contact electrode of the second pixel are integrated to form a single pattern; and the second contact electrode of the first pixel and the second contact electrode of the second pixel are spaced from each other in the first direction.

21. The display device of claim 17, wherein the first alignment line, the second alignment line, the first contact electrode, and the second contact electrode are not in physical contact with each other.

* * * * *